United States Patent
Jeon

(10) Patent No.: US 8,619,492 B2
(45) Date of Patent: Dec. 31, 2013

(54) ON-DIE TERMINATION CIRCUIT, MEMORY DEVICE, MEMORY MODULE, AND METHOD OF OPERATING AND TRAINING AN ON-DIE TERMINATION

(75) Inventor: Young-Jin Jeon, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 410 days.

(21) Appl. No.: 12/917,566

(22) Filed: Nov. 2, 2010

(65) Prior Publication Data

US 2011/0205832 A1    Aug. 25, 2011

(30) Foreign Application Priority Data

Feb. 23, 2010  (KR) .................. 10-2010-0016167

(51) Int. Cl.
*G11C 8/00*    (2006.01)
(52) U.S. Cl.
USPC ............ 365/233.16; 365/198; 365/189.05; 365/233.1; 326/30; 326/28; 326/27; 326/26
(58) Field of Classification Search
USPC ............... 365/233.16, 198, 189.05, 233.1; 326/30, 28, 26, 27
See application file for complete search history.

(56) References Cited

U.S. PATENT DOCUMENTS

| | | | |
|---|---|---|---|
| 7,092,299 B2 * | 8/2006 | Kwak et al. | 365/198 |
| 7,259,585 B2 * | 8/2007 | Brinkman et al. | 326/30 |
| 7,342,412 B2 * | 3/2008 | Kim | 326/30 |
| 7,372,293 B2 | 5/2008 | Cox et al. | |
| 7,486,104 B2 | 2/2009 | Oh et al. | |
| 7,602,208 B2 * | 10/2009 | Jung | 326/30 |
| 7,612,578 B2 * | 11/2009 | Chang et al. | 326/30 |
| 7,646,213 B2 * | 1/2010 | Kao | 326/30 |

FOREIGN PATENT DOCUMENTS

KR    1020030032831    4/2003

* cited by examiner

*Primary Examiner* — Connie Yoha
(74) *Attorney, Agent, or Firm* — F. Chau & Associates, LLC

(57) ABSTRACT

An on-die termination (ODT) circuit of a memory device comprising: a memory device having a memory core having a memory cell array; a data input/output pin connected to the memory core through a data buffer; and an on-die termination (ODT) circuit, comprising: a termination circuit configured to provide a termination impedance at the input/output data pin, the termination circuit having a switching device that selectively connects a termination impedance to the input/output data pin based on the presence of an asynchronous control signal (ACS), wherein the ACS is generated based on the presence of a memory WRITE command. The memory device may further comprise a training circuit comprising: an asynchronous signal delay configured to delay the signal path of the ACS signal to the termination circuit; and a comparing unit configured to compare a phase difference between the ACS signal and a reference signal, the comparing unit comprising a phase detector and a replica delay, wherein the replica delay is configured to delay the signal path of the ACS signal to the phase detector, and the phase detector is configured to output the phase difference as training result.

29 Claims, 33 Drawing Sheets

| OPERATION MODE | TERMINATION IMPEDANCE |
|---|---|
| READ | ∞ |
| WRITE | 120 Ω |
| NORMAL | 60 Ω |

| OPERATION MODE | IMPEDANCE |
|---|---|
| READ | 40 Ω |
| WRITE | 120 Ω |
| NORMAL | 60 Ω |

| OPERATION MODE | READ FROM/WRITE TO | IMPEDANCE | |
|---|---|---|---|
| | | RANK1 | RANK2 |
| READ | RANK1 | 40 Ω | 60 Ω |
| | RANK2 | 60 Ω | 40 Ω |
| WRITE | RANK1 | 120 Ω | 120 Ω |
| | RANK2 | 120 Ω | 120 Ω |
| NORMAL | NONE | 60 Ω | 60 Ω |

| OPERATION MODE | READ FROM/WRITE TO | IMPEDANCE | |
|---|---|---|---|
| | | RANK1 | RANK2 |
| READ | RANK1 | 40 Ω | 60 Ω |
| | RANK2 | 60 Ω | 40 Ω |
| WRITE | RANK1 | 120 Ω | 60 Ω |
| | RANK2 | 60 Ω | 120 Ω |
| NORMAL | NONE | 60 Ω | 60 Ω |

| CONFIGURATION | OPERATION MODE | READ FROM/ WRITE TO | IMPEDANCE | | | |
|---|---|---|---|---|---|---|
| | | | MODULE1 | | MODULE2 | |
| | | | RANK1 | RANK2 | RANK3 | RANK4 |
| 2R/2R | READ | RANK1 | 40 Ω | 60 Ω | 60 Ω | 60 Ω |
| | | RANK2 | 60 Ω | 40 Ω | 60 Ω | 60 Ω |
| | | RANK3 | 60 Ω | 60 Ω | 40 Ω | 60 Ω |
| | | RANK4 | 60 Ω | 60 Ω | 60 Ω | 40 Ω |
| | WRITE | RANK1 | 120 Ω | 120 Ω | 60 Ω | 60 Ω |
| | | RANK2 | 120 Ω | 120 Ω | 60 Ω | 60 Ω |
| | | RANK3 | 60 Ω | 60 Ω | 120 Ω | 120 Ω |
| | | RANK4 | 60 Ω | 60 Ω | 120 Ω | 120 Ω |
| | NORMAL | NONE | 60 Ω | 60 Ω | 60 Ω | 60 Ω |

FIG. 38B

| CONFIGURATION | OPERATION MODE | READ FROM/ WRITE TO | IMPEDANCE | | | |
|---|---|---|---|---|---|---|
| | | | MODULE1 | | MODULE2 | |
| | | | RANK1 | RANK2 | RANK3 | RANK4 |
| 2R/1R | READ | RANK1 | 40 Ω | 60 Ω | 60 Ω | EMPTY |
| | | RANK2 | 60 Ω | 40 Ω | 60 Ω | |
| | | RANK3 | 60 Ω | 60 Ω | 40 Ω | |
| | WRITE | RANK1 | 120 Ω | 120 Ω | 60 Ω | |
| | | RANK2 | 120 Ω | 120 Ω | 60 Ω | |
| | | RANK3 | 60 Ω | 60 Ω | 120 Ω | |
| | NORMAL | NONE | 60 Ω | 60 Ω | 60 Ω | |

FIG. 39A

| CONFIGURATION | OPERATION MODE | READ FROM/ WRITE TO | IMPEDANCE | | | |
|---|---|---|---|---|---|---|
| | | | MODULE1 | | MODULE2 | |
| | | | RANK1 | RANK2 | RANK3 | RANK4 |
| 2R/2R | READ | RANK1 | 40 Ω | 60 Ω | 60 Ω | 60 Ω |
| | | RANK2 | 60 Ω | 40 Ω | 60 Ω | 60 Ω |
| | | RANK3 | 60 Ω | 60 Ω | 40 Ω | 60 Ω |
| | | RANK4 | 60 Ω | 60 Ω | 60 Ω | 40 Ω |
| | WRITE | RANK1 | 120 Ω | 60 Ω | 60 Ω | 60 Ω |
| | | RANK2 | 60 Ω | 120 Ω | 60 Ω | 60 Ω |
| | | RANK3 | 60 Ω | 60 Ω | 120 Ω | 60 Ω |
| | | RANK4 | 60 Ω | 60 Ω | 60 Ω | 120 Ω |
| | NORMAL | NONE | 60 Ω | 60 Ω | 60 Ω | 60 Ω |

| CONFIGURATION | OPERATION MODE | READ FROM/ WRITE TO | IMPEDANCE | | | |
|---|---|---|---|---|---|---|
| | | | MODULE1 | | MODULE2 | |
| | | | RANK1 | RANK2 | RANK3 | RANK4 |
| 2R/1R | READ | RANK1 | 40Ω | 60Ω | 60Ω | EMPTY |
| | | RANK2 | 60Ω | 40Ω | 60Ω | |
| | | RANK3 | 60Ω | 60Ω | 40Ω | |
| | WRITE | RANK1 | 120Ω | 60Ω | 60Ω | |
| | | RANK2 | 60Ω | 120Ω | 60Ω | |
| | | RANK3 | 60Ω | 60Ω | 120Ω | |
| | NORMAL | NONE | 60Ω | 60Ω | 60Ω | |

ON-DIE TERMINATION CIRCUIT, MEMORY DEVICE, MEMORY MODULE, AND METHOD OF OPERATING AND TRAINING AN ON-DIE TERMINATION

CROSS-REFERENCE TO RELATED APPLICATION(S)

This application claims priority under 35 USC §119 to Korean Patent Application No. 2010-0016167, filed on Feb. 23, 2010, in the Korean Intellectual Property Office (KIPO), the contents of which are incorporated herein in its entirety by reference.

BACKGROUND

1. Technical Field

Exemplary embodiments relate to on-die termination, and more particularly to an on-die termination circuit, a data output buffer, a memory device, a memory module, a method of operating the on-die termination circuit, a method of operating the data output buffer, and a method of training on-die termination.

2. Discussion of the Related Art

On-die termination (ODT) is a signal termination circuitry or component used for impedance matching signal lines located inside a semiconductor chip. When signals are transferred between devices via interfacing signal lines, signal reflection can be suppressed if the lines are impedance matched. An ODT can be used, for example, to terminate signals that interface between a memory controller and a memory device. A basic termination device is a termination resistor (RTT) that is matched to an impedance of a transmission line.

A conventional use of an ODT may involve a memory device that receives an ODT signal for enabling an ODT circuit through an ODT pin, and synchronizes the ODT signal with an external clock signal. The memory device turns on the ODT circuit in response to the synchronized ODT signal at a predetermined time, such as a fixed number of clock cycles, after receiving the ODT signal. In such use of the ODT, even when a data strobe signal is not generated, a clock synchronization circuit needs to be turned on to synchronize the ODT signal with the external clock signal. Other usage of ODTs may require a latency circuit for turning on the ODT circuit after a predetermined latency from when the ODT signal is received.

SUMMARY

According to some exemplary embodiments, the input/output data node receives data read out or written into a memory device, wherein a different termination impedance value is provided on the input/output data node based on predetermined logic levels of DOEN and ACS for memory READ, WRITE, or normal modes, wherein: the presence of a logic level H at DOEN signals a memory READ mode and the first termination circuit and the second termination circuit are not activated; the presence of a logic level L at DOEN and a logic level H at ACS signals a memory WRITE mode and the first termination circuit is activated; and the presence of a logic level L at DOEN and a logic level L at ACS signals a NORMAL operation and both the first termination circuit and the second termination circuit are activated. According to exemplary embodiments, a termination impedance of about 120 ohms is provided at the input/output data node for a memory WRITE operation, a termination impedance of about 60 ohms is provided for NORMAL operation, and no termination impedance is provided at the input/output data node during memory READ. The ACS signal is received at an external pin of the memory device and the input/output data node is connected to another external pin of the memory device, wherein the ACS signal is asynchronous with respect to a clock signal of the memory device. According to some exemplary embodiments, the ACS signal is generated based on a memory WRITE command. According to some exemplary embodiments, a pulse generator is configured to generate the ACS signal with a pulse width larger than the write data window.

According to some exemplary embodiments, a command decoder is configured to receive memory READ and WRITE commands from an external memory controller. The DOEN signal is used to enable an output buffer of the memory device. The first termination circuit comprises a switching device that responds to the first control signal and at least one resistor. The control circuit comprises one of logic gates or at least one multiplexer.

The ODT circuit according to some exemplary embodiments further including a third termination circuit and a third control signal generated by the control circuit to selectively activate the third termination circuit to selectively provide a third impedance on the input/output data node, wherein a termination impedance of about 120 ohms for a memory WRITE, and about 60 ohms for normal mode are provided at the input/output data node and a driver impedance of about 40 ohms is presented for a memory READ.

According to some exemplary embodiments, an on-die termination (ODT) and training circuit comprising: a termination circuit configured to provide a termination impedance at an input/output data node, the termination circuit having a switching device that selectively connects a termination impedance to an input/output data node based on the presence of an asynchronous control signal (ACS); and a training circuit comprising: an asynchronous signal delay configured to delay the signal path of the ACS signal to the termination circuit; and a comparing unit configured to compare a phase difference between the ACS signal and a reference signal, the comparing unit comprising a phase detector and a replica delay, wherein the replica delay is configured to delay the signal path of the ACS signal to the phase detector, and the phase detector is configured to output the phase difference as training result.

According to some exemplary embodiments, the ACS signal and the reference signal are received via external pins from a memory controller. The training result is output via an external pin to a memory controller for storage in a register in the memory controller, wherein the memory controller is configured to use the training result to adjust the phase of the ACS signal or the reference signal. The memory controller is configured to issue the ACS signal upon issuance of a WRITE command.

According to some exemplary embodiments, a variable delay is disposed in the signal path of the ACS signal, the variable delay is configured to vary a delay of the ACS signal based on the training result output from the phase detector. The ACS signal and the reference signal are received via external pins from a memory controller. A command decoder is configured to receive commands from an external memory controller, and a pulse generator configured to generate the ACS signal upon receipt of a memory write signal from the command decoder.

According to some exemplary embodiments, a memory device comprising: a memory core having a memory cell array; a data input/output pin connected to the memory core through a data buffer; and an on-die termination (ODT) circuit, comprising: a termination circuit configured to provide a termination impedance at the input/output data pin, the termination circuit having a switching device that selectively connects a termination impedance to the input/output data pin based on the presence of an asynchronous control signal (ACS), wherein the ACS is generated based on the presence of a memory WRITE command, and further comprising a training circuit.

According to some exemplary embodiments, a method of providing termination impedance at an input/output data line of a memory device is provided, comprising: performing a logic operation on an output enable (DOEN) signal and an asynchronous control signal (ACS) to output a first control signal and a second control signal to selectively activate a first termination circuit having a first termination impedance and a second termination circuit having a second termination impedance, respectively, to selectively provide the first termination impedance, the second termination impedance, or both the first termination impedance and the second termination impedance at the input/output data line, wherein the ACS is asynchronous with respect to a clock signal of the memory device and is generated based on the presence of a memory WRITE command, and the DOEN signal is generated based on the presence of a memory READ command, wherein a different impedance value is provided on the input/output data line based on predetermined logic levels of DOEN and ACS for memory READ, WRITE, or NORMAL modes. According to some exemplary embodiments, the DOEN signal is generated using an internal clock signal generated from an external clock signal, and the internal clock signal is turned off during memory WRITE and NORMAL modes. The first termination circuit is activated to provide about 120 ohms at the input/output data line for a memory WRITE operation, both the first termination circuit and the second termination circuit are activated to provide a termination impedance of about 60 ohms for NORMAL operation, and no termination circuit is activated to provide a termination impedance at the input/output data line for memory READ.

According to some exemplary embodiments, the ACS is generated by a memory controller and received at an external pin of the memory device and the input/output data line is connected to another external pin of the memory device. Decoding at the memory device is based on commands issued from an external memory controller and generating the ACS based on a decode of a WRITE command. According to some exemplary embodiments, generating the ACS includes generating a pulse width larger than the write data window.

According to some exemplary embodiments, a method further including generating a third control signal to selectively activate a third termination circuit to selectively provide a third impedance on the input/output data line, wherein a termination impedance of about 120 ohms for a memory WRITE, and about 60 ohms for a NORMAL operation is provided at the input/output data line and a driver impedance of about 40 ohms is presented for a memory READ.

According to some exemplary embodiments, an on-die termination and training method, comprising: generating an asynchronous control signal (ACS) based on a memory WRITE command; comparing a phase difference between the ACS and a reference signal; varying a delay unit that delays the ACS based on the comparison result; and activating a termination circuit with the ACS to connect a termination impedance to an input/output data line of a memory device, wherein the ACS and the reference signal are issued from a memory controller, wherein the comparison result is output via an external pin to a memory controller for storage in a register in the memory controller.

According to some exemplary embodiments, a method further includes varying a delay to the propagation of the ACS signal using a variable delay at the memory device that responds to the comparison result. According to some exemplary embodiments, further including decoding at the memory device commands issued from an external memory controller, and generating the ACS upon decode of a memory WRITE command.

According to some exemplary embodiments, a memory module is provided, comprising: a first memory rank including a plurality of first memory devices accessible via a first chip select signal; and a second memory rank including a plurality of second memory devices accessible via a second chip select signal, wherein each of the first memory devices and the second memory devices comprises: a memory core configured to store data, and to generate read data based on the stored data; a data output buffer configured to transfer the read data to a memory controller through a transmission line coupled to a first external pin; and an on-chip termination (ODT) circuit configured to selectively provide different termination impedances to the transmission line based on a logical combination of the first chip select signal, the second chip select signal, and an asynchronous control signal (ACS) that is asynchronous with respect to a clock signal.

According to some exemplary embodiments, the first memory rank and the second memory rank receive the ACS from a memory controller through the same line.

According to some exemplary embodiments, the ACS is generated based on the presence of a memory WRITE command at the memory module.

According to some exemplary embodiments, the memory module is one of UDIMM, RDIMM, FBDIMM or LRDIMM.

According to some exemplary embodiments, the memory module is an RDIMM and the command/address (CA) line is terminated at both ends.

According to some exemplary embodiments, the memory module is an RDIMM and the command/address (CA) line is fly-by and terminated at one end.

According to some exemplary embodiments, a termination impedance provided at the transmission line is about 120 ohms for the data to be written in the selected memory device, and about 60 ohms for normal operation mode and a driver impedance of about 40 ohms is presented for memory data read from the memory device.

According to some exemplary embodiments, a computing system is provided, comprising: a processor connected to a system controller via a processor bus configured to control a system by use of at least one clock signal, the system comprising: a memory system including at least one memory module and a memory controller for controlling the at least one memory module having at least one memory device, which comprises: a memory core having a memory cell array; a data input/output pin connected to the memory core through a data buffer; and an on-die termination (ODT) circuit, comprising: a termination circuit configured to provide a termination impedance at the input/output data pin, the termination circuit having a switching device that selectively connects a termination impedance to the input/output data pin based on the presence of an asynchronous control signal (ACS), wherein the ACS is generated asynchronously with respect to the clock signal.

According to some exemplary embodiments, the computing system is embodied within a desktop or a handheld computing device.

BRIEF DESCRIPTION OF THE DRAWINGS

Illustrative, non-limiting exemplary embodiments will be more clearly understood from the following detailed description taken in conjunction with the accompanying drawings.

FIG. 37 is a block diagram illustrating a memory system according to some exemplary embodiments.

FIGS. 38A through 39B are tables of impedances of memory ranks included in a memory system of FIG. 37 according to operation modes.

FIG. 40 is a block diagram illustrating a computing system according to some exemplary embodiments.

DETAILED DESCRIPTION OF THE EMBODIMENTS

Figure 1:
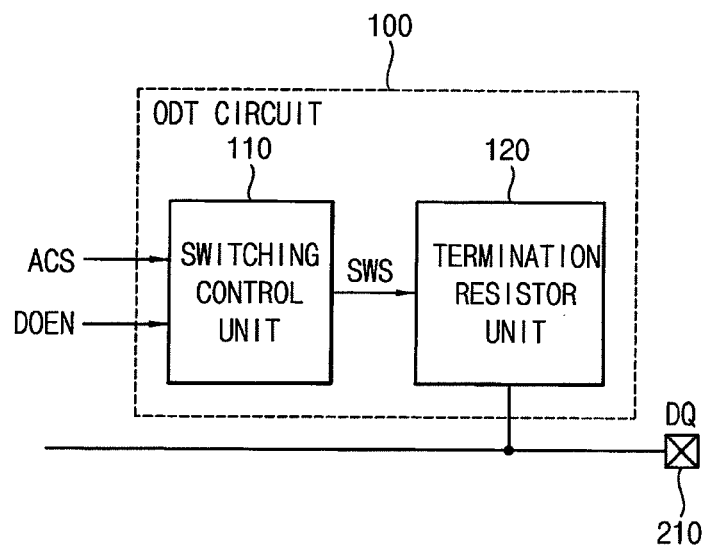
FIG. 1 is a block diagram illustrating an on-die termination (ODT) circuit according to some exemplary embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an on-die termination (ODT) circuit according to some exemplary embodiments.

Referring to FIG. 1, an ODT circuit 100 includes a switching control unit 110 and a termination resistor unit 120.

The termination resistor unit 120 is coupled to an external pin 210, and provides termination impedance to a transmission line coupled to the external pin 210. For example, the external pin 210 may be a data input/output (DQ) pin, a data strobe (DQS) pin, a data mask (DM) pin, a termination data strobe (TDQS) pin, or the like. The term "pin" broadly refers to an electrical interconnection for an integrated circuit (e.g., a pad or other electrical contact on the integrated circuit).

The termination resistor unit 120 may perform a pull-up termination operation using a termination resistor coupled between a power supply voltage and the external pin 210. When the termination resistor unit 120 performs the pull-up termination operation, a voltage of the transmission line may be maintained substantially at the power supply voltage. A conventional ODT circuit performs a center termination operation, and thus a DC current is consumed through a current path formed in the conventional ODT circuit. However, since a current flows through the termination resistor unit 120 and the transmission line only when data of a low level are transferred, the termination resistor unit 120 performing the pull-up termination operation may reduce power consumption.

While not illustrated, the termination resistor unit 120 may perform a pull-down termination operation using a termination resistor coupled between a ground voltage and the external pin 210. When the termination resistor unit 120 performs the pull-down termination operation, a voltage of the transmission line may be maintained substantially at the ground voltage. Accordingly, since a current flows through the termination resistor unit 120 and the transmission line only when data of a high level are transferred, the termination resistor unit 120 performing the pull-down termination operation may reduce power consumption compared to a conventional ODT circuit performing the center termination operation.

The switching control unit 110 is coupled to the termination resistor unit 120. The switching control unit 110 adjusts the termination impedance in response to an asynchronous control signal ACS that is not synchronized with an external clock signal. The external clock signal is a clock signal provided through a clock pin from a device external to a memory device including the ODT circuit 100. For example, the external clock signal may be provided from a memory controller or an external clock generator to the memory device. The asynchronous control signal ACS may be active during a write mode. That is, the asynchronous control signal ACS may be active while data are input through the transmission line. The switching control unit 110 may control the termination resistor unit 120 to increase the termination impedance in response to the active asynchronous control signal ACS. In some embodiments, the asynchronous control signal ACS may be input from the memory controller through a control pin. For example, the control pin may be an ODT pin. In other embodiments, the memory device including the ODT circuit 100 may generate the asynchronous control signal ACS in response to a write command received from the memory controller.

Since the switching control unit 110 adjusts the termination impedance in response to the asynchronous control signal ACS, the ODT circuit 100 may be implemented without a control circuit, such as an ODT latency circuit, for controlling the termination resistor unit 120 synchronously with the external clock signal. Further, the memory device including the ODT circuit 100 may turn off a clock synchronization circuit while the termination resistor unit 120 performs a termination operation, thereby reducing power consumption.

The switching control unit 110 may generate a switching signal SWS for controlling the termination resistor unit 120 based on the asynchronous control signal ACS and an output enable signal DOEN. The switching control unit 110 may perform a logic operation on the output enable signal DOEN and the asynchronous control signal ACS to output the switching signal SWS. The output enable signal DOEN may be active during a read mode. That is, the output enable signal DOEN may be active while data are output through the transmission line. While the output enable signal DOEN is active, the switching control unit 110 may provide the switching signal SWS having a predetermined logic level for controlling the termination resistor unit 120, for example, to not provide the termination impedance. The termination resistor unit 120 may be electrically decoupled from the external pin 210 in response to the switching signal SWS having the predetermined logic level.

While the output enable signal DOEN is inactive, the switching control unit 110 may generate the switching signal SWS for controlling the termination resistor unit 120 to provide the termination impedance. The switching control unit 110 may change a logic level of the switching signal SWS in response to the asynchronous control signal ACS to adjust the termination impedance. For example, the asynchronous control signal ACS may be active during the write mode, and the switching control unit 110 may output the switching signal SWS of the changed logic level during the write mode in response to the active asynchronous control signal ACS. The termination resistor unit 120 may provide normal termination impedance until the logic level of the switching signal SWS is changed, and may provide write termination impedance in response to the switching signal SWS having the changed logic level. For example, the normal termination impedance may be about 60Ω, and the write termination impedance may be about 120Ω.

As described above, since the ODT circuit 100 is asynchronously controlled, the ODT circuit 100 may be implemented without an ODT latency circuit for controlling the termination resistor unit 120 synchronously with the external clock signal. In addition, the memory device including the ODT circuit 100 may turn off a clock synchronization circuit while the termination resistor unit 120 performs the termination operation. Further, since the memory device including the ODT circuit 100 does not receive an ODT enable signal for enabling the termination resistor unit from the memory controller, the number of external pins may be reduced.

Figure 2A:
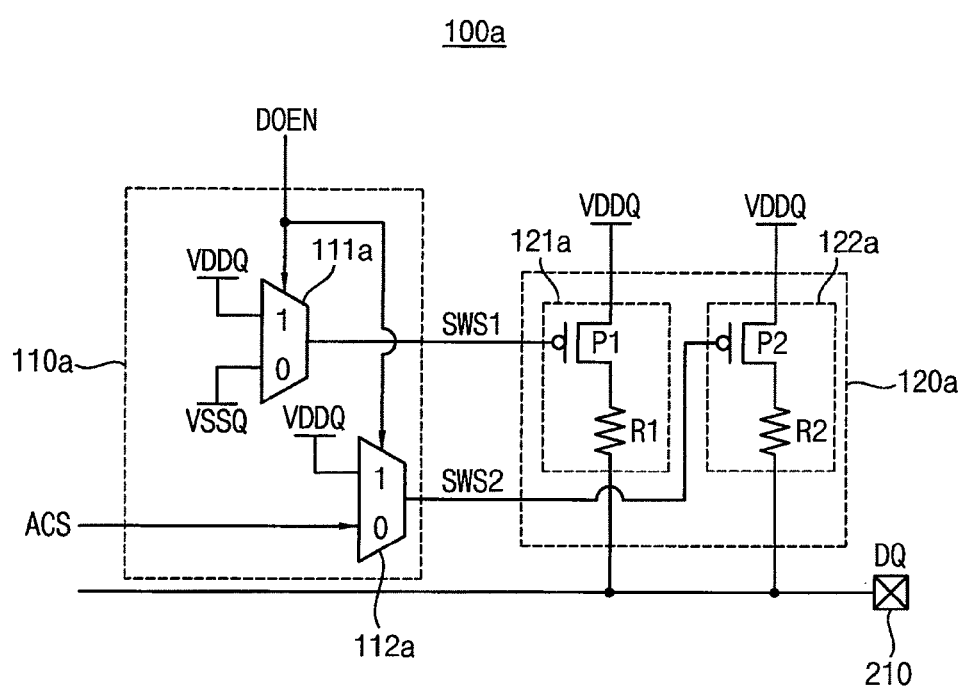
FIGS. 2A and 2B are circuit diagrams illustrating examples of an ODT circuit of FIG. 1.

FIG. 2A is a circuit diagram illustrating an example of an ODT circuit of FIG. 1.

Referring to FIG. 2A, an ODT circuit 100a includes a switching control unit 110a and a termination resistor unit 120a. The switching control unit 110a may include a first selector 111a and a second selector 112a. The first selector 111a and the second selector 112a may be implemented as multiplexers. The termination resistor unit 120a may be coupled to an external pin 210, and may include a first termination circuit 121a and a second termination circuit 122a. The first termination circuit 121a may include a first transistor P1 and a first resistor R1, and the second termination circuit 122a may include a second transistor P2 and a second resistor R2.

The first selector 111a may have a first input terminal coupled to a power supply voltage VDDQ, a second input terminal coupled to a ground voltage VSSQ, a selection terminal for receiving an output enable signal DOEN, and an output terminal for outputting a first switching signal SWS1. The first selector 111a may selectively output the power supply voltage VDDQ or the ground voltage VSSQ as the first switching signal SWS1 in response to the output enable signal DOEN.

The first termination circuit 121a may be selectively activated in response to the first switching signal SWS1 to selectively provide a first termination impedance at an input/output node coupled to the external pin 210. For example, the first termination circuit 121a may be activated while the first switching signal SWS1 has a logic level L, and may not be activated to while the first switching signal SWS1 has a logic level H.

The first transistor P1 may have a source coupled to the power supply voltage VDDQ, a gate coupled to the output terminal of the first selector 111a, and a drain coupled to the first resistor R1. The first resistor R1 may be coupled between the first transistor P1 and the external pin 210. The first transistor P1 may be turned on or off in response to the first switching signal SWS1. The first resistor R1 may be electrically coupled or decoupled to or from the external pin 210 according to the on/off state of the first transistor P1.

The second selector 112a may have a first input terminal coupled to a power supply voltage VDDQ, a second input terminal for receiving an asynchronous control signal ACS, a selection terminal for receiving the output enable signal DOEN, and an output terminal for outputting a second switching signal SWS2. The second selector 112a may selectively output the power supply voltage VDDQ or the asynchronous control signal ACS as the second switching signal SWS2 in response to the output enable signal DOEN.

The second termination circuit 122a may be selectively activated in response to the second switching signal SWS2 to selectively provide a second termination impedance at the input/output node. For example, the second termination circuit 122a may be activated while the second switching signal SWS2 has a logic level L, and may not be activated while the second switching signal SWS2 has a logic level H.

The second transistor P2 may have a source coupled to the power supply voltage VDDQ, a gate coupled to the output terminal of the second selector 112a, and a drain coupled to the second resistor R2. The second resistor R2 may be coupled between the second transistor P2 and the external pin 210. The second transistor P2 may be turned on or off in response to the second switching signal SWS2. The second resistor R2 may be electrically coupled or decoupled to or from the external pin 210 according to the on/off state of the second transistor P2.

While the output enable signal DOEN is active during a read mode (i.e., while data are output through a transmission line coupled to the external pin 210), the first selector 111a may output the power supply voltage VDDQ as the first switching signal SWS1, and the second selector 112a may output the power supply voltage VDDQ as the second switching signal SWS2. The first transistor P1 may be turned off in response to the first switching signal SWS1 of a high level, and the second transistor P2 may be turned off in response to the second switching signal SWS2 of the high level. The first resistor R1 and the second resistor R2 may be electrically decoupled from the external pin 210 by the turned-off first transistor P1 and the turned-off second transistor P2. Accordingly, during read mode, R1 and R2 may be decoupled and the ODT circuit 100a does not perform a termination operation.

While the output enable signal DOEN is inactive, the first selector 111a may output the ground voltage VSSQ as the first switching signal SWS1. The first transistor P1 may be turned on in response to the first switching signal SWS1 of a low level. The first resistor R1 may be electrically coupled to the external pin 210 by the turned-on first transistor P1. The first switching signal SWS1 may have a low level unless the output enable signal DOEN is activated. Accordingly, even though a memory device including the ODT circuit 100a is implemented without an ODT enable pin for receiving an ODT enable signal for enabling the termination resistor unit 120a, termination impedance may be provided to the transmission line using the first resistor R1 during a normal mode and a write mode without receiving the ODT enable signal DOEN.

While the output enable signal DOEN is inactive, the second selector 112a may output the asynchronous control signal ACS as the second switching signal SWS2. The second transistor P2 may be turned on or off in response to the asynchronous control signal ACS. The second resistor R2 may be electrically coupled or decoupled to or from the external pin 210 according to the on/off state of the second transistor P2.

During the normal mode, the asynchronous control signal ACS may be inactive, for example, at a low level. The normal mode indicates a mode during which neither a write operation nor a read operation is performed. For example, the normal mode may include an idle mode, a precharge mode, a power-down mode, a refresh mode, a bank active mode, a standby mode, or the like. During the normal mode, the second selector 112a may output the asynchronous control signal ACS of the low level as the second switching signal SWS2. The second transistor P2 may be turned on in response to the asynchronous control signal ACS of the low level. The second resistor R2 may be electrically coupled to the external pin 210 by the turned-on second transistor P2. Accordingly, during the normal mode, the termination resistor unit 120a may provide the transmission line with normal termination impedance using the first resistor R1 and the second resistor R2 that are connected in parallel.

During the write mode, the asynchronous control signal ACS may be active, for example, at a high level. During the write mode, the second selector 112a may output the asynchronous control signal ACS of the high level as the second switching signal SWS2. The second transistor P2 may be turned off in response to the asynchronous control signal ACS of the high level. The second resistor R2 may be electrically decoupled from the external pin 210 by the turned-off second transistor P2. Accordingly, during the write mode, the termination resistor unit 120a may provide the transmission line with write termination impedance using only the first resistor R1. The write termination impedance of the first resistor R1 may be higher than the normal termination impedance of the parallel-connected first and second resistors R1 and R2. For example, each of the first resistor R1 and the second resistor R2 may have an impedance of about 120Ω. In this case, the normal termination impedance may be about 60Ω), and the write termination impedance may be about 120Ω.

Figures 2B, 3:
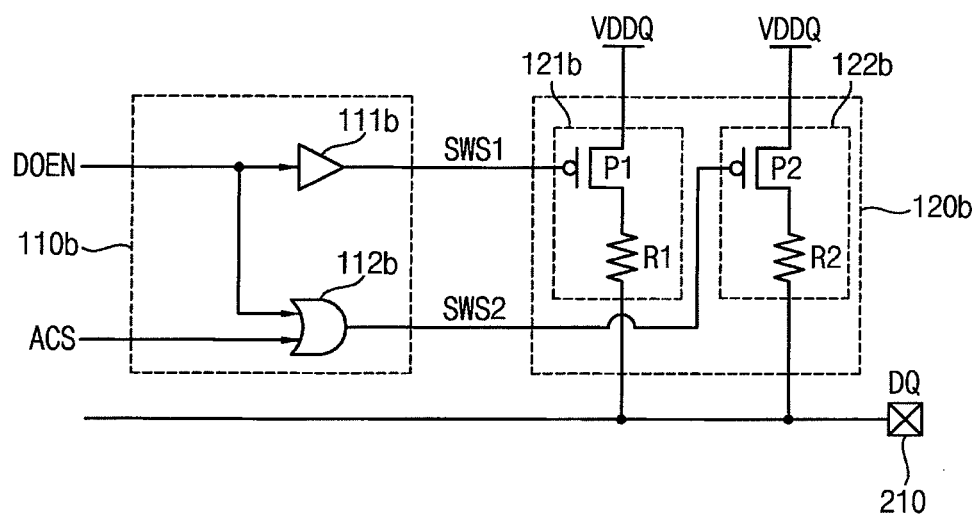
FIG. 3 is a table of impedances of an ODT circuit of FIG. 1 according to operation modes.

FIG. 2B is a circuit diagram illustrating another example of an ODT circuit of FIG. 1.

Referring to FIG. 2B, an ODT circuit 100b includes a switching control unit 110b and a termination resistor unit 120b. The switching control unit 110b may include a buffer 111b and an OR gate 112b. The termination resistor unit 120b may be coupled to an external pin 210, and may include a first termination circuit 121b and a second termination circuit 122b. The first termination circuit 121b may include a first transistor P1 and a first resistor R1, and the second termination circuit 122b may include a second transistor P2 and a second resistor R2.

The buffer 111b may receive an output enable signal DOEN, and may output the received output enable signal DOEN as a first switching signal SWS1. The OR gate 112b may have a first input terminal for receiving the output enable signal DOEN, a second input terminal for receiving an asynchronous control signal ACS, and an output terminal for outputting a second switching signal SWS2. The OR gate 112b may generate the second switching signal SWS2 by performing an OR operation on the output enable signal DOEN and the asynchronous control signal ACS.

The first termination circuit 121b may be selectively activated in response to the first switching signal SWS1 to selectively provide a first termination impedance at an input/output node coupled to the external pin 210. For example, the first termination circuit 121b may be activated while the first switching signal SWS1 has a logic level L, and may not be activated to while the first switching signal SWS1 has a logic level H. The second termination circuit 122b may be selectively activated in response to the second switching signal SWS2 to selectively provide a second termination impedance at the input/output node. For example, the second termination circuit 122b may be activated while the second switching signal SWS2 has a logic level L, and may not be activated while the second switching signal SWS2 has a logic level H.

If the output enable signal DOEN is activated to a high level during a read mode, the buffer 111b may output the first switching signal SWS1 of the high level, and the OR gate 112b may output the second switching signal SWS2 of the high level. The first transistor P1 and the second transistor P2 are turned off in response to the first switching signal SWS1 and the second switching signal SWS2. The first resistor R1 and the second resistor R2 are electrically decoupled from the external pin 210 by the turned-off first transistor P1 and the turned-off second transistor P2. Accordingly, the ODT circuit 100b may not perform a termination operation during the read mode.

If the output enable signal DOEN is inactivated to a low level, the buffer 111b may output the first switching signal SWS1 of the low level. The first transistor P1 may be turned on in response to the first switching signal SWS1 of the low level. The first resistor R1 may be electrically coupled to the external pin 210 by the turned-on first transistor P1. Accordingly, the first resistor R1 may be provided as a termination resistor to a transmission line coupled to the external pin 210 during a normal mode and a write mode.

While the output enable signal DOEN is inactive, the OR gate 112b may output the asynchronous control signal ACS as the second switching signal SWS2. If the asynchronous control signal ACS is inactivated to a low level during a normal mode, the OR gate 112b may output the asynchronous control signal ACS of the low level as the second switching signal SWS2. The second transistor P2 may be turned on in response to the second switching signal SWS2 of the low level. The second resistor R2 may be electrically coupled to the external pin 210 by the turned-on second transistor P2. Accordingly, during the normal mode, the termination resistor unit 120b may provide the transmission line with normal termination impedance using the first resistor R1 and the second resistor R2 that are connected in parallel. If the asynchronous control signal ACS is activated to a high level during a write mode, the OR gate 112b may output the asynchronous control signal ACS of the high level as the second switching signal SWS2. The second transistor P2 may be turned off in response to the second switching signal SWS2 of the high level. The second resistor R2 may be electrically decoupled from the external pin 210 by the turned-off second transistor P2. Accordingly, during the write mode, the termination resistor unit 120b may provide the transmission line with write termination impedance using the first resistor R1.

Although each of the first resistor R1 and the second resistor R2 is illustrated in FIGS. 2A and 2B as a single resistor, in some embodiments, each of the first resistor R1 and the second resistor R2 may be implemented with a plurality of resistors that are connected in parallel or in series and a plurality of transistors for controlling connections of the plurality of resistors. In some embodiments, impedance of each resistor may be adjusted by ZQ calibration.

FIG. 3 is a table of impedances of an ODT circuit of FIG. 1 according to operation modes.

Referring to FIGS. 1 through 3, an ODT circuit 100, 100a and 100b may be electrically decoupled from an external pin 210 not to provide termination impedance during a read mode. The ODT circuit 100, 100a and 100b may provide write termination impedance of about 120Ω during a write mode. For example, a first resistor R1 having an impedance of about 120Ω may be used to provide the write termination impedance during the write mode. The ODT circuit 100, 100a and 100b may provide normal termination impedance of about 60Ω during a normal mode. For example, parallel-connected first and second resistors R1 and R2, of which each has an impedance of about 120Ω, may be used to provide the normal termination impedance during the normal mode.

Although an example where the write termination impedance of about 120Ω is provided during the write mode and the normal termination impedance of about 60Ω is provided during the normal mode is illustrated in FIG. 3, the write termination impedance and the normal termination impedance may have various different values. In some embodiments, the write termination impedance and the normal termination impedance may be selected by mode register setting.

Figure 4:
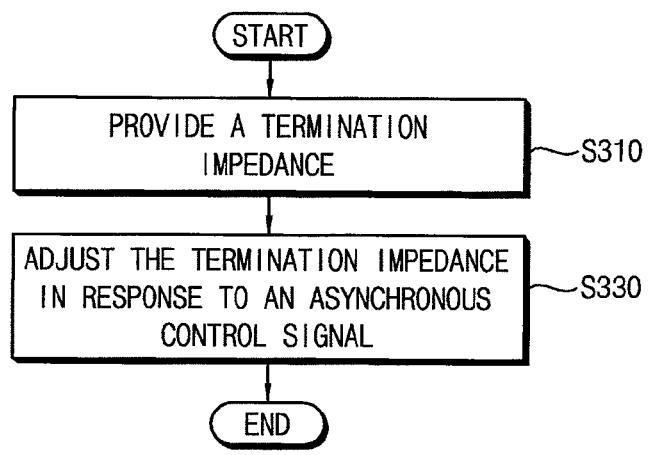
FIG. 4 is a flow chart illustrating a method of operating an ODT circuit of FIG. 1 according to some exemplary embodiments.

FIG. 4 is a flow chart illustrating a method of operating an ODT circuit of FIG. 1 according to some exemplary embodiments.

Referring to FIGS. 1 and 4, an ODT circuit 100 provides termination impedance to a transmission line coupled to an external pin 210 without receiving an ODT enable signal (Step S310). For example, after power is supplied to a memory device including the ODT circuit 100 or after an initialization process is performed in the memory device, the ODT circuit 100 may be turned on to provide normal termination impedance without receiving the ODT enable signal. Accordingly, a memory controller need not transmit the ODT enable signal to the memory device, and the memory device may not be required to include an ODT enable pin for receiving the ODT enable signal.

The ODT circuit 100 adjusts the termination impedance in response to an asynchronous control signal ACS that is not synchronized with an external clock signal. For example, the ODT circuit 100 may provide the transmission line with the normal termination impedance after the power-up of the memory device, and may provide write termination impedance higher than the normal termination impedance while the asynchronous control signal ACS is active at a high level. Since the ODT circuit 100 adjusts the termination impedance in response to the asynchronous control signal ACS, the ODT circuit 100 may be implemented without an ODT latency circuit for synchronizing a control signal with the external clock signal. Further, in this embodiment, without a need for a synchronized control signal, the memory device may turn off a clock synchronization circuit (e.g., a delay locked loop circuit or a phase locked loop circuit), thereby reducing power consumption.

Figure 5:
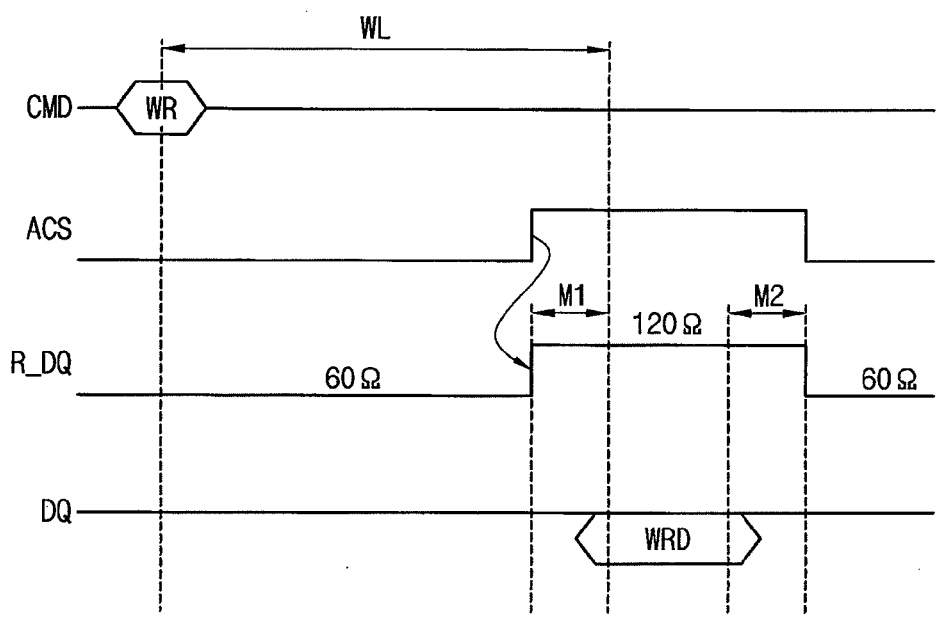
FIG. 5 is a timing diagram for describing operations of an ODT circuit of FIG. 1.

FIG. 5 is a timing diagram for describing operations of an ODT circuit of FIG. 1.

In an example illustrated in FIG. 5, an ODT circuit operates in a normal mode, and then operates in a write mode. In FIG. 5, CMD represents a command signal transferred from a memory controller to a memory device, ACS represents an asynchronous control signal, R_DQ represents termination impedance provided to a data transmission line, and DQ represents data transferred through the data transmission line.

Referring to FIGS. 1 and 5, a memory controller transfers a write command WR to a memory device, and then transfers write data WRD to the memory device through a data transmission line after write latency WL. The ODT circuit 100 included in the memory device may provide the data transmission line with the termination impedance R_DQ of about 60Ω while the asynchronous control signal ACS is inactive at a low level, and may provide the data transmission line with the termination impedance R_DQ of about 120Ω while the asynchronous control signal ACS is active, such as in a write mode, at a high level.

The asynchronous control signal ACS may be active during a predetermined period of time so that the termination impedance R_DQ of about 120Ω may be provided from a first margin time M1 before the write data WRD are received to a second margin time M2 after the write data WRD are received. For example, the first margin time M1 may correspond to two clock cycles, and the second margin time M2 may correspond to one clock cycle. In some cases, since the asynchronous control signal ACS is not synchronized with the external clock signal, a point in time when the synchronous control signal ACS is activated may be varied according to process, voltage and temperature (PVT). In some embodiments, ODT training may be performed to adjust the point in time of the activation of the asynchronous control signal ACS. Accordingly, even though the asynchronous control signal ACS is not synchronized with the external clock signal, the ODT circuit 100 may adjust the termination impedance R_DQ from about 60Ω to about 120Ω at a predetermined point of time. For example, the predetermined point of time may be the first margin time M1 before the write data WRD are received, or the first margin time M1 prior to the write latency WL after the write command WR is received. The ODT training will be described below with reference to FIGS. 7 through 14 and 17 through 20.

Figure 6:
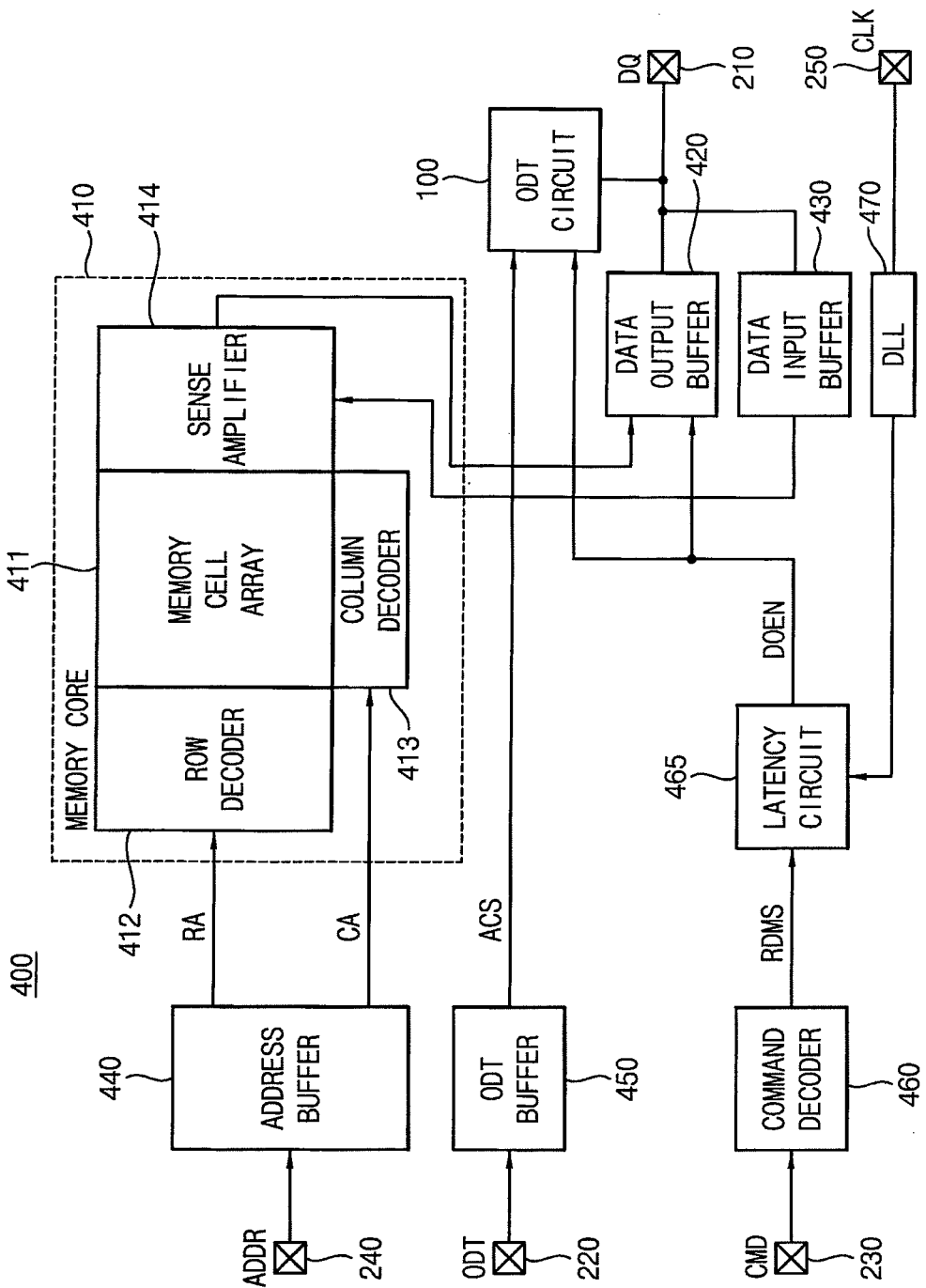
FIG. 6 is a block diagram illustrating a memory device including an ODT circuit of FIG. 1 according to some exemplary embodiments.

FIG. 6 is a block diagram illustrating a memory device including an ODT circuit of FIG. 1 according to some exemplary embodiments.

Referring to FIG. 6, a memory device 400 includes a memory core 410, a data output buffer 420, a data input buffer 430, an address buffer 440, an ODT buffer 450, a command decoder 460, a latency circuit 465, a clock synchronization circuit 470 and an ODT circuit 100.

The memory core 410 stores write data provided from the data input buffer 430, and provides read data to the data output buffer 420 based on the stored write data. The memory core 410 may include a memory cell array 411 having a plurality of memory cells that store data, a row decoder 412 for selecting a word line of the memory cell array 411 by decoding a row address RA received from the address buffer 440, a column decoder 413 for selecting at least one bit line of the memory cell array 411 by decoding a column address CA received from the address buffer 440, and a sense amplifier 414 for generating the read data by sensing the data stored in selected memory cells.

The address buffer 440 provides the row address RA and the column address CA to the row decoder 412 and the column decoder 413 based on an address signal ADDR received from a memory controller through an address pin 240. The command decoder 460 may decode a command signal CMD, such as a write enable signal, a row address strobe signal, a column address strobe signal, a chip select signal, etc., received from the memory controller through a command pin 230 to generate a control signal corresponding to the command signal CMD. The memory device 400 may further include a mode register (not shown) for mode register setting. The clock synchronization circuit 470 may receive an external clock signal CLK through a clock pin 250, and may provide the latency circuit 465 and the data output buffer 420 with an internal clock signal synchronized with the external clock signal CLK. The clock synchronization circuit 470 may include a delay locked loop (DLL) circuit, a phase locked loop (PLL) circuit, or the like.

The data output buffer 420 and the data input buffer 430 are coupled to an external data input/output pin 210. The data output buffer 420 may transfer the read data to the memory controller through the data input/output pin 210, and the data input buffer 430 may receive the write data from the memory controller through the data input/output pin 210. Although one data input/output pin 210, one data output buffer 420, and one data input buffer 430 are illustrated in FIG. 6 for convenience of illustration, the memory device 400 may include a plurality of data input/output pins, a plurality of data input buffers, and a plurality of data output buffers. Further, the memory device 400 may include a plurality of address pins and a plurality of command pins.

The ODT circuit 100 is coupled to the data input/output pin 210. Although one ODT circuit 100 is illustrated in FIG. 6 for convenience of illustration, the memory device 400 may include a plurality of ODT circuits respectively coupled to a plurality of data input/output pins. In some embodiments, a single ODT circuit may be shared by a plurality of data input/output pins. The memory device 400 may further include (not shown) a data strobe pin, a data mask pin, a termination data strobe pin, or the like, and may further include one or more ODT circuits respectively or commonly coupled thereto.

The ODT circuit 100 may adjust termination impedance in response to an asynchronous control signal ACS received from the ODT buffer 450. The ODT buffer 450 may receive the asynchronous control signal ACS from the memory controller through an ODT pin 220, and may provide the asynchronous control signal ACS to the ODT circuit 100 by buffering the asynchronous control signal ACS. A conventional memory device receives an ODT enable signal for enabling a termination resistor unit through an ODT pin or an ODT enable pin. However, the ODT circuit 100 may provide the termination impedance without receiving the ODT enable signal after the power-up or initialization of the memory device 400. The memory device 400 according to some exemplary embodiments may receive the asynchronous control signal ACS instead of the ODT enable signal through the ODT pin 220.

A conventional memory device operate a clock synchronization circuit to synchronize the ODT enable signal or a dynamic ODT signal with the external clock signal CLK while the conventional memory device performs a termination operation. However, to control the ODT circuit 100, the memory device 400 uses the asynchronous control signal ACS not synchronized with the external clock signal CLK. Since the ODT circuit 100 is asynchronously controlled, the memory device 400 need not turn on the clock synchronization circuit 470 to operate or control the ODT circuit 100. Accordingly, the memory device 400 may turn off the clock synchronization circuit 470 during a normal mode and a write mode. Further, the memory device 400 may be implemented without an ODT latency circuit to control the ODT circuit 100 synchronously with the external clock signal CLK.

The ODT circuit 100 may be electrically decoupled from the data input/output pin 210 in response to an output enable signal DOEN received from the latency circuit 465. When the command decoder 460 receives a read command from the memory controller through the command pin 230, the command decoder 460 may generate a read mode signal RDMS. The latency circuit 465 may receive the read mode signal RDMS from the command decoder 460, and may receive the internal clock signal synchronized with the external clock signal CLK from the clock synchronization circuit 470. The latency circuit 465 may generate the output enable signal DOEN of a high level while the read data are output through the data input/output pin 210.

The ODT circuit 100 may provide normal termination impedance to a data transmission line coupled to the data input/output pin 210 during the normal mode when neither the write data nor the read data are transferred through the data transmission line. The normal mode may include an idle mode, a precharge mode, a power-down mode, a refresh mode, a bank active mode, a standby mode, or the like. The ODT circuit 100 may be electrically decoupled from the data input/output pin 210 in response to the output enable signal DOEN during a read mode when the read data are output through the data transmission line. The ODT circuit 100 may provide write termination impedance higher than the normal termination impedance in response to the asynchronous control signal ACS during a write mode when the write data are input through the data transmission line.

As described above, since the ODT circuit 100 is asynchronously controlled, the memory device 400 may reduce power consumption by turning off the clock synchronization circuit 470 during the normal mode and the write mode.

Figure 7:
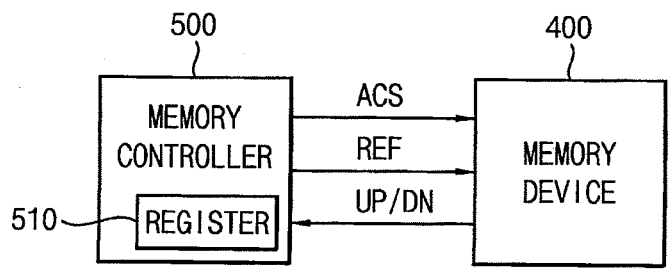
FIG. 7 is a block diagram illustrating a memory system that performs ODT training according to some exemplary embodiments.
Figure 8:
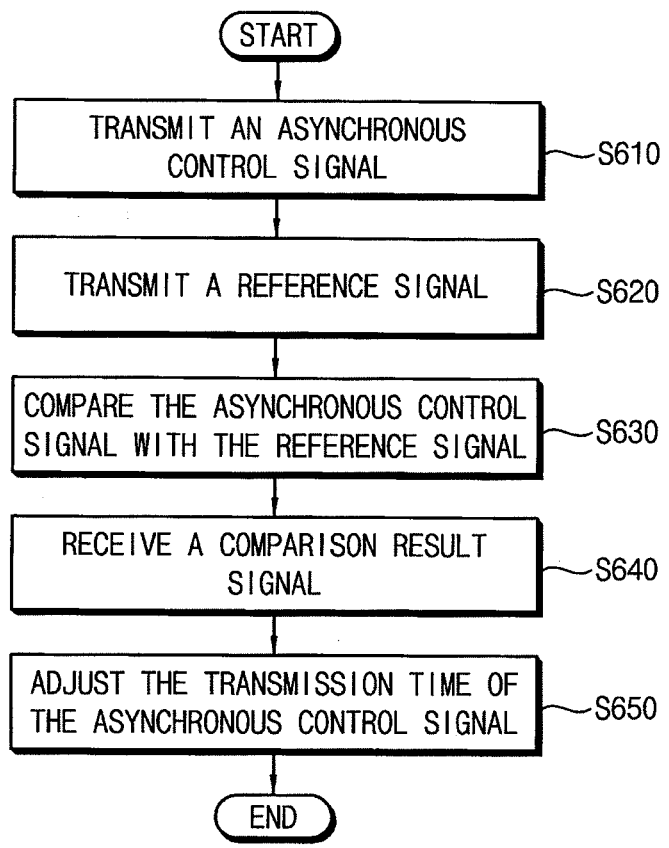
FIG. 8 is a flow chart illustrating a method of training ODT according to some exemplary embodiments.

FIG. 7 is a block diagram illustrating a memory system that performs ODT training according to some exemplary embodiments, and FIG. 8 is a flow chart illustrating a method of training ODT according to some exemplary embodiments.

Referring to FIGS. 7 and 8, a memory controller 500 transmits an asynchronous control signal ACS to a memory device 400 (Step S610). The memory device 400 may receive the asynchronous control signal ACS through an ODT pin 220 illustrated in FIG. 6. The received asynchronous control signal ACS may be delayed by an ODT buffer 450 illustrated in FIG. 6, an internal signal line and/or a repeater for maintaining a signal level. The delayed asynchronous control signal ACS may be provided to the ODT circuit 100 illustrated in FIG. 6 without synchronization. And thus, the ODT circuit 100 may start to provide write termination impedance after a delay time from when the memory controller 500 transmits the asynchronous control signal ACS. Since the asynchronous control signal ACS is not synchronized with an external clock signal in the memory device 400, such a delay time may be varied according to process, voltage and temperature (PVT).

The memory controller 500 transmits a reference signal REF at a point of time when the write termination impedance is desired to be provided (Step S620). The memory controller 500 may transmit the reference signal REF having a rising edge at the desired point of time, and the memory device 400 may receive the reference signal REF through an external input pin, such as a data strobe pin, a data mask pin, or the like.

The memory device 400 compares the asynchronous control signal ACS with the reference signal REF (Step S630). The memory device 400 may generate a comparison result signal UP/DN by comparing a point of time when the asynchronous control signal ACS is applied to the ODT circuit 100 with a point of time when the reference signal REF is received.

The memory controller 500 receives the comparison result signal UP/DN from the memory device 400 (Step S640). The memory controller 500 adjusts a transmission point of time of the asynchronous control signal ACS based on the comparison result signal UP/DN (Step S650). For example, if the comparison result signal UP/DN indicates that the point of time when the asynchronous control signal ACS is applied to the ODT circuit 100 leads the point of time when the reference signal REF is received, the memory controller 500 may increase a time interval from when the memory controller 500 transmits a write command to the memory device 400 to when the memory controller 500 transmits the asynchronous control signal ACS to the memory device 400. The memory controller 500 may include a register 510 that stores the comparison result signal UP/DN or the time interval determined by the method of training the ODT.

In some embodiments, such a method of training the ODT may be repeatedly performed to accurately adjust the transmission point of time of the asynchronous control signal ACS or the time interval between the write command and the asynchronous control signal ACS.

As described above, even though a time interval from when the memory controller 500 transmits the asynchronous control signal ACS to when the asynchronous control signal ACS is applied to the ODT circuit 100 is changed according to the PVT variation, the memory device 400 may provide the write termination impedance at the desired point of time since the memory controller 500 adjusts the transmission point of time of the asynchronous control signal ACS by the method of training the ODT according to some exemplary embodiments.

Figure 9:
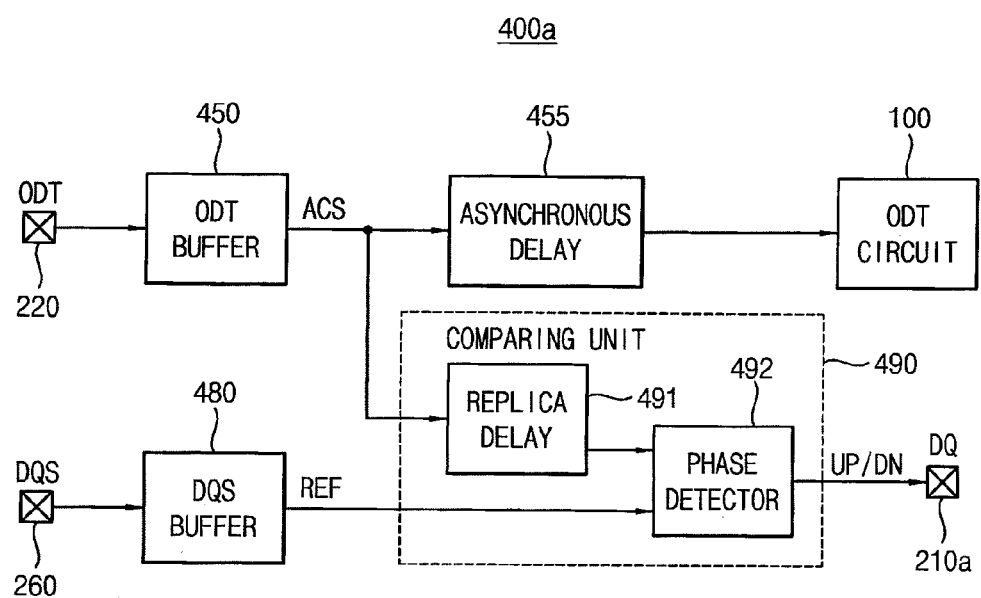
FIG. 9 is a block diagram illustrating a portion of a memory device of FIG. 6 that performs a method of training ODT of FIG. 8.
Figure 10:
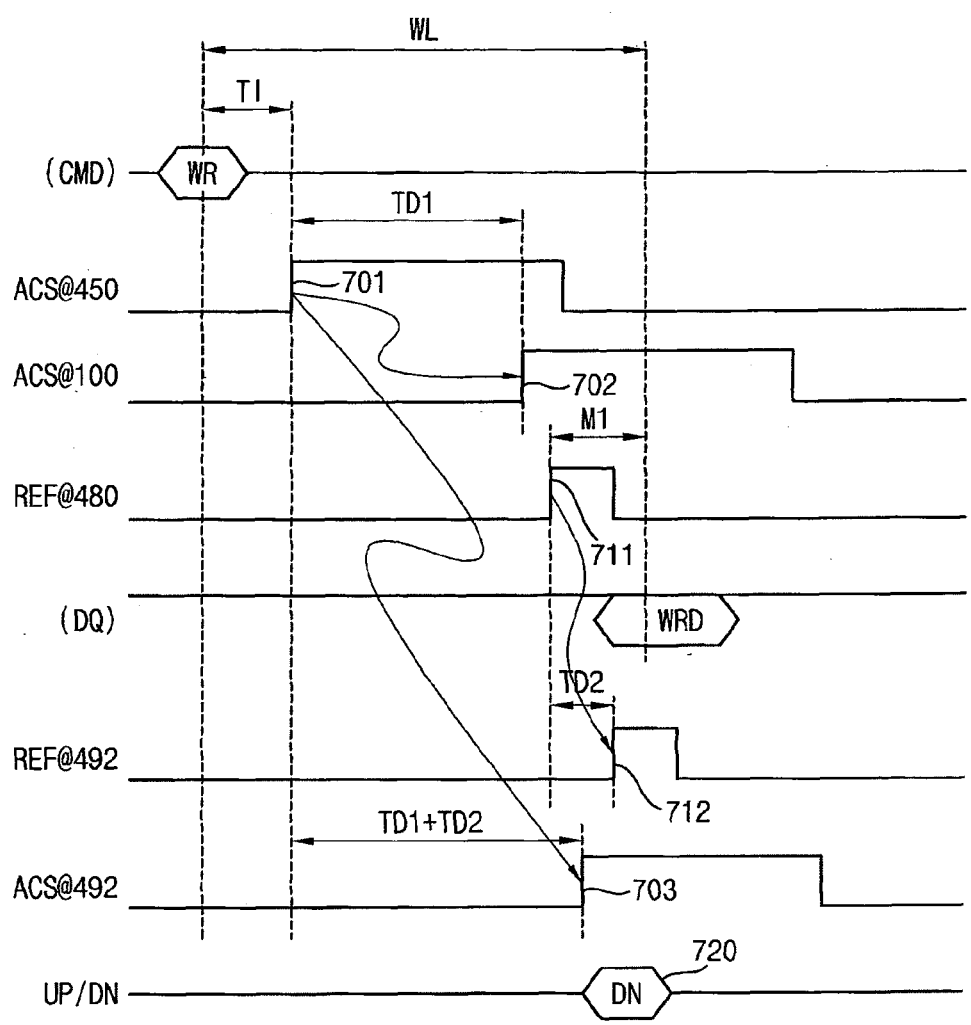
FIG. 10 is a timing diagram for describing a method of training ODT of FIG. 8.

FIG. 9 is a block diagram illustrating a portion of a memory device of FIG. 6 that performs a method of training ODT of FIG. 8, and FIG. 10 is a timing diagram for describing a method of training ODT of FIG. 8.

Referring to FIGS. 9 and 10, a memory device 400a includes an ODT buffer 450, an asynchronous delay unit 455, a DQS buffer 480, a comparing unit 490 and an ODT circuit 100. A circuit that performs training ODT ("training circuit") according to the present embodiment comprises the asynchronous delay unit 455 and the comparing unit 490. In FIG.

10, CMD represents a command signal transmitted from a memory controller to the memory device 400a, ACS@450 represents an asynchronous control signal ACS applied to the ODT buffer 450, ACS@100 represents the asynchronous control signal ACS applied to the ODT circuit 100, REF@480 represents a reference signal REF applied to the DQS buffer 480, DQ represents data transferred through a data transmission line coupled to an external pin 210a, REF@492 represents the reference signal REF applied to a phase detector 492, ACS@492 represents the asynchronous control signal ACS applied to the phase detector 492, and UP/DN represents a comparison or training result signal.

The ODT buffer 450 receives the asynchronous control signal ACS from the memory controller through an ODT pin 220. The ODT buffer 450 may provide the asynchronous control signal ACS to the asynchronous delay unit 455 and the comparing unit 490 by buffering the asynchronous control signal ACS.

The signal path of the asynchronous control signal ACS may be delayed by the asynchronous delay 455 by a first delay time TD1 from when the asynchronous control signal ACS is applied to the ODT buffer 450, and then applied to the ODT circuit 100. For example, a rising edge 702 of the asynchronous control signal ACS applied to the ODT circuit 100 may be delayed by the first delay time TD1 with respect to a rising edge 701 of the asynchronous control signal ACS applied to the ODT buffer 450. The first delay time TD1 may correspond to the sum of an operation time of the ODT buffer 450 and a transmission time of the asynchronous control signal ACS from an output of the ODT buffer 450 to an input of the ODT circuit 100. Here, the operation time of the ODT buffer 450 represents a period of time from when a signal is input to the ODT buffer 450 to when the signal is output from the ODT buffer 450. The transmission time of the asynchronous control signal ACS may correspond to a delay time caused by the asynchronous delay unit 455. The asynchronous delay unit 455 may include a repeater coupled between the ODT buffer 450 and the ODT circuit 100. The repeater may maintain a voltage level of the asynchronous control signal ACS output from the ODT buffer 450 to the ODT circuit 100. The delay time caused by the asynchronous delay unit 455 may largely depend on a delay time caused by the repeater.

The DQS buffer 480 receives the reference signal REF from the memory controller through a DQS pin 260. The memory controller may transmit the reference signal REF to the memory device 400a during an ODT training period. Although an example where the memory device 400a receives the reference signal REF through the DQS pin 260 is illustrated in FIG. 9, the memory device 400a may receive the reference signal REF through any external input pin, such as a data input/output pin, a data mask pin, an address pin, a clock pin, etc.

The DQS buffer 480 may provide the reference signal REF to the comparing unit 490 by buffering the reference signal REF. The reference signal REF may be delayed by a second delay time TD2 from when the reference signal REF is applied to the DQS buffer 480, and then applied to the phase detector 492 included in the comparing unit 490. That is, a rising edge 712 of the reference signal REF applied to the phase detector 492 may be delayed by the second delay time TD2 with respect to a rising edge 711 of the reference signal REF applied to the DQS buffer 480. The second delay time TD2 may correspond to an operation time of the DQS buffer 480. Here, the operation time of the DQS buffer 480 represents a period of time from when a signal is input to the DQS buffer 480 to when the signal is output from the DQS buffer 480.

The memory controller may transmit the reference signal REF at a point of time when write termination impedance is desired to be provided by the ODT circuit 100. The desired point of time may correspond to a first margin time M1 before write data WRD are output from the memory device 400a. For example, the first margin time M1 may correspond to 2 clock cycles. Although a write command WR and the write data WRD are illustrated in FIG. 10 for convenience of illustration, the write command WR and the write data WRD may not be transferred during the ODT training period.

The comparing unit 490 may include a replica delay unit 491 and the phase detector 492. The replica delay unit 491 receives the asynchronous control signal ACS from the ODT buffer 450. The replica delay unit 491 may delay the asynchronous control signal ACS by the sum of the operation time of the DQS buffer 480 (i.e., the second delay time TD2) and the transmission time of the asynchronous control signal ACS from the output of the ODT buffer 450 to the input of the ODT circuit 100 (i.e., the delay time caused by the asynchronous delay unit 455). Accordingly, the replica delay unit 491 may provide the phase detector 492 with the asynchronous control signal ACS delayed by the second delay time TD2 with respect to the asynchronous control signal ACS applied to the ODT circuit 100.

The phase detector 492 may receive the asynchronous control signal ACS delayed by the sum of the first delay time TD1 and the second delay time TD2 with respect to the asynchronous control signal ACS applied to the ODT buffer 450, and may receive the reference signal REF delayed by the second delay time TD2 with respect to the reference signal REF applied to the DQS buffer 480. The phase detector 492 may generate a comparison result signal UP/DN by comparing the received asynchronous control signal ACS with the received reference signal REF. For example, if a rising edge 703 of the received asynchronous control signal ACS leads a rising edge 702 of the received reference signal REF, the phase detector 492 may generate the comparison result signal UP/DN indicating that transmitting the asynchronous control signal ACS is to be delayed.

Since both the asynchronous control signal ACS and the reference signal REF are delayed by the second delay time TD2 before being compared by the phase detector 492, the phase detector 492 may compare the asynchronous control signal ACS delayed by the first delay time TD1 from when the asynchronous control signal ACS is applied to the ODT buffer 450 with the reference signal REF applied to the DQS buffer 480. A point of time delayed by the first delay time TD1 from when the asynchronous control signal ACS is applied to the ODT buffer 450 may correspond to a point of time when the asynchronous control signal ACS is applied to the ODT circuit 100. A point of time when the reference signal REF is applied to the DQS buffer 480 may correspond to the desired point of time when the write termination impedance is desired to be provided. Thus, the comparison result signal UP/DN may indicate whether the point of time when the asynchronous control signal ACS is applied to the ODT circuit 100 leads or lags the desired point of time.

The comparison or training result signal UP/DN may be transmitted to the memory controller through the data input/output pin 210a. Although an example where the comparison result signal UP/DN is transmitted through the data input/output pin 210a is illustrated in FIG. 9, the comparison result signal UP/DN may be transmitted through any external output pin included in the memory device 400a, such as a data strobe pin. The data input/output pin 210a and an external pin coupled to the ODT circuit 100 may be the same or different pin.

The memory controller may adjust a transmission point of time of the asynchronous control signal ACS based on the comparison result signal UP/DN. For example, if the comparison result signal UP/DN indicates that a phase of the asynchronous control signal ACS leads a phase of the reference signal REF, the memory controller may adjust the transmission point of time of the asynchronous control signal ACS to increase a time interval TI from a transmission point of time of the write command WR to the transmission point of time of the asynchronous control signal ACS. As such, since the memory controller adjusts the transmission point of time of the asynchronous control signal ACS, the memory device 400a may provide the write termination impedance at the first margin time M1 before write latency WL elapses from when the write command WR is received (i.e., at the first margin time M1 before the write data WRD are received). Accordingly, the memory device 400a may provide the write termination impedance at the desired point of time regardless of the PVT variation.

Figure 11:
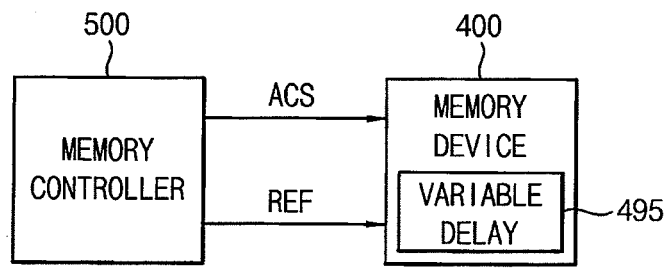
FIG. 11 is a block diagram illustrating a memory system that performs ODT training according to other exemplary embodiments.
Figure 12:
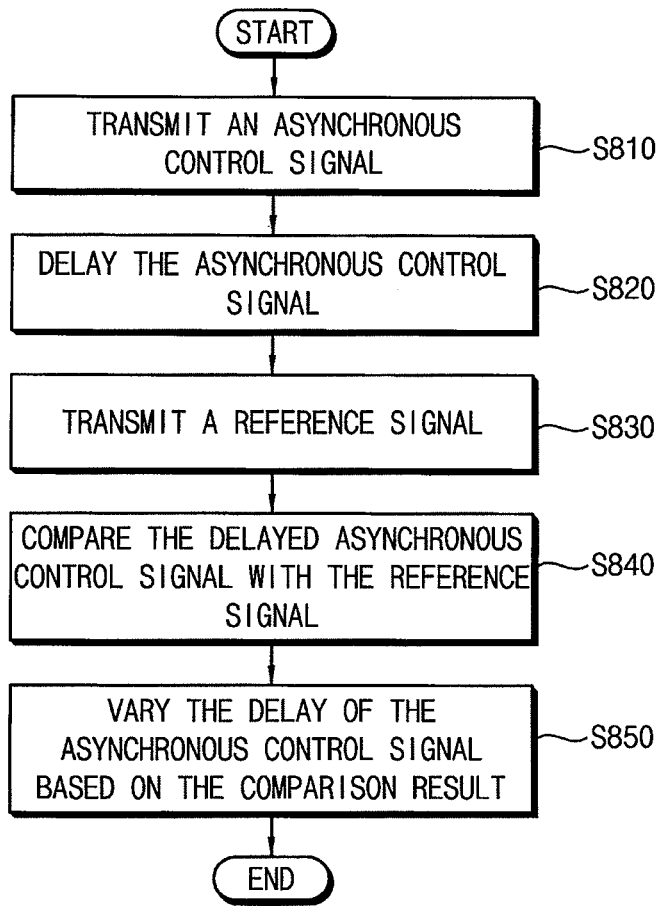
FIG. 12 is a flow chart illustrating a method of training ODT according to other exemplary embodiments.

FIG. 11 is a block diagram illustrating a memory system that performs ODT training according to other exemplary embodiments, and FIG. 12 is a flow chart illustrating a method of training ODT according to other exemplary embodiments.

Referring to FIGS. 11 and 12, a memory controller 500 transmits an asynchronous control signal ACS to a memory device 400 (Step S810). The memory device 400 may receive the asynchronous control signal ACS through an ODT pin 220 of FIG. 6.

The memory device 400 delays the received asynchronous control signal ACS (Step S820). The memory device 400 may include a variable delay unit 495 for variably delaying the asynchronous control signal ACS received by an ODT buffer 450 of FIG. 6.

The memory controller 500 transmits a reference signal REF to the memory device 400 at a point of time when write termination impedance is desired to be provided (Step S830).

The memory device 400 compares the delayed asynchronous control signal ACS with the reference signal REF (Step S840). The memory device 400 may generate a comparison result signal UP/DN indicating whether a point of time when the delayed asynchronous control signal ACS is applied to an ODT circuit 100 leads or lags a point of time when the reference signal REF is received by comparing the delayed asynchronous control signal ACS with the reference signal REF.

The memory device 400 varies the delay of the asynchronous control signal ACS based on the comparison result signal UP/DN (Step S850). For example, if the comparison result signal UP/DN indicates that the point of time when the delayed asynchronous control signal ACS is applied to the ODT circuit 100 leads the point of time when the reference signal REF is received, the memory device 400 may control the variable delay unit 495 to increase the delay time of the asynchronous control signal ACS.

In some embodiments, such a method of training ODT may be repeatedly performed such that the asynchronous control signal ACS and the reference signal REF having a predetermined time interval are repeatedly transmitted by the memory controller 500.

As described above, even though a time interval from when the memory controller 500 transmits the asynchronous control signal ACS to when the asynchronous control signal ACS is applied to the ODT circuit is changed according to the PVT variation, the memory device 400 may provide the write termination impedance at the desired point of time since the memory device 400 adjusts the delay time of the asynchronous control signal ACS by the method of training the ODT according to other exemplary embodiments.

Figure 13:
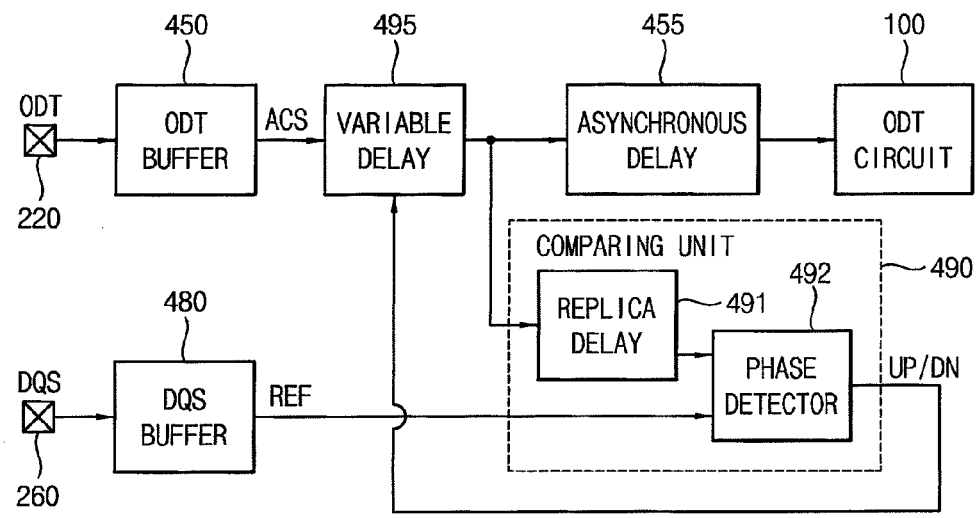
FIG. 13 is a block diagram illustrating a portion of a memory device of FIG. 6 that performs a method of training ODT of FIG. 12.
Figure 14:
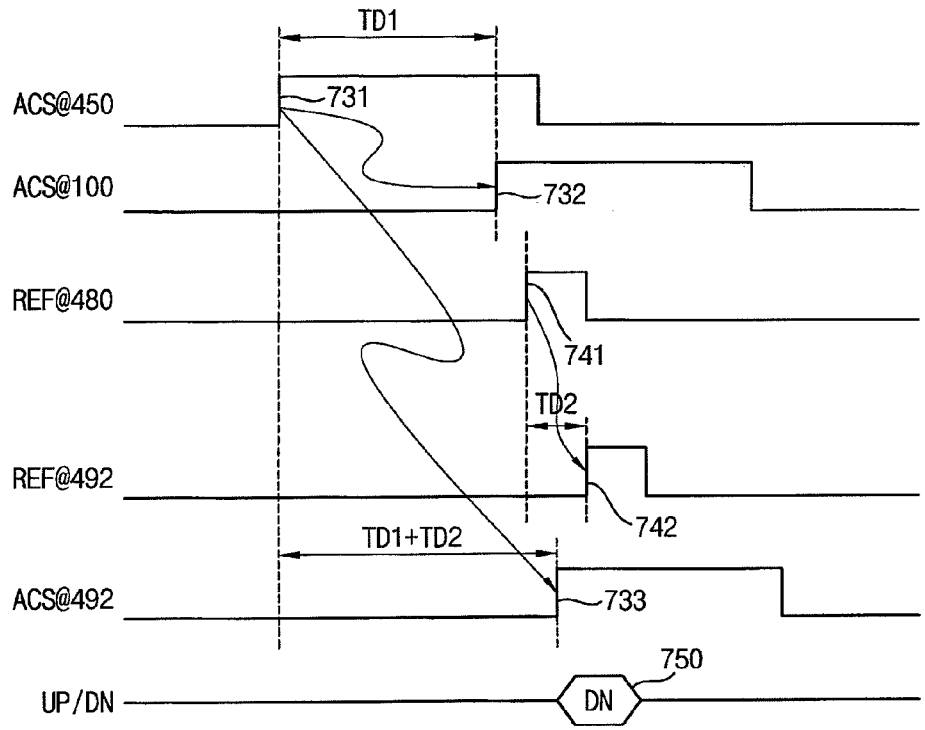
FIG. 14 is a timing diagram for describing a method of training ODT of FIG. 12.

FIG. 13 is a block diagram illustrating a portion of a memory device of FIG. 6 that performs a method of training ODT of FIG. 12, and FIG. 14 is a timing diagram for describing a method of training ODT of FIG. 12.

Referring to FIGS. 13 and 14, a memory device 400b includes an ODT buffer 450, an asynchronous delay unit 455, a DQS buffer 480, a comparing unit 490, a variable delay unit 495, and an ODT circuit 100. A training circuit according to the present embodiment comprises the asynchronous delay unit 455, the comparing unit 490, and the variable delay unit 495. In FIG. 14, ACS@450 represents an asynchronous control signal ACS applied to the ODT buffer 450, ACS@100 represents the asynchronous control signal ACS applied to the ODT circuit 100, REF@480 represents a reference signal REF applied to the DQS buffer 480, REF@492 represents the reference signal REF applied to a phase detector 492, ACS@492 represents the asynchronous control signal ACS applied to the phase detector 492, and UP/DN represents a comparison result signal.

The ODT buffer 450 may receive the asynchronous control signal ACS from a memory controller through an ODT pin 220. The ODT buffer 450 may provide the asynchronous control signal ACS to the variable delay unit 495 by buffering the asynchronous control signal ACS.

The variable delay unit 495 is placed in the signal path of the asynchronous control signal ACS received from the ODT buffer 450 to variably delay the ACS signal in response to the training result output from the phase detector 492. The asynchronous control signal ACS delayed by the variable delay unit 495 may be further delayed by the asynchronous delay unit 455 before being applied to the ODT circuit 100. A rising edge 732 of the asynchronous control signal ACS applied to the ODT circuit 100 may be delayed by a first delay time TD1 with respect to a rising edge 731 of the asynchronous control signal ACS applied to the ODT buffer 450. The first delay time TD1 may correspond to the sum of an operation time of the ODT buffer 450, the delay time of the variable delay unit 495, and a transmission time from an output of the variable delay unit 495 to an input of the ODT circuit 100 (denoted herein as the asynchronous delay unit 455).

The DQS buffer 480 may receive the reference signal REF from the memory controller through a DQS pin 260, and may provide the reference signal REF to the phase detector 492 included in the comparing unit 490 by buffering the reference signal REF. A rising edge 742 of the reference signal REF applied to the phase detector 492 may be delayed by a second delay time TD2 with respect to a rising edge 741 of the reference signal REF applied to the DQS buffer 480.

The replica delay unit 491 may receive the asynchronous control signal ACS from the variable delay unit 495. The replica delay unit 491 may delay the asynchronous control signal ACS by the sum of an operation time of the DQS buffer 480 (i.e., the second delay time TD2) and the delay time of the asynchronous delay unit 455. Accordingly, the replica delay unit 491 may provide the phase detector 492 with the asynchronous control signal ACS delayed by the second delay time TD2 with respect to the asynchronous control signal ACS applied to the ODT circuit 100.

The phase detector 492 may receive the asynchronous control signal ACS delayed by the first delay time TD1 and the second delay time TD2 with respect to the asynchronous control signal ACS applied to the ODT buffer 450, and may receive the reference signal REF delayed by the second delay time TD2 with respect to the reference signal REF applied to the DQS buffer 480. The phase detector 492 may generate a comparison result signal UP/DN by comparing a phase of the received asynchronous control signal ACS and a phase of the received reference signal REF. For example, if a rising edge 733 of the received asynchronous control signal ACS leads a rising edge 742 of the received reference signal REF, the phase detector 492 may generate the comparison result signal UP/DN indicating that the asynchronous control signal ACS is to be further delayed. Since both the asynchronous control signal ACS and the reference signal REF are delayed by the second delay time TD2 before being compared by the phase detector 492, the phase detector 492 may compare a point of time when the asynchronous control signal ACS is applied to the ODT circuit 100 with a point of time when the write termination impedance is desired to be provided.

The variable delay unit 495 may receive the comparison result signal UP/DN, and may adjust the delay time of the asynchronous control signal ACS based on the comparison result signal UP/DN. For example, if the comparison result signal UP/DN indicates that the phase of the asynchronous control signal ACS leads the phase of the reference signal REF, the variable delay unit 495 may increase the delay time of the asynchronous control signal ACS. Accordingly, the ODT circuit 100 may provide the write termination impedance at the desired point of time.

As described above, since the variable delay unit 495 adjusts the delay time of the asynchronous control signal ACS, the memory device 400a may provide the write termination impedance at the desired point of time regardless of the PVT variation.

Figure 15:
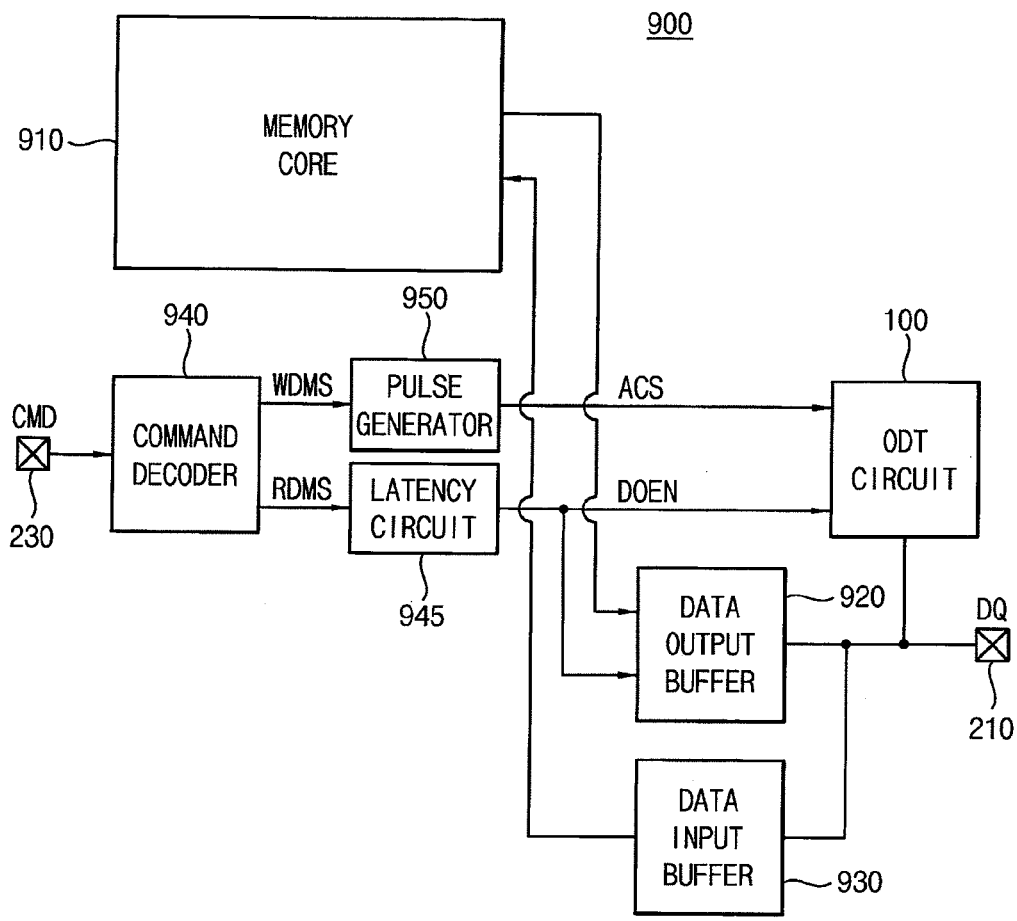
FIG. 15 is a block diagram illustrating a memory device including an ODT circuit of FIG. 1 according to other exemplary embodiments.

FIG. 15 is a block diagram illustrating a memory device including an ODT circuit of FIG. 1 according to other exemplary embodiments.

Referring to FIG. 15, a memory device 900 includes a memory core 910, a data output buffer 920, a data input buffer 930, a command decoder 940, a latency circuit 945, a pulse generator 950 and an ODT circuit 100.

The memory core 910 stores write data provided from the data input buffer 930, and provides read data to the data output buffer 920 based on the stored data. The data output buffer 920 and the data input buffer 930 are coupled to an external data input/output pin 210. The data output buffer 920 may transfer the read data to a memory controller through the data input/output pin 210, and the data input buffer 930 may receive the write data from the memory controller through the data input/output pin 210.

The command decoder 940 may generate a control signal corresponding to a command signal CMD by decoding the command signal CMD received from a memory controller (not shown) external to the memory device 900 through an external pin 230. The command decoder 940 may generate a write mode signal WDMS in response to a write command from the memory controller, and may generate a read mode signal RDMS in response to a read command. The latency circuit 945 may synchronize the read mode signal RDMS with an external clock to generate an output enable signal DOEN that has a high level while the read data are output through the data input/output pin 210. The pulse generator 950 may generate an asynchronous control signal ACS not synchronized with the external clock signal in response to the write mode signal WDMS. The asynchronous control signal ACS generated by the pulse generator 950 may be a pulse signal having a high level for a predetermined period of time. In some embodiments, the pulse generator 950 may adjust the predetermined period of time during which the asynchronous control signal ACS has the high level according to a burst length of the write data. The pulse generator 950 may be included in the command decoder 940, or may be disposed outside the command decoder 940.

The ODT circuit 100 may adjust termination impedance in response to the asynchronous control signal ACS received from the pulse generator 950. Since the command decoder 940 and the pulse generator 950 generate the asynchronous control signal ACS based on the write command, the memory device 900 may not receive the asynchronous control signal ACS from the memory controller, and may be implemented without an ODT pin. Accordingly, the memory device 900 may have the reduced number of external pins. Further, since the asynchronous control signal ACS is not synchronized with the external clock signal, the memory device 900 may turn off a clock synchronization circuit during a normal mode and a write mode. Accordingly, the memory device 900 may reduce power consumption.

The ODT circuit 100 may provide normal termination impedance to a data transmission line coupled to the data input/output pin 210 during the normal mode. The ODT circuit 100 may be electrically decoupled from the data input/output pin 210 in response to the output enable signal DOEN during the read mode. The ODT circuit 100 may provide write termination impedance to the data transmission line in response to the asynchronous control signal ACS during the write mode. The write termination impedance may be higher than the normal termination impedance.

As described above, since the memory device 900 includes neither an ODT pin nor an ODT enable pin, the number of external pins of the memory device 900 may be reduced. Further, since the ODT circuit 100 is asynchronously controlled, the memory device 900 may turn off the clock synchronization circuit during the normal mode and the write mode, thereby reducing the power consumption.

Figure 16:
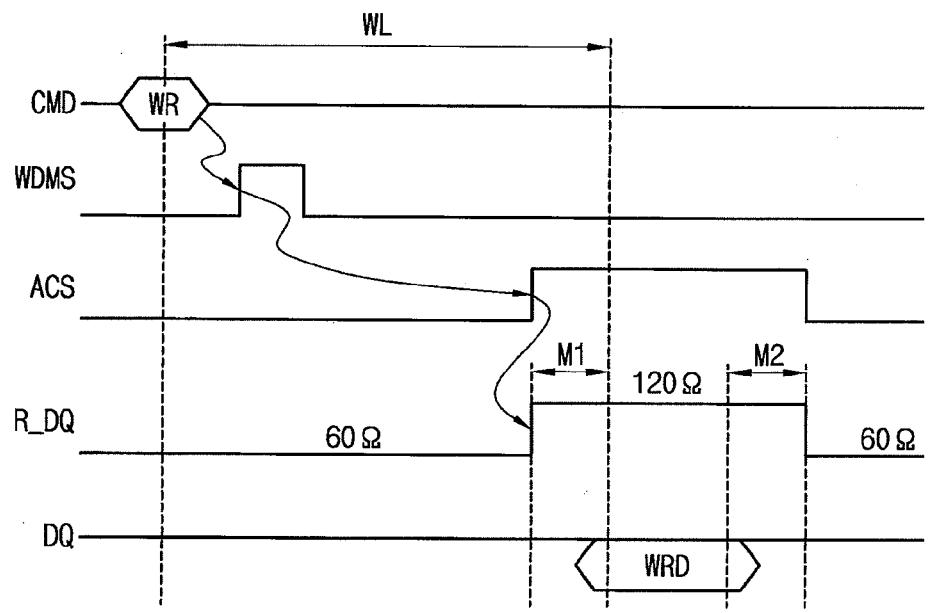
FIG. 16 is a timing diagram for describing a termination operation of a memory device of FIG. 15.

FIG. 16 is a timing diagram for describing a termination operation of a memory device of FIG. 15.

In an example illustrated in FIG. 16, a memory device 900 operates in a normal mode, and then operates in a write mode. Referring to FIGS. 15 and 16, a command decoder 940 generates a write mode signal WDMS in response to a write command WR received from a memory controller. The pulse generator 950 generates an asynchronous control signal ACS in response the write mode signal WDMS received from the command decoder 940. The asynchronous control signal ACS may be delayed and applied to an ODT circuit 100. The ODT circuit 100 may adjust termination impedance in response to the asynchronous control signal ACS such that the ODT circuit 100 may provide write termination impedance higher than normal termination impedance while the asynchronous control signal ACS has a high level. In some embodiments, the pulse generator 950 is controlled to output the asynchronous control signal ACS with a pulse width that is stretched to cover the write data window. In other words, the ODT circuit 100 is caused by the stretched ACS signal to provide the write termination impedance from a first margin time M1 before starting to receive the write data WRD to a second margin time M2 after finishing to receive the write data WRD.

Figure 17:
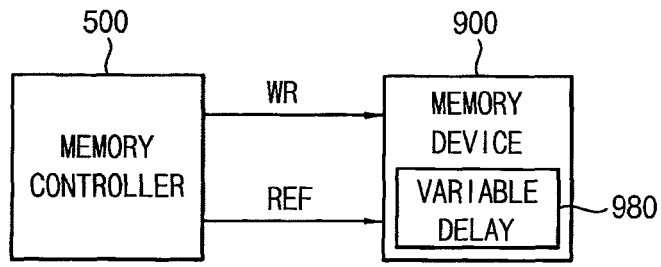
FIG. 17 is a block diagram illustrating a memory system that performs ODT training according to still other exemplary embodiments.
Figure 18:
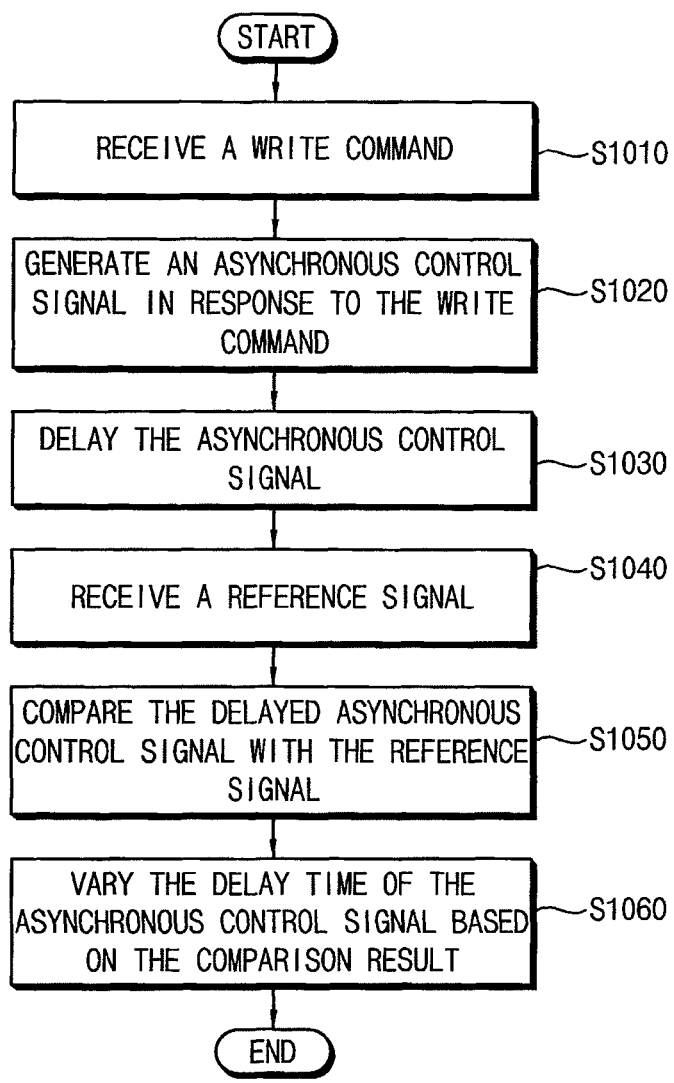
FIG. 18 is a flow chart illustrating a method of training ODT according to still other exemplary embodiments.

FIG. 17 is a block diagram illustrating a memory system that performs ODT training according to still other exemplary embodiments, and FIG. 18 is a flow chart illustrating a method of training ODT according to still other exemplary embodiments.

Referring to FIGS. 15, 17 and 18, a memory controller 500 transmits a write command WR to a memory device 900 (Step S1010). The memory device 900 generates an asynchronous control signal ACS in response to the write command WR (Step S1020). A command decoder 940 may generate a write mode signal WDMS by decoding the write command WR, and a pulse generator 950 may generate the asynchronous control signal ACS not synchronized with an external clock signal in response to the write mode signal WDMS.

The memory device 900 delays the asynchronous control signal ACS (Step S1030). The asynchronous control signal ACS may be delayed by a variable delay unit 980 included in the memory device 900.

The memory controller 500 transmits a reference signal REF to the memory device 900 at a point of time when write termination impedance is desired to be provided (Step S1040).

The memory device 900 compares the delayed asynchronous control signal ACS with the reference signal REF (Step S1050). The memory device 900 may compare a point of time when the delayed asynchronous control signal ACS is applied to the ODT circuit 100 with a point of time when the reference signal REF is received, and may generate a comparison result signal based on the result of the comparison between the points of time.

The memory device 900 varies the delay time of the asynchronous control signal ACS based on the comparison result signal (Step S1060).

In some embodiments, the ODT training method of FIG. 18 may be repeatedly performed such that the memory controller 500 repeatedly transmits the write command WR and the reference signal REF with a predetermined time interval.

As described above, even though a time interval from when the memory controller 500 transmits the write command WR to when the asynchronous control signal ACS is applied to the ODT circuit 100 is changed according to the PVT variation, the memory device 900 may provide the write termination impedance at the desired point of time since the memory controller 900 adjusts the delay time of the asynchronous control signal ACS by the method of training the ODT according to still other exemplary embodiments.

Figure 19:
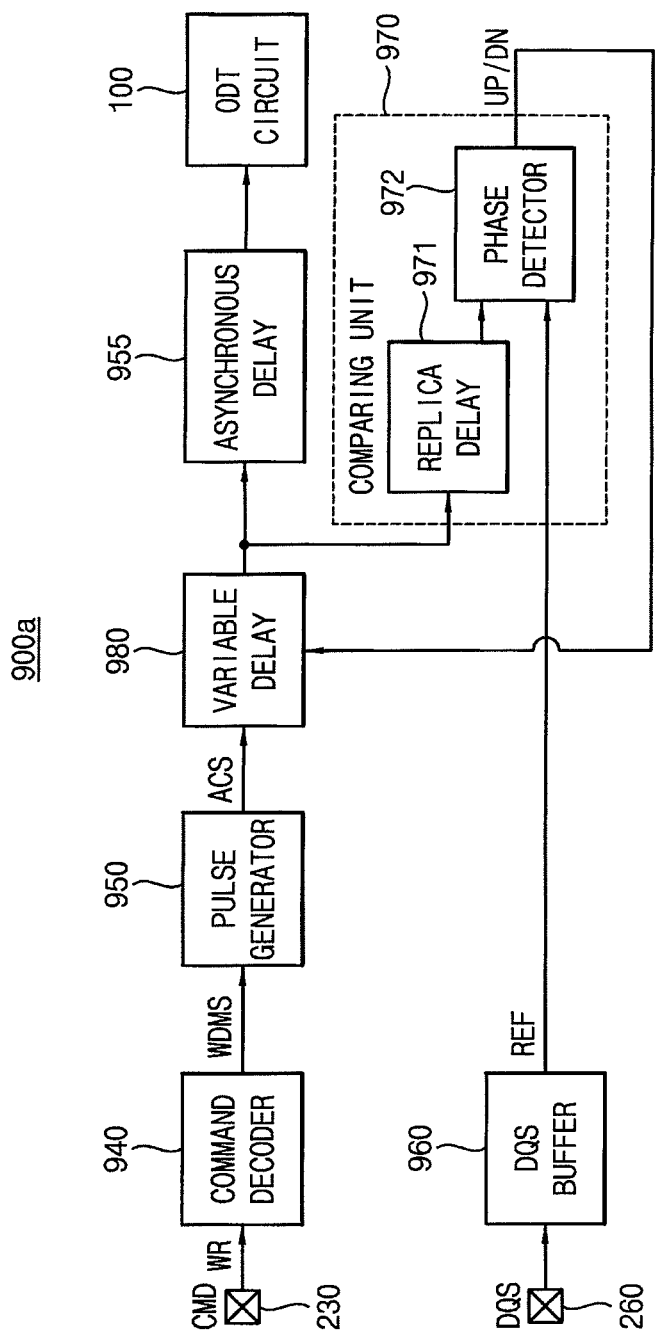
FIG. 19 is a block diagram illustrating a portion of a memory device of FIG. 17 that performs a method of training ODT of FIG. 18.
Figure 20:
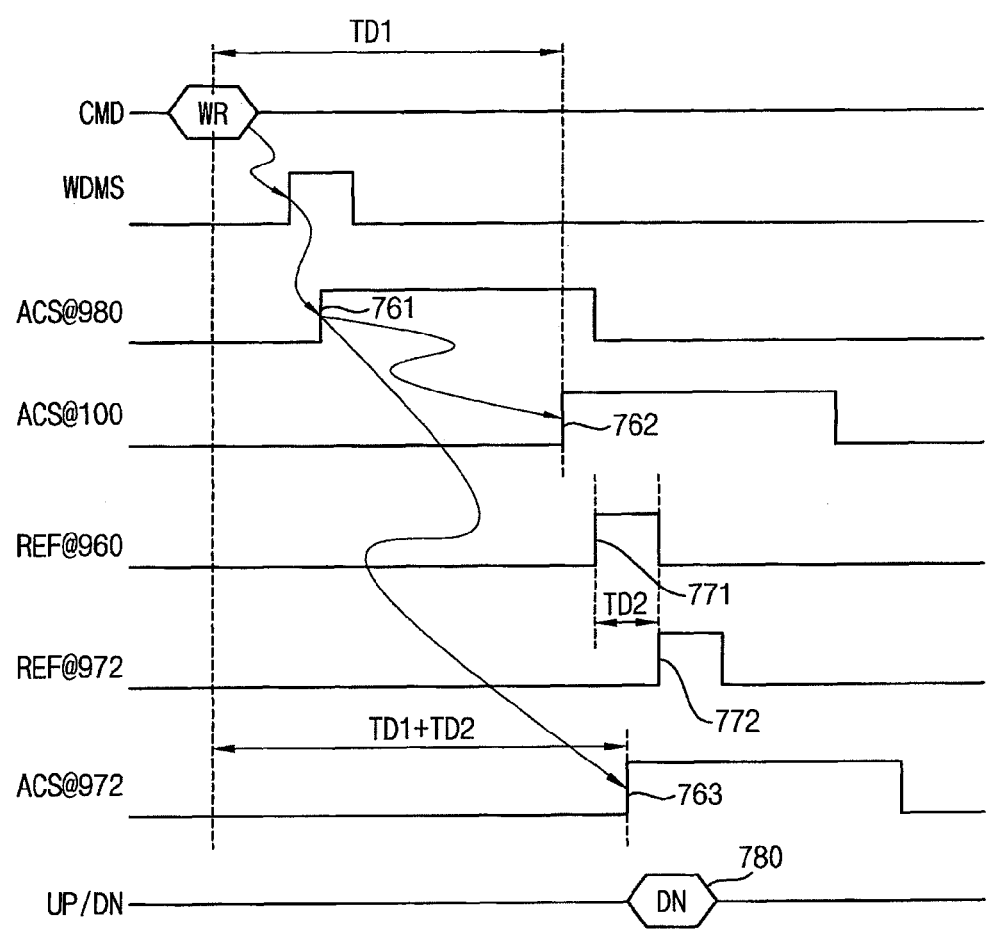
FIG. 20 is a timing diagram for describing a method of training ODT of FIG. 18.

FIG. 19 is a block diagram illustrating a portion of a memory device of FIG. 17 that performs a method of training ODT of FIG. 18, and FIG. 20 is a timing diagram for describing a method of training ODT of FIG. 18.

Referring to FIGS. 19 and 20, a memory device 900a includes a command decoder 940, a pulse generator 950, an asynchronous delay unit 955, a DQS buffer 960, a comparing unit 970, a variable delay unit 980 and an ODT circuit 100. A training circuit according to the present embodiment comprises the asynchronous delay unit 955, the comparing unit 970, and the variable delay unit 980. In FIG. 20, CMD represents a command signal transmitted from a memory controller to the memory device 900a, WDMS represents a write mode signal, ACS@980 represents an asynchronous control signal ACS applied to the variable delay unit 980, ACS@100 represents the asynchronous control signal ACS applied to the ODT circuit 100, REF@960 represents a reference signal REF applied to the DQS buffer 960, REF@972 represents the reference signal REF applied to a phase detector 972, ACS@972 represents the asynchronous control signal ACS applied to the phase detector 972, and UP/DN represents a comparison result signal.

The command decoder 940 may receive a write command WR from the memory controller through a command pin 230, and may generate a write mode signal WDMS in response to the write command WR. The pulse generator 950 may generate the asynchronous control signal ACS in response to the write mode signal WDMS.

The variable delay unit 980 may delay the asynchronous control signal ACS received from the pulse generator 950 by a predetermined delay time. The asynchronous control signal ACS delayed by the variable delay unit 980 may be further delayed by the asynchronous delay unit 955 before being applied to the ODT circuit 100. Accordingly, a rising edge 762 of the asynchronous control signal ACS applied to the ODT circuit 100 may be delayed with respect to a rising edge 761 of the asynchronous control signal ACS applied to the variable delay unit 980, and may be delayed by a first delay time TD1 from when the write command WR is received. The first delay time TD1 may correspond to the sum of operation times of the command decoder 940 and the pulse generator 950, the delay time of the variable delay unit 980, and a transmission time from an output of the variable delay unit 980 to an input of the ODT circuit 100 (i.e., a delay time caused by the asynchronous delay unit 955).

The DQS buffer 960 may receive the reference signal REF from the memory controller through a DQS pin 260, and may provide the reference signal REF to the phase detector 970 included in the comparing unit 970 by buffering the reference signal REF. A rising edge 772 of the reference signal REF applied to the phase detector 972 may be delayed by a second delay time TD2 with respect to a rising edge 771 of the reference signal REF applied to the DQS buffer 960.

The replica delay unit 971 may receive the asynchronous control signal ACS from the variable delay unit 980. The replica delay unit 971 may delay the asynchronous control signal ACS by the sum of an operation time of the DQS buffer 960 (i.e., the second delay time TD2) and the transmission time from the output of the variable delay unit 980 to the input of the ODT circuit 100 (i.e., the delay time caused by the asynchronous delay unit 955). Accordingly, the replica delay unit 971 may provide the phase detector 972 with the asynchronous control signal ACS delayed by the second delay time TD2 with respect to the asynchronous control signal ACS applied to the ODT circuit 100.

The phase detector 972 may receive the asynchronous control signal ACS delayed by the first delay time TD1 and the second delay time TD2 from when the write command WR is received, and may receive the reference signal REF delayed by the second delay time TD2 with respect to the reference signal REF applied to the DQS buffer 480. The phase detector 972 may generate a comparison result signal UP/DN by comparing a phase of the received asynchronous control signal ACS and a phase of the received reference signal REF. For example, if a rising edge 763 of the received asynchronous control signal ACS leads a rising edge 772 of the received reference signal REF, the phase detector 972 may generate the comparison result signal 780 indicating that the asynchronous control signal ACS is to be further delayed. Since both the asynchronous control signal ACS and the reference signal REF are delayed by the second delay time TD2 before being compared by the phase detector 972, the phase detector 972 may substantially compare a point of time when the asynchronous control signal ACS is applied to the ODT circuit 100 with a point of time when the write termination impedance is desired to be provided.

The variable delay unit 980 may receive the comparison result signal UP/DN, and may adjust the delay time of the asynchronous control signal ACS based on the comparison result signal UP/DN. For example, if the comparison result signal UP/DN indicates that the phase of the asynchronous control signal ACS leads the phase of the reference signal REF, the variable delay unit 980 may increase the delay time of the asynchronous control signal ACS. Accordingly, the ODT circuit 100 may provide the write termination impedance at the desired point of time.

As described above, since the variable delay unit 980 adjusts the delay time of the asynchronous control signal ACS, the memory device 900*a* may provide the write termination impedance at the desired point of time regardless of the PVT variation.

Figure 21:
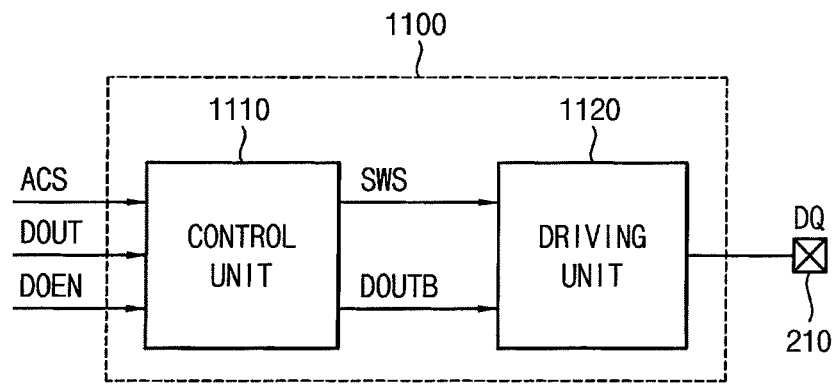
FIG. 21 is a block diagram illustrating a data output buffer having an ODT function according to some exemplary embodiments.

FIG. 21 is a block diagram illustrating a data output buffer having an ODT function according to some exemplary embodiments.

Referring to FIG. 21, a data output buffer 1100 includes a control unit 1110 and a driving unit 1120.

The driving unit 1120 is coupled to an external pin 210. The driving unit 1120 selectively performs a driver operation to transfer read data DOUT to a memory controller through a transmission line coupled to the external pin 210, or a termination operation to provide termination impedance to the transmission line coupled to the external pin 210. That is, the data output buffer 1100 may be an ODT-merged data output buffer. The external pin 210 may be a data input/output pin, a data strobe pin, or the like. The driving unit 1120 may perform a pull-up termination operation or a pull-down termination operation as the termination operation.

The control unit 1110 is coupled to the driving unit 1120. The control unit 1110 may control the driving unit 1120 to selectively perform the driver operation or the termination operation in response to an output enable signal DOEN. For example, if the output enable signal DOEN is active at a high level, the control unit 1110 may provide inverted read data DOUTB to the driving unit 1120 by inverting the read data DOUT received from a memory core. The driving unit 1120 may perform the driver operation in response to the inverted read data DOUTB. If the output enable signal DOEN is inactive at a low level, the control unit 1110 may provide a switching signal SWS to the driving unit 1120. The driving unit 1120 may perform the termination operation in response to the switching signal SWS.

If the control unit 1110 receives an asynchronous control signal ACS of a high level while the output enable signal DOEN has the low level, the control unit 1110 may adjust the termination impedance provided by the driving unit 1120 in response to the asynchronous control signal ACS. A memory device including the data output buffer 1100 may turn off a clock synchronization circuit while the driving unit 1120 performs the termination operation, thereby reducing power consumption.

Since the asynchronous control signal ACS is not synchronized with an external clock signal, the data output buffer 1100 may be implemented without an ODT latency circuit that synchronously controls the termination operation of the driving unit 1120 with the external clock signal. Further, the memory device including the data output buffer 1100 may turn off the clock synchronization circuit during a normal mode and a write mode, thereby reducing the power consumption. Since the memory device including the data output buffer 1100 may not receive an ODT enable signal for enabling the termination resistor from the memory controller, the number of external pins may be reduced.

Figure 22:
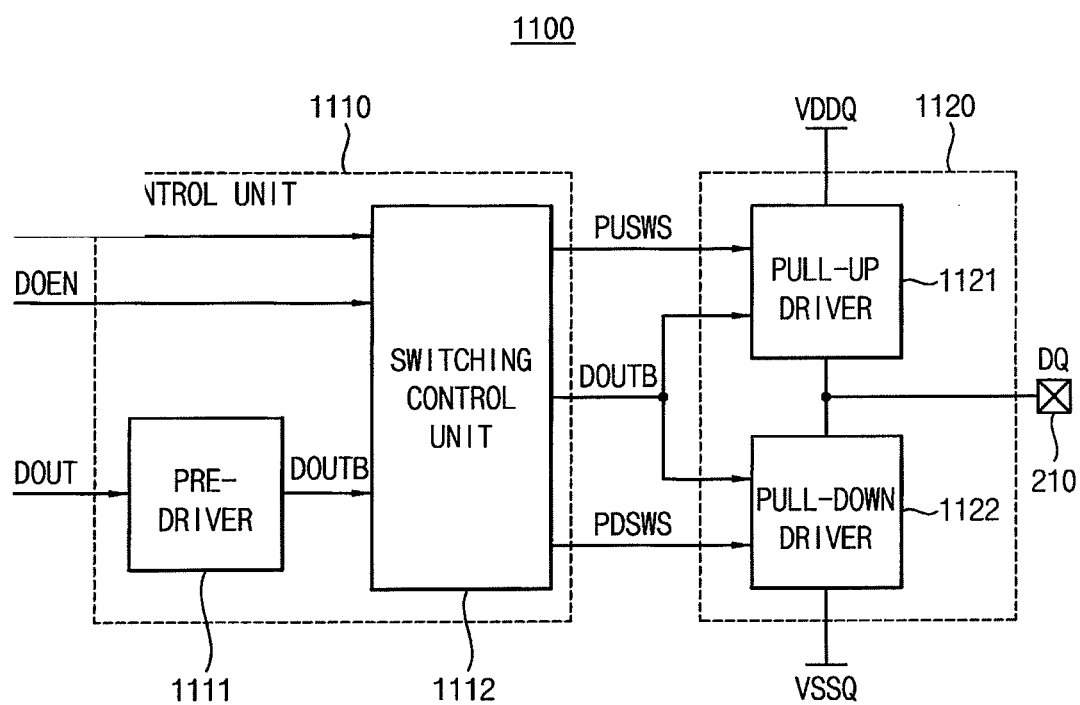
FIG. 22 is a block diagram illustrating an example of a data output buffer of FIG. 21.

FIG. 22 is a block diagram illustrating an example of a data output buffer of FIG. 21.

Referring to FIG. 22, a data output buffer 1100 includes a control unit 1110 and a driving unit 1120. The control unit 1110 includes a pre-driver 1111 and a switching control unit 1112. The driving unit 1120 includes a pull-up driver 1121 and a pull-down driver 1122.

The pre-driver 1111 may receive read data DOUT from a memory core, and may provide inverted read data DOUTB to the switching control unit 1112 by inverting the read data DOUT. The switching unit 1112 may selectively output the inverted read data DOUTB or pull-up and pull-down switching signals PUSWS and PDSWS in response to an output enable signal DOEN. The output enable signal DOEN may be active during a read mode, and the switching unit 1112 may provide the inverted read data DOUTB to the pull-up and pull-down drivers 1121 and 1122 in response to the active output enable signal DOEN.

The pull-up driver 1121 and the pull-down driver 1122 may perform a driver operation while the switching unit 1112 provides the inverted read data DOUTB in response to the active output enable signal DOEN. In some embodiments, a memory controller may perform a pull-up termination. In this case, a current does not flow through a transmission line coupled to an external pin 210 and a termination resistor of the memory controller unless the pull-down driver 1122 operates. In other embodiments, the memory controller may perform a pull-down termination. In this case, a current does not flow through the transmission line and the termination resistor unless the pull-up driver 1121 operates. Accordingly, power consumption may be reduced.

While the output enable signal DOEN is inactive, the switching control unit 1112 may provide the pull-up switching signal PUSWS the pull-down switching signal PDSWS to the pull-up driver 1121 and the pull-down driver 1122, respectively. In some embodiments, the pull-down switching signal PDSWS may turn off the pull-down driver 1122, and thus the driving unit 1120 may perform a pull-up termination operation. In other embodiments, the pull-up switching signal PUSWS may turn off the pull-up driver 1121, and thus the driving unit 1120 may perform a pull-down termination operation.

The switching control unit 1112 may change a logic level of the pull-up switching signal PUSWS in response to an asynchronous control signal ACS to adjust termination impedance provided by the pull-up driver 1121. The asynchronous control signal ACS may be active in a write mode, and the switching control unit 1112 may control the pull-up driver 1121 to provide the adjusted termination impedance during the write mode in response to the active asynchronous control signal ACS. For example, while the asynchronous control signal ACS is inactive during a normal mode, the switching control unit 1112 may control the pull-up driver 1121 to provide normal termination impedance of about 60Ω. While the asynchronous control signal ACS is active during the write mode, the switching control unit 1112 may control the pull-up driver 1121 to provide write termination resistor impedance of about 120Ω.

Figure 23A:
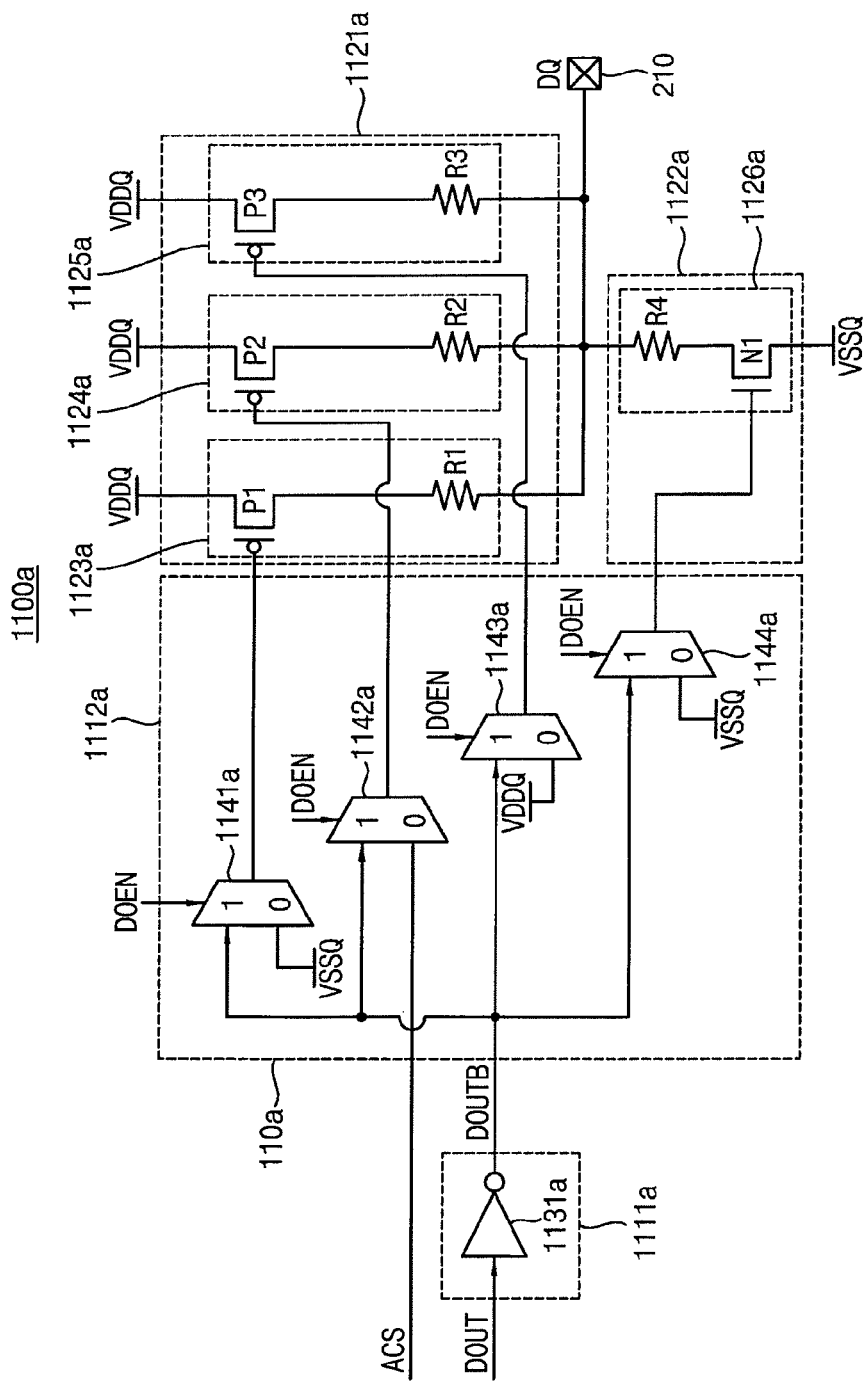
FIGS. 23A and 23B are circuit diagrams illustrating examples of a data output buffer of FIG. 22.

FIG. 23A is a circuit diagram illustrating an example of a data output buffer of FIG. 22.

Referring to FIG. 23A, a data output buffer 1100*a* includes a pre-driver 1111*a*, a switching control unit 1112*a*, a pull-up driver 1121*a* and a pull-down driver 1122*a*. The pre-driver 1111*a* may include an inverter 1131*a*. The switching control unit 1112*a* may include a first selector 1141*a*, a second selector 1142*a*, a third selector 1143*a* and a fourth selector 1144*a*. The pull-up driver 1121*a* may include a first termination circuit 1123*a*, a second termination circuit 1124*a* and a third termination circuit 1125*a*. The first termination circuit 1123*a* may include a first transistor P1 and a first resistor R1, the second termination circuit 1124*a* may include a second transistor P2 and a second resistor R2, and the third termination circuit 1125*a* may include a third transistor P3 and a third resistor R3. The pull-down driver 1122*a* may include a fourth termination circuit 1126*a*. The fourth termination circuit 1126*a* may include a fourth transistor N1 and a fourth resistor R4.

The inverter 1131*a* may output inverted read data DOUTB by inverting read data DOUT received from a memory core. Each of the first selector 1141*a*, the second selector 1142*a*, the third selector 1143a and the fourth selector 1144a may receive an output enable signal DOEN as a selection signal, and may receive the inverted read data DOUTB as a first input signal. While the output enable signal DOEN is active during a read mode, the first selector 1141a, the second selector 1142a, the third selector 1143a and the fourth selector 1144a may output the inverted read data DOUTB to the first transistor P1, the second transistor P2, the third transistor P3 and the fourth transistor P4, respectively.

During the read mode, the pull-up driver 1121a and/or the pull-down driver 1122a may perform a driver operation in response to the inverted read data DOUTB. For example, if the read data DOUT has a high level, the switching control unit 1112a may output the inverted read data DOUTB of a low level, the first transistor P1, the second transistor P2 and the third transistor P3 may be turned on, and the fourth transistor N1 may be turned off. Accordingly, the pull-up driver 1121a may transfer the read data DOUT of the high level through a transmission line coupled to an external pin 210. If the read data DOUT has a low level, the switching control unit 1112a may output the inverted read data DOUTB of a high level, the first transistor P1, the second transistor P2 and the third transistor P3 may be turned off, and the fourth transistor N1 may be turned on. Accordingly, the pull-down driver 1121a may transfer the read data DOUT of the low level through the transmission line.

In some embodiments, a data signal may be actually transmitted only when the read data DOUT of the low level are output by the pull-down driver 1121a. The first transistor P1, the second transistor P2 and the third transistor P3 included in the pull-up driver 1121a may be turned off during the read mode. And thus, the data output buffer 1100a may be electrically decoupled from the transmission line when the data output buffer 1100a outputs the read data DOUT of the high level. The data output buffer 1100a may output the read data DOUT in an open drain type or a pseudo open drain type.

While the output enable signal DOEN and an asynchronous control signal ACS are inactive at a low level during a normal mode, the first selector 1141a may output a ground voltage VSSQ of a low level, the second selector 1142a may output the asynchronous control signal ACS of the low level, the third selector 1143a may output a power supply voltage VDDQ of a high level, and the fourth selector 1144a may output the ground voltage VSSQ of the low level. The first transistor P1 may be turned on in response to the ground voltage VSSQ of the low level, the second transistor P2 may be turned on the asynchronous control signal ACS of the low level, the third transistor P3 may be turned off the power supply voltage VDDQ of the high level, and the fourth transistor N1 may be turned off in response to the ground voltage VSSQ of the low level. Accordingly, during the normal mode, the pull-up driver 1121a may provide the transmission line with normal termination impedance using the first resistor R1 and the second resistor R2 that are connected in parallel.

During a write mode, if the asynchronous control signal ACS is activated to a high level while the output enable signal DOEN is inactive at the low level, the first transistor P1, the third transistor P3 and the fourth transistor N1 may be continuously turned on, off and off, respectively, and the second transistor P2 may be turned off in response to the asynchronous control signal ACS of the high level. Accordingly, during the write mode, the pull-up driver 1121a may provide the transmission line with write termination impedance using the first resistor R1.

In some embodiments, each of the first resistor R1, the second resistor R2 and the third resistor R3 may have an impedance of about 120Ω, and the fourth resistor R4 may have an impedance of about 40Ω. In this case, the data output buffer 1100a may provide a driver impedance of about 40Ω during the read mode, may provide the write termination impedance of about 120Ω during the write mode, and may provide the normal termination impedance of about 60Ω during the normal mode.

Figure 23B:
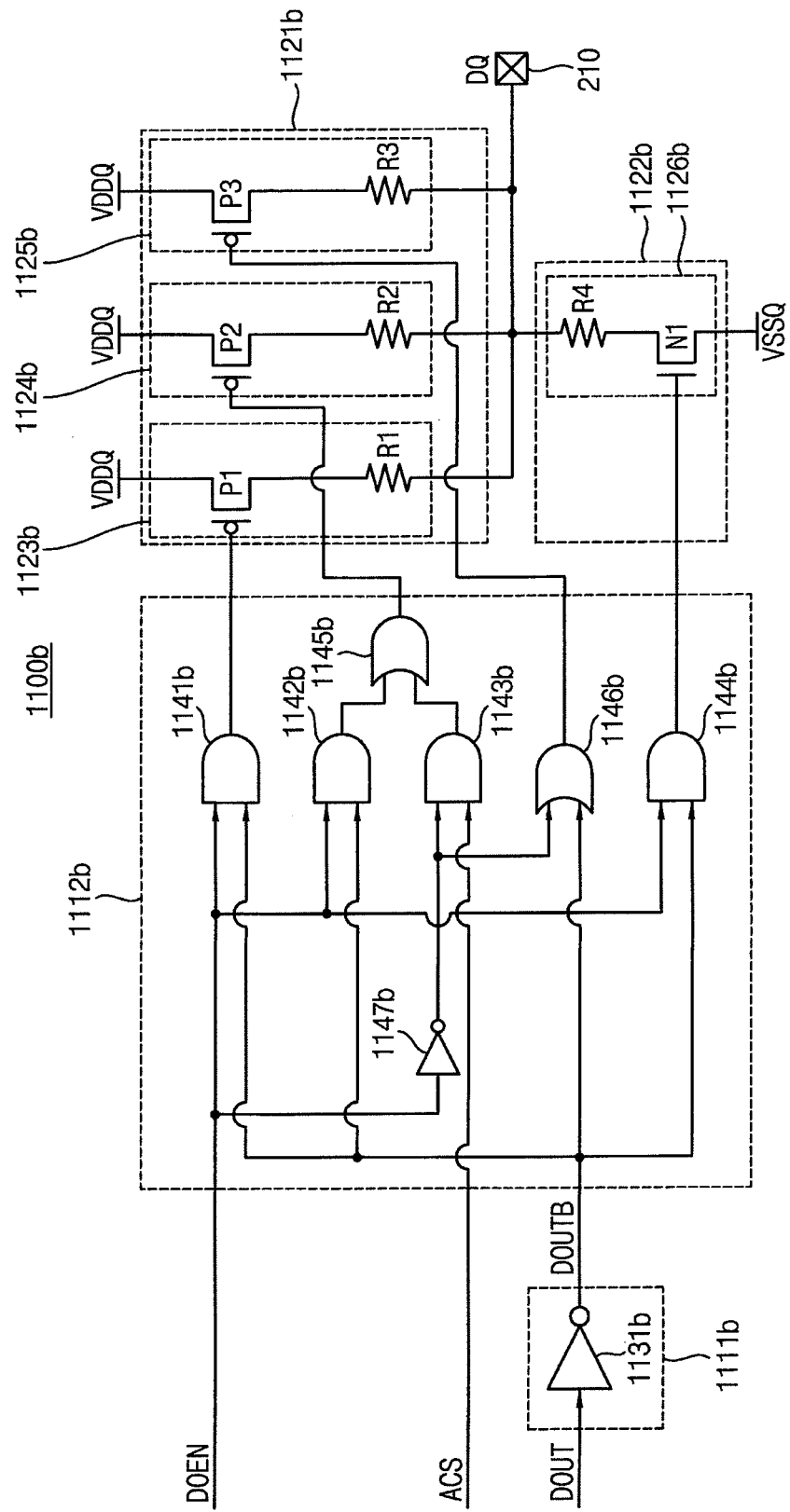

FIG. 23B is a circuit diagram illustrating another example of a data output buffer of FIG. 22.

Referring to FIG. 23B, a data output buffer 1100b includes a pre-driver 1111b, a switching control unit 1112b, a pull-up driver 1121b and a pull-down driver 1122b. The pre-driver 1111b may include a first inverter 1131b. The switching control unit 1112b may include first through fourth AND gates 1141b, 1142b, 1143b and 1144b, first and second OR gates 1145b and 1146b, and a second inverter 1147b. The pull-up driver 1121b may include a first termination circuit 1123b, a second termination circuit 1124b and a third termination circuit 1125b. The first termination circuit 1123b may include a first transistor P1 and a first resistor R1, the second termination circuit 1124b may include a second transistor P2 and a second resistor R2, and the third termination circuit 1125b may include a third transistor P3 and a third resistor R3. The pull-down driver 1122b may include a fourth termination circuit 1126b. The fourth termination circuit 1126b may include a fourth transistor N1 and a fourth resistor R4.

The first inverter 1131b may output inverted read data DOUTB by inverting read data DOUT received from a memory core. While an output enable signal DOEN is active during a read mode, each of the first AND gate 1141b, the second AND gate 1142b and the fourth AND gate 1144b may output the inverted read data DOUTB by performing an AND operation on the output enable signal DOEN of a high level and the inverted read data DOUTB. The third AND gate 1143b may output a signal of a low level in response to an inversion signal of the output enable signal DOEN provided from the second inverter 1147b, and the first OR gate 1145b may output the inverted read data DOUTB by performing an OR operation on the signal of the low level provided from the third AND gate 1143b and the inverted read data DOUTB. The second OR gate 1146b may output the inverted read data DOUTB by performing an OR operation on the inversion signal of the output enable signal DOEN provided from the second inverter 1147b and the inverted read data DOUTB. Accordingly, during the read mode, the pull-up driver 1121b and the pull-down driver 1122b may perform a driver operation in response to the inverted read data DOUTB.

During a normal mode, the output enable signal DOEN may be inactivated to a low level, and an asynchronous control signal ACS may be inactive at a low level. Each of the first AND gate 1141b, the second AND gate 1142b and the fourth AND gate 1144b may output a signal of a low level in response to the output enable signal DOEN of the low level. The third AND gate 1143b may output the asynchronous control signal ACS by performing an AND operation on the inversion signal of the output enable signal DOEN provided from the second inverter 1147b and the asynchronous control signal ACS, and the first OR gate 1145b may output the asynchronous control signal ACS of the low level by performing an output signal of the low level provided from the second AND gate 1142b and the asynchronous control signal ACS provided from the third AND gate 1143b. The second OR gate 1146b may output a signal of a high level in response to the inversion signal of the output enable signal DOEN provided from the second inverter 1147b. The first transistor P1 may be turned on in response to a low level output signal from the first AND gate 1141b, the second transistor P2 may be turned on in response to a low level asynchronous control signal ACS, the third transistor P3 may be turned off in response to a high level from the second OR gate 1146*b*, and the fourth transistor N4 may be turned off based on a low level output signal from the fourth AND gate 1144*b*. Accordingly, during the normal mode, the pull-up driver 1121*b* may provide a transmission line coupled to an external pin 210 with normal termination impedance using the parallel-connected first and second resistors R1 and R2.

During a write mode, the asynchronous control signal ACS may be activated to a high level while the output enable signal DOEN may be maintained at the low level. The first transistor P1, the third transistor P3 and the fourth transistor N1 may be continuously turned on, off and off, respectively, and the second transistor P2 may be turned off in response to the asynchronous control signal ACS of the high level. Accordingly, during the write mode, the pull-up driver 1121*a* may provide the transmission line with write termination impedance using the first resistor R1.

Although each of the first resistor R1, the second resistor R2, the third resistor R3 and the fourth resistor R4 is illustrated in FIGS. 23A and 23B as a single resistor, in some embodiments, each of the first resistor R1, the second resistor R2, the third resistor R3 and the fourth resistor R4 may be implemented with a plurality of resistors that are connected in parallel or in series and a plurality of transistors for controlling connections of the plurality of resistors. In some embodiments, impedance of each resistor may be adjusted by ZQ calibration.

Figures 24, 25:
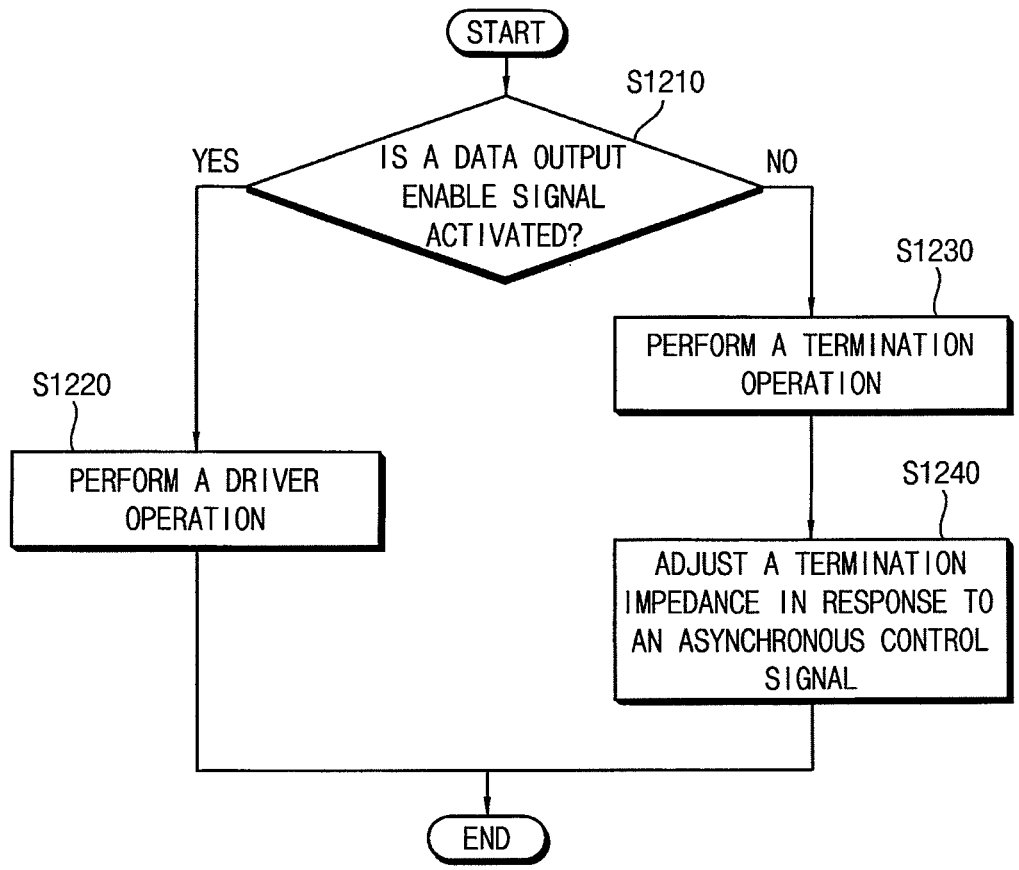
FIG. 24 is a table of impedances of a data output buffer of FIG. 21.
FIG. 25 is a flow chart illustrating a method of operating a data output buffer of FIG. 21 according to some exemplary embodiments.

FIG. 24 is a table of impedances of a data output buffer of FIG. 21.

Referring to FIGS. 21 and 24, during a read mode, a data output buffer 1100 may perform a driver operation, and may provide driver impedance of about 40Ω. During a write mode, the data output buffer 1100 may perform a write termination operation that provides write termination impedance of about 120Ω. During a normal mode, the data output buffer 1100 may perform a normal termination operation that provides normal termination impedance of about 60Ω.

Although an example where the driver impedance of about 40Ω is provided during the read mode, the write termination impedance of about 120Ω during the write mode, and the normal termination impedance of about 60Ω during the normal mode is illustrated in FIG. 24, the impedances according to operation modes may have various values. In some embodiments, the impedances may be selected by mode register setting.

FIG. 25 is a flow chart illustrating a method of operating a data output buffer of FIG. 21 according to some exemplary embodiments.

Referring to FIGS. 21 and 25, if an output enable signal DOEN is active (Step S1210: YES), a data output buffer 1100 performs a driver operation (Step S1220). A control unit 1110 may output inverted read data DOUTB in response to the active output enable signal DOEN, and a driving unit 1120 may perform the driver operation in response to the inverted read data DOUTB.

If the output enable signal DOEN is inactive (Step S1210: NO), the data output buffer 1100 performs a termination operation (Step S1230). The control unit 1110 may output a switching signal SWS in response to the inactive output enable signal DOEN, and the driving unit 1120 performs the termination operation in response the switching signal SWS.

While the data output buffer 1100 performs the termination operation, the data output buffer 1100 adjusts termination impedance in response to an asynchronous control signal ACS (Step S1240). For example, while the asynchronous control signal ACS is inactive during a normal mode, the data output buffer 1100 may perform a normal termination operation that provides normal termination impedance of about 60Ω. If the asynchronous control signal ACS is active during a write mode, the data output buffer 1100 may perform a write termination operation that provides write termination impedance of about 120Ω by adjusting the termination impedance.

The data output buffer 1100 may first determine whether or not to perform the driver operation according to a logic level of the output enable signal DOEN, and then may determine whether or not to perform the write termination operation according to a logic level of the asynchronous control signal ACS. Accordingly, the data output buffer 1100 may operate in a priority order of the driver operation, the write termination operation, and the normal termination operation.

Figure 26:
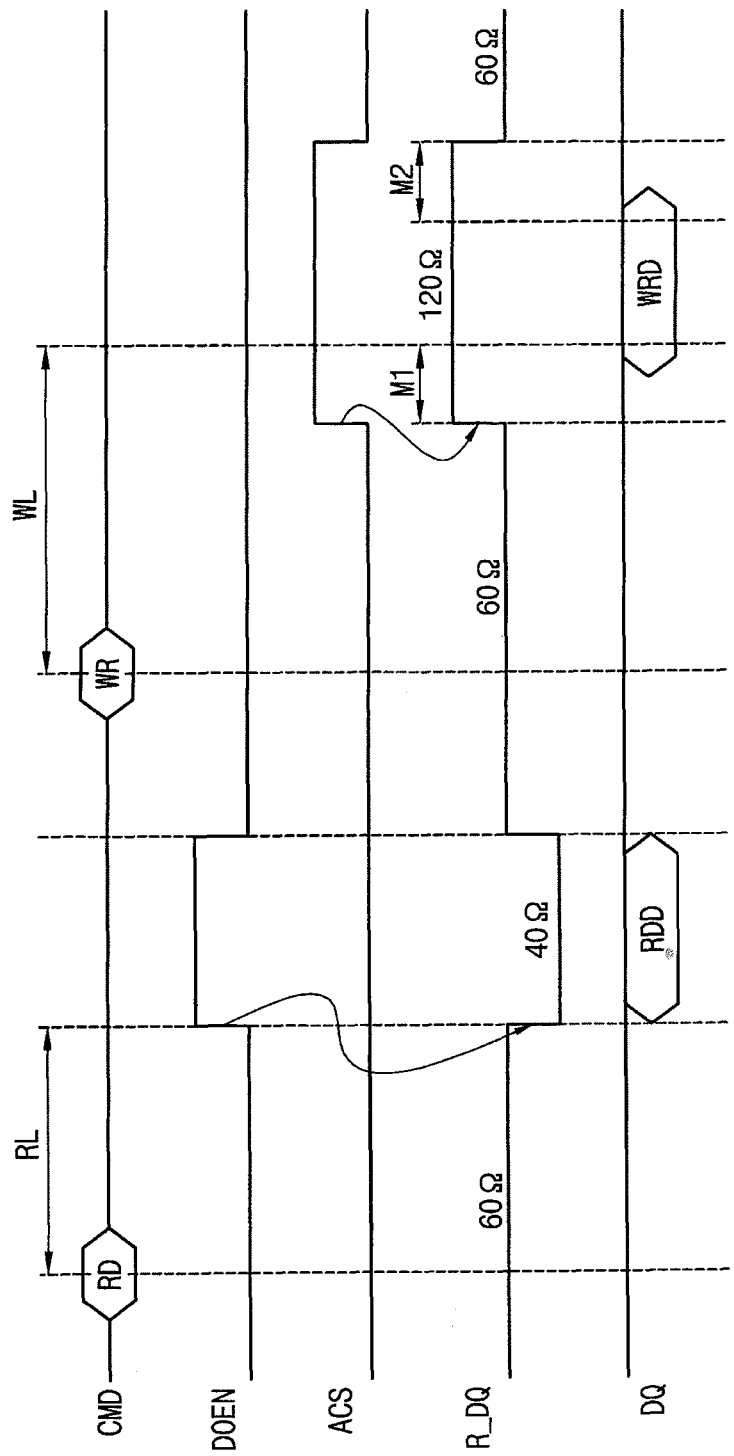
FIG. 26 is a timing diagram for describing operations of a data output buffer of FIG. 21.

FIG. 26 is a timing diagram for describing operations of a data output buffer of FIG. 21.

In an example illustrated in FIG. 26, a memory device including a data output buffer performs a read operation, and then the memory device performs a write operation. In FIG. 26, CMD represents a command signal transferred from a memory controller to the memory device, DOEN represents an output enable signal, ACS represents an asynchronous control signal, R_DQ represents impedance provided to a data transmission line, and DQ represents data transferred through the data transmission line.

Referring to FIGS. 21 and 26, if a memory device including a data output buffer 1100 receives a read command RD from a memory controller, the memory device may transfer read data RDD to the memory controller through a data transmission line after read latency RL. The memory device may activate an output enable signal DOEN to a high level while the read data RDD are transferred through the data transmission line. The data output buffer 1100 may perform a driver operation with driver impedance of about 40Ω in response to the active output enable signal DOEN.

The memory controller may transfer a write command WR to the memory device, and may transfer write data WRD to the memory device through the data transmission line after write latency WL. The memory device may activate an asynchronous control signal ACS during a predetermined period of time so that the data output buffer 1100 may provide termination impedance of about 120Ω from a first margin time M1 before starting to receive the write data WRD to a second margin time M2 after finishing to receive the write data WRD. For example, the first margin time M1 may correspond to 2 clock cycles, and the second margin time M2 may correspond to 1 clock cycle. The data output buffer 1100 may provide the termination impedance of about 60Ω while the output enable signal DOEN and the asynchronous control signal ACS are inactive.

Figure 27:
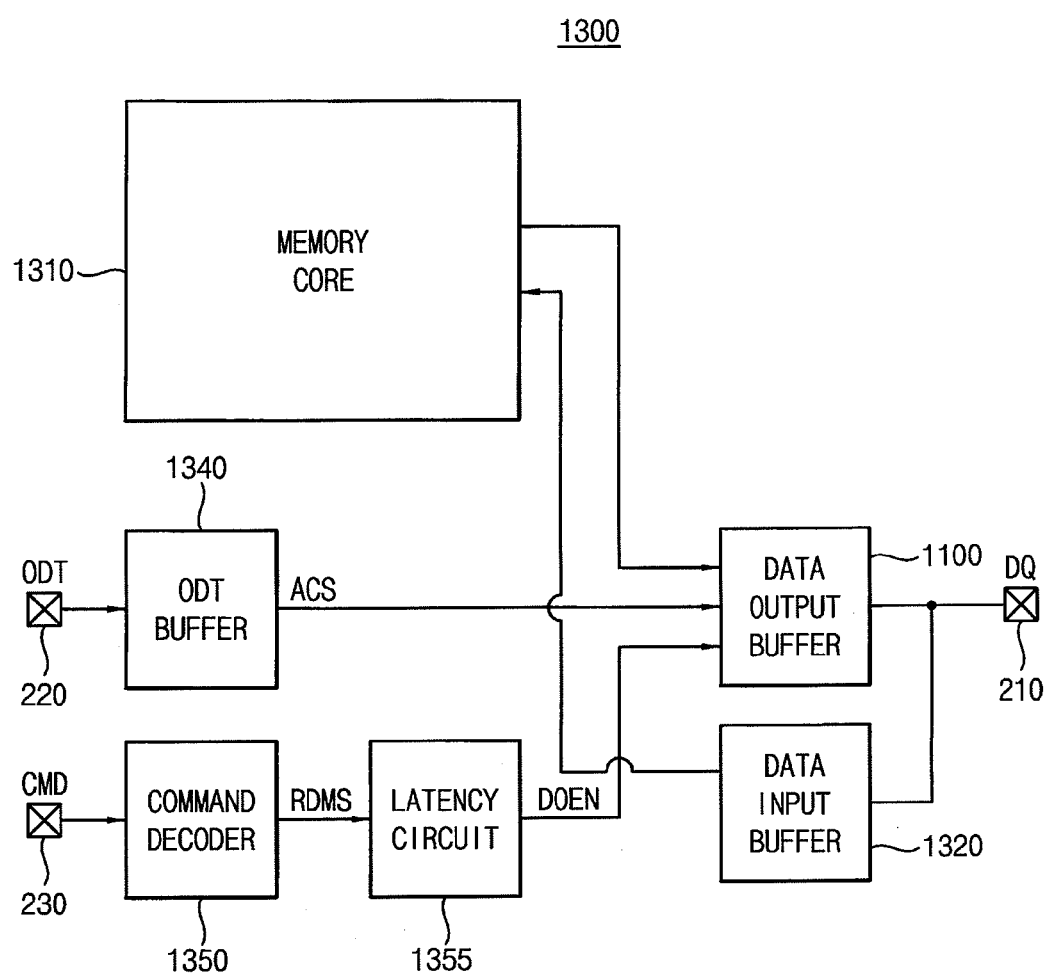
FIG. 27 is a block diagram illustrating a memory device including a data output buffer of FIG. 21 according to some exemplary embodiments.

FIG. 27 is a block diagram illustrating a memory device including a data output buffer of FIG. 21 according to some exemplary embodiments.

Referring to FIG. 27, a memory device 1300 includes a memory core 1310, a data output buffer 1100, a data input buffer 1320, an ODT buffer 1340, a command decoder 1350 and a latency circuit 1355.

The memory core 1310 stores write data provided from the data input buffer 1320, and provides read data to the data output buffer 1100 based on the stored write data. The data output buffer 1100 and the data input buffer 1320 are coupled to an external data input/output pin 210. The data output buffer 1100 transfers the read data to a memory controller through the data input/output pin 210, and the data input buffer 1320 receives the write data from the memory controller through the data input/output pin 210.

The command decoder 1350 may generate a control signal corresponding to a command signal CMD by decoding the command signal CMD received from the memory controller through a command pin 230. The command decoder 1350 may generate a read mode signal RDMS in response to a read command. The latency circuit 1355 may generate an output enable signal DOEN by synchronizing the read mode signal RDMS received from the command decoder 1350. The output enable signal DOEN may have a high level while the read data are transferred through the data input/output pin 210. The data output buffer 1100 may perform a driver operation in response to the output enable signal DOEN of the high level received from the latency circuit 1355.

The ODT buffer 1340 may receive an asynchronous control signal ACS from the memory controller through an ODT pin 220, and may provide the asynchronous control signal ACS to the data output buffer 1100 by buffering the asynchronous control signal ACS. The data output buffer 1100 may adjust termination impedance in response to the asynchronous control signal ACS received from the ODT buffer 1340.

The memory device 1300 may not receive an ODT enable signal for enabling the termination resistor unit, and may control the data output buffer 1100 to perform the termination operation without receiving the ODT enable signal only if the read data are not required to be output. Since the termination operation of the data output buffer 1100 is controlled based on the asynchronous control signal ACS, the memory device 1300 need not turn on a clock synchronization circuit to enable or control the termination operation. Thus, the memory device 1300 may turn off the clock synchronization circuit during a normal mode and a write mode, thereby reducing power consumption.

Figure 28:
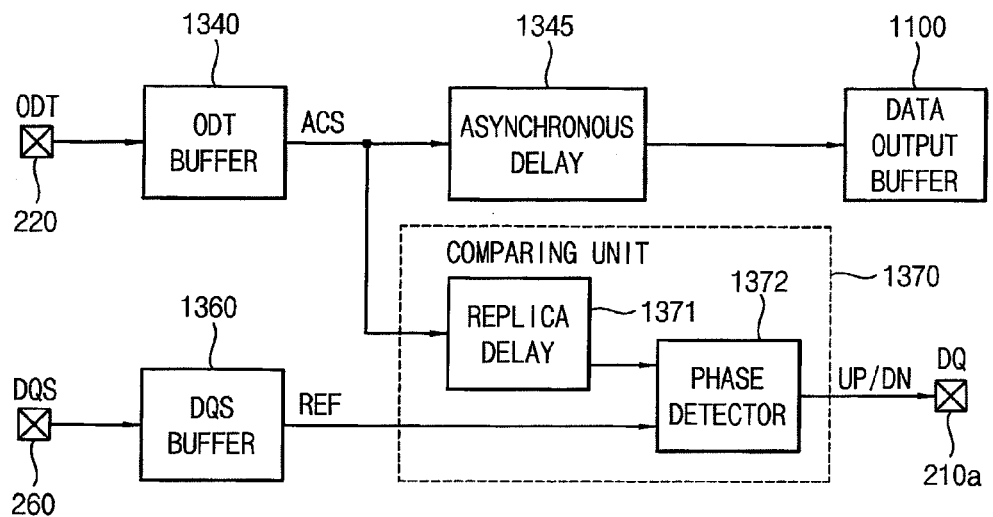
FIG. 28 is a block diagram illustrating a portion of a memory device of FIG. 27 that performs a method of training ODT of FIG. 8.

FIG. 28 is a block diagram illustrating a portion of a memory device of FIG. 27 that performs a method of training ODT of FIG. 8.

Referring to FIG. 28, a memory device 1300a includes an ODT buffer 1340, an asynchronous delay unit 1345, a DQS buffer 1360, a comparing unit 1370 and a data output buffer 1100. A training circuit according to the present embodiment comprises the asynchronous delay unit 1345 and the comparing unit 1370.

The ODT buffer 1340 receives an asynchronous control signal ACS from a memory controller through an ODT pin 220. The ODT buffer 1340 may provide the asynchronous control signal ACS to the asynchronous delay unit 1345 and the comparing unit 1370 by buffering the asynchronous control signal ACS. The asynchronous control signal ACS may be delayed by the asynchronous delay unit 1345, and the delayed asynchronous control signal ACS may be provided to the data output buffer 1100. The asynchronous delay unit 1345 may include a repeater for maintaining a voltage level of the asynchronous control signal ACS received from the ODT buffer 1340.

The memory controller may transmit a reference signal REF at a point of time when write termination impedance is desired to be provided. The DQS buffer 1360 may receive the reference signal REF form the memory controller through a DQS pin 260. The DQS buffer 1360 may provide the reference signal REF to the comparing unit 1370 by buffering the reference signal REF.

The comparing unit 1370 may include a replica delay unit 1371 and a phase detector 1372. The replica delay unit 1371 may receive the asynchronous control signal ACS from the ODT buffer 1340. The replica delay unit 1371 may delay the asynchronous control signal ACS by the sum of an operation time of the DQS buffer 1360 and a delay time caused by the asynchronous delay unit 1345. Accordingly, the replica delay unit 1371 may provide the phase detector 1372 with the asynchronous control signal ACS delayed by the operation time of the DQS buffer 1360 with respect to the asynchronous control signal ACS applied to the data output buffer 1100.

The phase detector 1372 may receive the asynchronous control signal ACS delayed by the operation time of the DQS buffer 1360 with respect to the asynchronous control signal ACS applied to the data output buffer 1100, and may receive the reference signal REF delayed by the operation time of the DQS buffer 1360 with respect to the reference signal REF applied to the DQS buffer 1360. Accordingly, a point of time when the asynchronous control signal ACS is applied to the data output buffer 1100 and a point of time when the reference signal REF is applied to the DQS buffer 1360 may be compared by the phase detector 1372. The phase detector 1372 may generate a comparison result signal UP/DN by comparing a phase of the received asynchronous control signal ACS and a phase of the received reference signal REF. The comparison result signal UP/DN may indicate whether the point of time when the asynchronous control signal ACS is applied to the data output buffer 1100 leads or lags the point of time when the write termination impedance is desired to be provided. The comparison result signal UP/DN may be transferred to the memory controller through a data input/output pin 210a.

The memory controller may adjust a transmission point of time of the asynchronous control signal ACS based on the comparison result signal UP/DN, and thus the memory device 1300a may provide the write termination impedance at the desired point of time regardless of the PVT variation.

Figure 29:
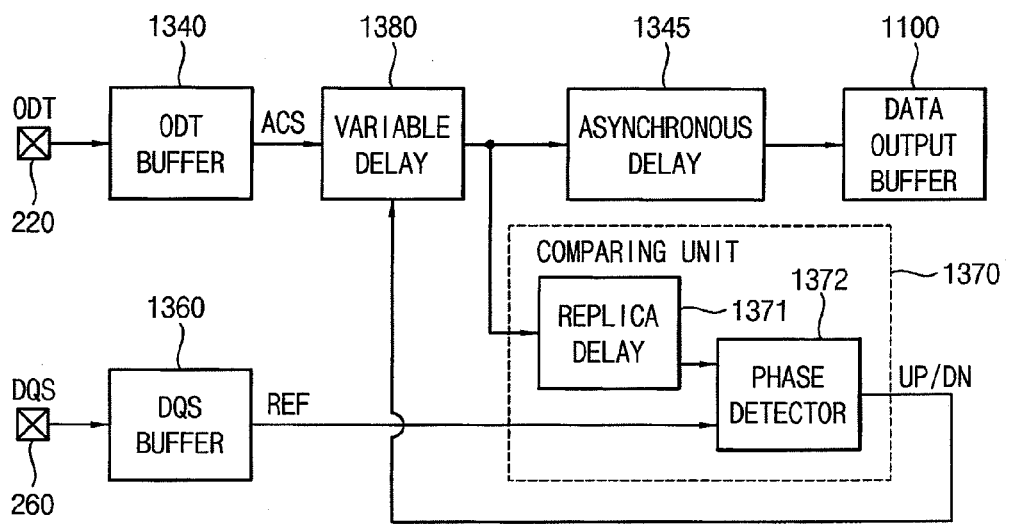
FIG. 29 is a block diagram illustrating a portion of a memory device of FIG. 27 that performs a method of training ODT of FIG. 12.

FIG. 29 is a block diagram illustrating a portion of a memory device of FIG. 27 that performs a method of training ODT of FIG. 12.

Referring to FIG. 29, a memory device 1300b includes an ODT buffer 1340, an asynchronous delay unit 1345, a DQS buffer 1360, a comparing unit 1370, a variable delay unit 1380 and a data output buffer 1100. A training circuit according to the present embodiment comprises the asynchronous delay unit 1345, the comparing unit 1370, and the variable delay unit 1380. An asynchronous control signal ACS may be delayed by the variable delay unit 1380 and the asynchronous delay unit 1345, and the delayed asynchronous control signal ACS may be provided to the data output buffer 1100.

The memory controller may transmit a reference signal REF at a point of time when write termination impedance is desired to be provided. The DQS buffer 1360 may receive the reference signal REF form the memory controller through a DQS pin 260. The DQS buffer 1360 may provide the reference signal REF to the comparing unit 1370 by buffering the reference signal REF.

The comparing unit 1370 may include a replica delay unit 1371 and a phase detector 1372. The replica delay unit 1371 may delay the asynchronous control signal ACS by the sum of an operation time of the DQS buffer 1360 and a delay time caused by the asynchronous delay unit 1345. Accordingly, the replica delay unit 1371 may provide the phase detector 1372 with the asynchronous control signal ACS delayed by the operation time of the DQS buffer 1360 with respect to the asynchronous control signal ACS applied to the data output buffer 1100.

The phase detector 1372 may receive the asynchronous control signal ACS delayed by the operation time of the DQS buffer 1360 with respect to the asynchronous control signal ACS applied to the data output buffer 1100, and may receive the reference signal REF delayed by the operation time of the DQS buffer 1360 with respect to the reference signal REF applied to the DQS buffer 1360. Accordingly, a point of time when the asynchronous control signal ACS is applied to the data output buffer 1100 and a point of time when the reference signal REF is applied to the DQS buffer 1360 may be compared by the phase detector 1372. The phase detector 1372 may generate a comparison result signal UP/DN by comparing a phase of the received asynchronous control signal ACS and a phase of the received reference signal REF. The comparison result signal UP/DN may indicate whether the point of time when the asynchronous control signal ACS is applied to the data output buffer 1100 leads or lags the point of time when the write termination impedance is desired to be provided.

The variable delay unit 1380 may receive the comparison result signal UP/DN, and may adjust a delay time of the asynchronous control signal ACS based on the comparison result signal UP/DN, and thus the memory device 1300*b* may provide the write termination impedance at the desired point of time regardless of the PVT variation.

Figure 30:
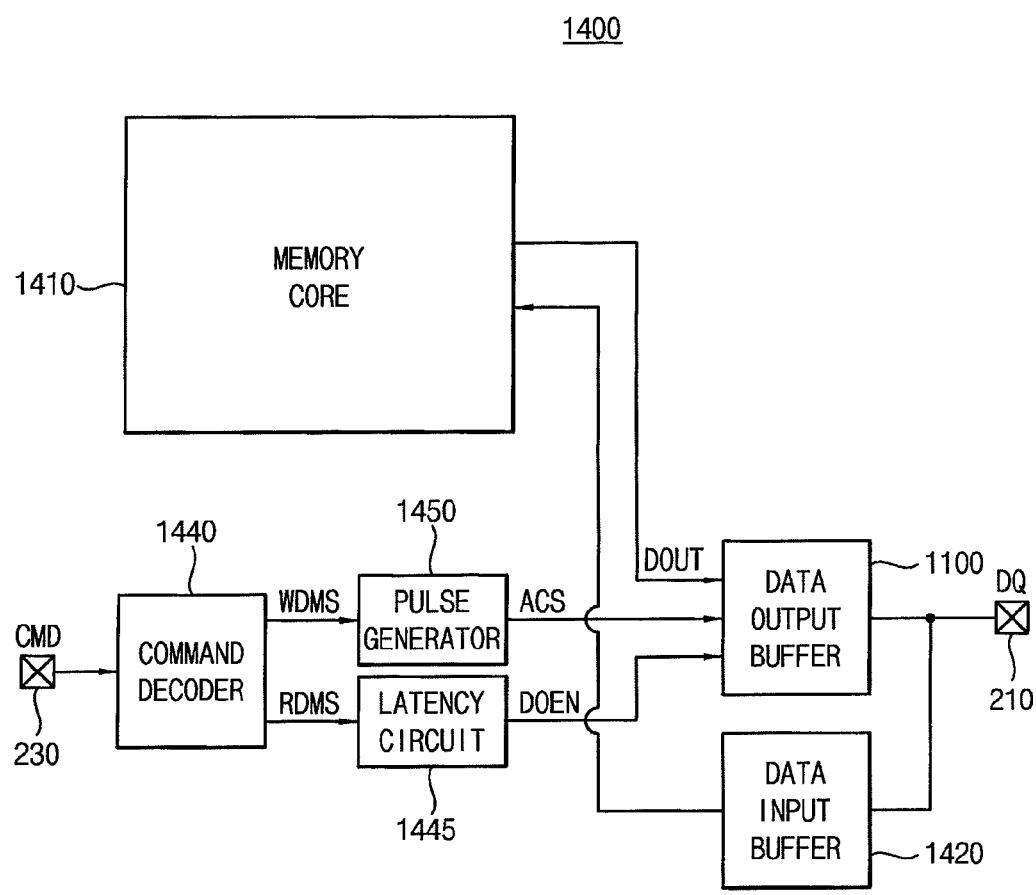
FIG. 30 is a block diagram illustrating a memory device including a data output buffer of FIG. 21 according to other exemplary embodiments.

FIG. 30 is a block diagram illustrating a memory device including a data output buffer of FIG. 21 according to other exemplary embodiments.

Referring to FIG. 30, a memory device 1400 includes a memory core 1410, a data output buffer 1100, a data input buffer 1420, a command decoder 1440, a latency circuit 1445, and a pulse generator 1450.

The memory core 1410 stores write data provided from the data input buffer 1320, and provides read data to the data output buffer 1100 based on the stored data. The data output buffer 1100 and the data input buffer 1420 are coupled to an external data input/output pin 210. The data output buffer 1100 transfers the read data to a memory controller through the data input/output pin 210, and the data input buffer 1420 receives the write data from the memory controller through the data input/output pin 210.

The command decoder 1440 may generate a control signal corresponding to a command signal CMD by decoding the command signal CMD received from the memory controller through a command pin 230. The command decoder 1440 may generate a read mode signal RDMS in response to a read command. The latency circuit 1445 may generate an output enable signal DOEN by synchronizing the read mode signal RDMS received from the command decoder 1440. The output enable signal DOEN may have a high level while the read data are transferred through the data input/output pin 210. The data output buffer 1100 may perform a driver operation in response to the output enable signal DOEN of the high level received from the latency circuit 1445.

The command decoder 1440 may generate a wire mode signal WDMS in response to a write command. The pulse generator 1450 may generate an asynchronous control signal ACS not synchronized with an external clock signal. The asynchronous control signal ACS generated by the pulse generator 1450 may be a pulse signal having a high level during a predetermined period of time. The pulse generator 1450 may be included in the command decoder 1440, or may be disposed outside the command decoder 1440. The data output buffer 1100 may adjust termination impedance in response to the asynchronous control signal ACS received from the pulse generator 1450.

Since the command decoder 1440 and the pulse generator 1450 generate the asynchronous control signal ACS based on the write command, the memory device 1400 need not receive the asynchronous control signal ACS from the memory controller, and may be implemented without an ODT pin. Accordingly, the memory device 1400 may have the reduced number of external pins. Further, since the asynchronous control signal ACS is not synchronized with the external clock signal, the memory device 1400 may turn off a clock synchronization circuit during a normal mode and a write mode. Accordingly, the memory device 1400 may reduce power consumption.

Figure 31:
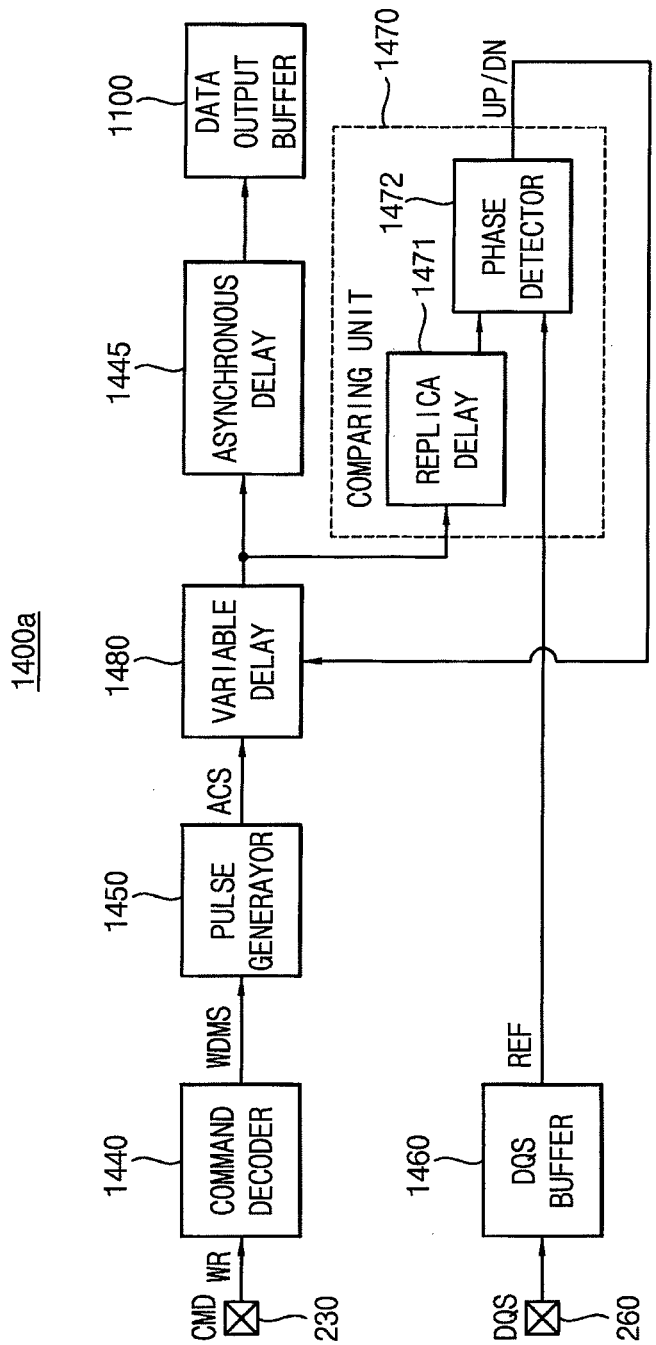
FIG. 31 is a block diagram illustrating a portion of a memory device of FIG. 30 that performs a method of training ODT of FIG. 18.

FIG. 31 is a block diagram illustrating a portion of a memory device of FIG. 30 that performs a method of training ODT of FIG. 18.

Referring to FIG. 31, a memory device 1400*a* includes a command decoder 1440, a pulse generator 1450, an asynchronous delay unit 1445, a DQS buffer 1460, a comparing unit 1470, a variable delay unit 1480 and a data output buffer 1100. A training circuit according to the present embodiment comprises the asynchronous delay unit 1445, the comparing unit 1470, and the variable delay unit 1480. The command decoder 1440 may receive a write command WR from a memory controller through a command pin 230, and may generate a write mode signal WDMS in response to the write command WR. The pulse generator 1450 may generate an asynchronous control signal ACS in response to the write mode signal WDMS. The asynchronous control signal ACS may be delayed by the variable delay unit 1480 and the asynchronous delay unit 1445, and the delayed asynchronous control signal ACS may be provided to the data output buffer 1100.

The memory controller may transmit a reference signal REF at a point of time when write termination impedance is desired to be provided. The DQS buffer 1460 may receive the reference signal REF form the memory controller through a DQS pin 260. The DQS buffer 1460 may provide the reference signal REF to the comparing unit 1470 by buffering the reference signal REF.

The comparing unit 1470 may include a replica delay unit 1471 and a phase detector 1472. The replica delay unit 1471 may receive the asynchronous control signal ACS from the variable delay unit 1480. The replica delay unit 1471 may delay the asynchronous control signal ACS by the sum of an operation time of the DQS buffer 1460 and a delay time caused by the asynchronous delay unit 1445. Accordingly, the replica delay unit 1471 may provide the phase detector 1472 with the asynchronous control signal ACS delayed by the operation time of the DQS buffer 1460 with respect to the asynchronous control signal ACS applied to the data output buffer 1100.

The phase detector 1472 may receive the asynchronous control signal ACS delayed by the operation time of the DQS buffer 1460 with respect to the asynchronous control signal ACS applied to the data output buffer 1100, and may receive the reference signal REF delayed by the operation time of the DQS buffer 1460 with respect to the reference signal REF applied to the DQS buffer 1460. The phase detector 1372 may generate a comparison result signal UP/DN indicating whether the point of time when the asynchronous control signal ACS is applied to the data output buffer 1100 leads or lags the point of time when the write termination impedance is desired to be provided.

The variable delay unit 1480 may receive the comparison result signal UP/DN, and may adjust a delay time of the asynchronous control signal ACS based on the comparison result signal UP/DN, and thus the memory device 1400*a* may provide the write termination impedance at the desired point of time regardless of the PVT variation.

Figures 32, 33:
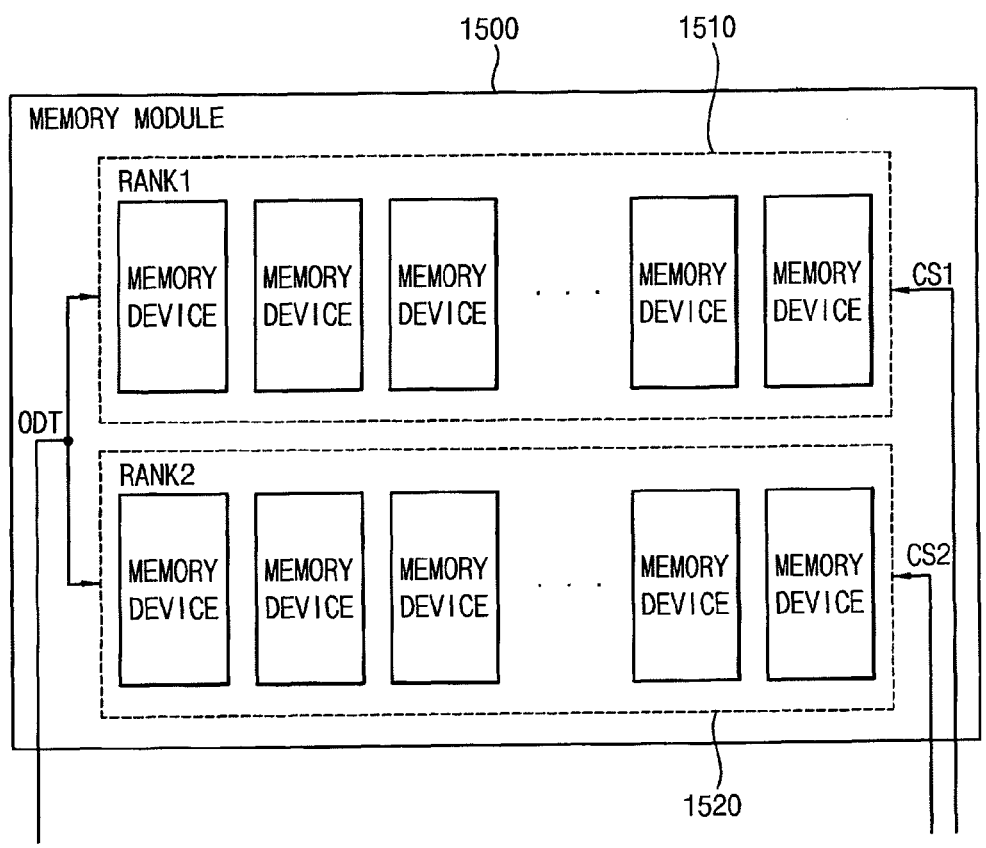
FIG. 32 is a block diagram illustrating a memory module according to some exemplary embodiments.
FIG. 33 is a table of impedances of memory ranks included in a memory module of FIG. 32 according to operation modes.

FIG. 32 is a block diagram illustrating a memory module according to some exemplary embodiments.

Referring to FIG. 32, a memory module 1500 includes a first memory rank 1510 and a second memory rank 1520.

The first memory rank 1510 and the second memory rank 1520 receive a first chip select signal CS1 and a second chip select signal CS2, respectively. The first memory rank 1510 and the second memory rank 1520 may be selectively operated in response to the first chip select signal CS1 and the second chip select signal CS2.

Although an example where each rank receives one chip select signal CS is illustrated in FIG. 32, each rank may receive a plurality of chip select signals. The chip select signal may be directly applied from a memory controller, or alternatively may be generated or selected by a buffer.

The first memory rank 1510 and the second memory rank 1520 may be disposed on the same side or on different sides of the memory module 1500. Although the memory module 1500 is illustrated in FIG. 32 as including two memory ranks 1510 and 1520, the memory module 1500 may include one or more memory ranks.

Each of the first memory rank 1510 and the second memory rank 1520 may include a plurality of memory devices. Each memory device may be a memory device 400 of FIG. 6 or a memory device 1300 of FIG. 27, which receives an asynchronous control signal from the memory controller through an ODT pin.

The first memory rank 1510 and the second memory rank 1520 receive the asynchronous control signal from the memory controller through the same transmission line. Accordingly, in a memory system including the memory module 1500, the number of transmission lines may be reduced.

FIG. 33 is a table of impedances of memory ranks included in a memory module of FIG. 32 according to operation modes.

Referring to FIGS. 32 and 33, while a first memory rank 1510 performs a read operation, the first memory rank 1510 may provide driver impedance of about 40Ω, and a second memory rank 1520 may provide normal termination impedance of about 60Ω. While the second memory rank 1520 performs the read operation, the first memory rank 1510 may provide the normal termination impedance of about 60Ω, and the second memory rank 1520 may provide the driver impedance of about 40Ω.

While the first memory rank 1510 or the second memory rank 1520 performs a write operation, the first memory rank 1510 and the second memory rank 1520 may receive the same asynchronous control signal through the same transmission line. Both the first memory rank 1510 and the second memory rank 1520 may provide write termination resistor impedance of about 120Ω.

While the first memory rank 1510 and the second memory rank 1520 do not perform the read operation and the write operation, the first memory rank 1510 and the second memory rank 1520 may provide the normal termination impedance of about 60Ω.

Figures 34, 35:
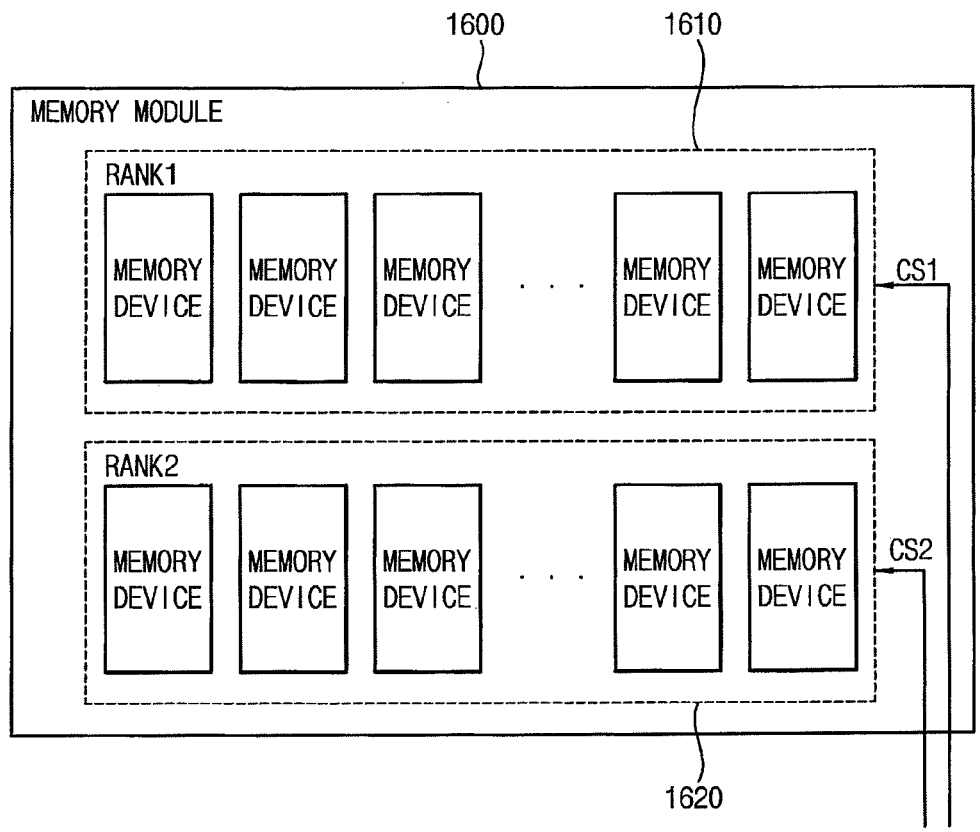
FIG. 34 is a block diagram illustrating a memory module according to other exemplary embodiments.
FIG. 35 is a table of impedances of memory ranks included in a memory module of FIG. 34 according to operation modes.

FIG. 34 is a block diagram illustrating a memory module according to other exemplary embodiments.

Referring to FIG. 34, a memory module 1600 includes a first memory rank 1610 and a second memory rank 1620.

The first memory rank 1610 and the second memory rank 1620 receive a first chip select signal CS1 and a second chip select signal CS2, respectively. The first memory rank 1610 and the second memory rank 1620 may be selectively operated in response to the first chip select signal CS1 and the second chip select signal CS2.

Although an example where each rank receives one chip select signal CS is illustrated in FIG. 34, each rank may receive a plurality of chip select signals. The chip select signal may be directly applied from a memory controller, or alternatively may be generated or selected by a buffer.

Each of the first memory rank 1610 and the second memory rank 1620 may include a plurality of memory devices. Each memory device may be a memory device 900 of FIG. 15 or a memory device 1400 of FIG. 30, which generates an asynchronous control signal based on a write command received from the memory controller.

Since the first memory rank 1610 and the second memory rank 1620 generate the asynchronous control signal based on the write command, the first memory rank 1610 and the second memory rank 1620 do not include an ODT pin. Accordingly, in a memory system including the memory module 1600, the number of transmission lines may be reduced.

FIG. 35 is a table of impedances of memory ranks included in a memory module of FIG. 34 according to operation modes.

Referring to FIGS. 34 and 35, while a first memory rank 1610 performs a read operation, the first memory rank 1610 may provide driver impedance of about 40Ω, and a second memory rank 1620 may provide normal termination impedance of about 60Ω. While the second memory rank 1620 performs the read operation, the first memory rank 1610 may provide the normal termination impedance of about 60Ω, and the second memory rank 1620 may provide the driver impedance of about 40Ω.

While the first memory rank 1610 performs a write operation, the first memory rank 1610 may provide write termination impedance of about 120Ω, and the second memory rank 1620 may provide the normal termination impedance of about 60Ω. While the second memory rank 1620 performs a write operation, the first memory rank 1610 may provide the normal termination impedance of about 60Ω, and the second memory rank 1620 may provide the write termination impedance of about 120Ω.

While the first memory rank 1610 and the second memory rank 1620 do not perform the read operation and the write operation, the first memory rank 1610 and the second memory rank 1620 may provide the normal termination impedance of about 60Ω.

FIGS. 36A through 36F are block diagrams illustrating examples of a memory module according to some exemplary embodiments.

Figure 36A:
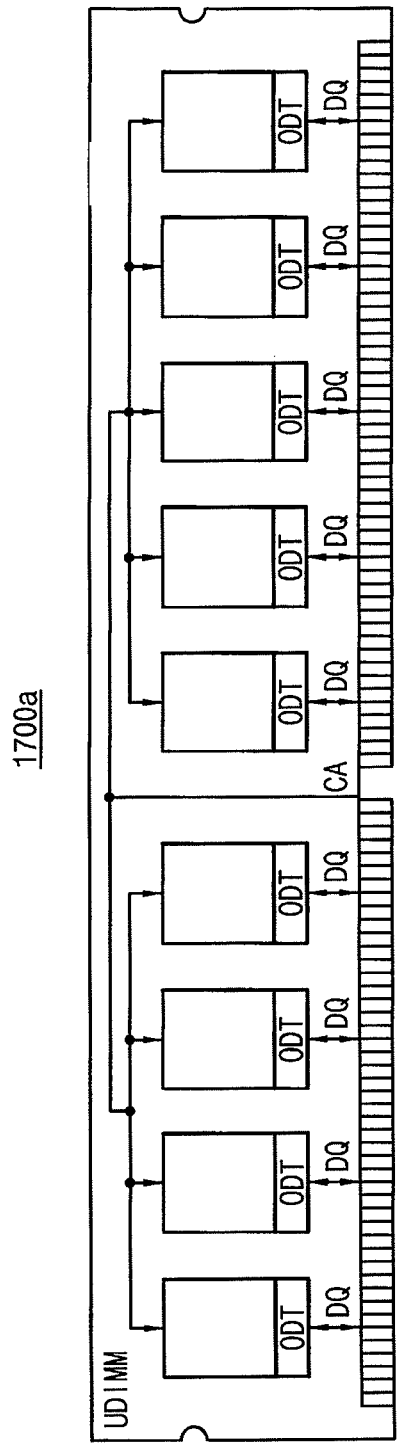
FIGS. 36A through 36F are block diagrams illustrating examples of a memory module according to some exemplary embodiments.

Referring to FIG. 36A, a memory module 1700*a* may be implemented as an unbuffered dual in-line memory module (UDIMM). The memory module 1700*a* may include a plurality of memory devices that provide ODT to data transmission lines DQ. The memory devices may be coupled to the data transmission lines DQ, and may be coupled to command/address transmission lines CA in a tree topology. In some embodiments, a pseudo-differential signaling using a reference data voltage and a reference command/address voltage may be employed for transferring data and a command/address.

Figure 36B:
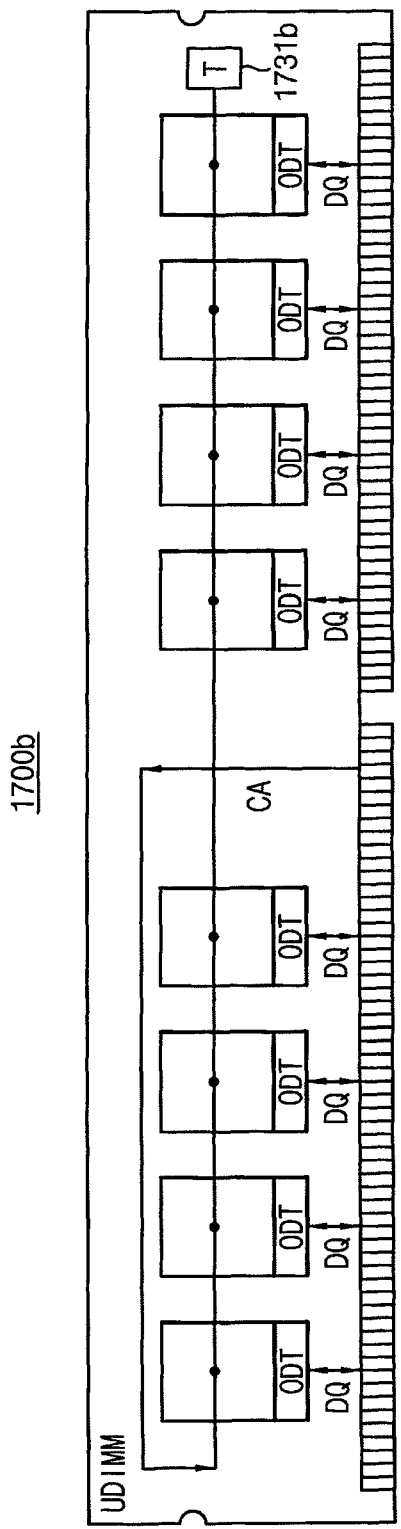

Referring to FIG. 36*b*, a memory module 1700*b* may be implemented as an UDIMM. The memory module 1700*b* may include a plurality of memory devices that provide ODT to data transmission lines DQ, and a module termination resistor unit 1732*b* coupled to one end of command/address transmission lines CA. The command/address transmission lines CA may be coupled to the memory devices in a fly-by daisy-chain topology. The memory module 1700*b* may perform read/write leveling.

Figure 36C:
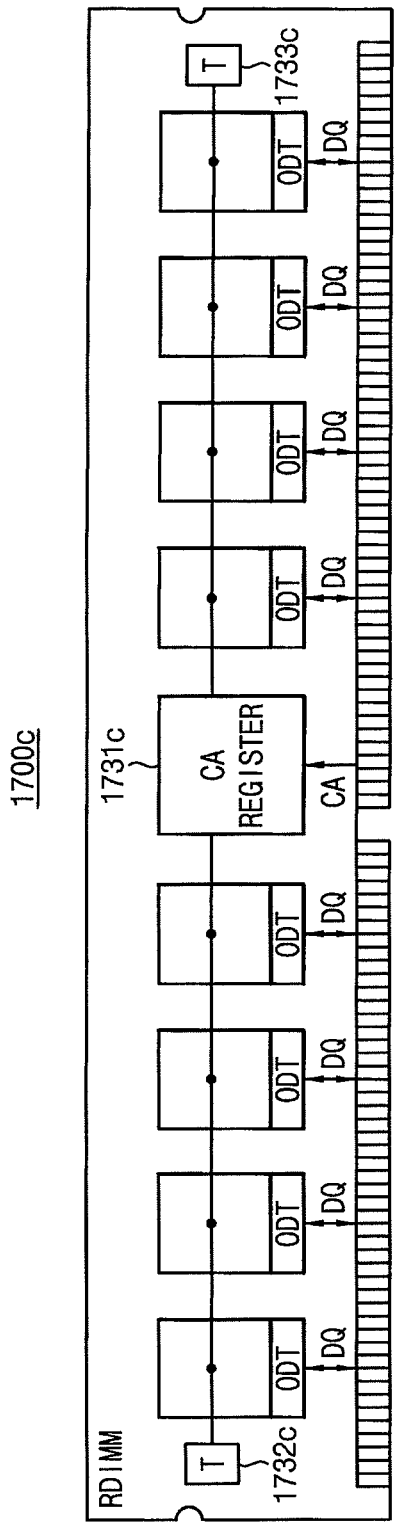

Referring to FIG. 36*c*, a memory module 1700*c* may be implemented as a registered dual in-line memory module (RDIMM). The memory module 1700*c* may include a plurality of memory devices that provide ODT to data transmission lines DQ, a command/address register 1731*c* that provide a command/address signal to the memory devices through command/address transmission lines CA, and module resistor units 1732*c* and 1733*c* coupled to both ends of the command/address transmission lines CA. The command/address register 1731*c* may be coupled to the memory devices in a daisy-chain topology.

Figure 36D:
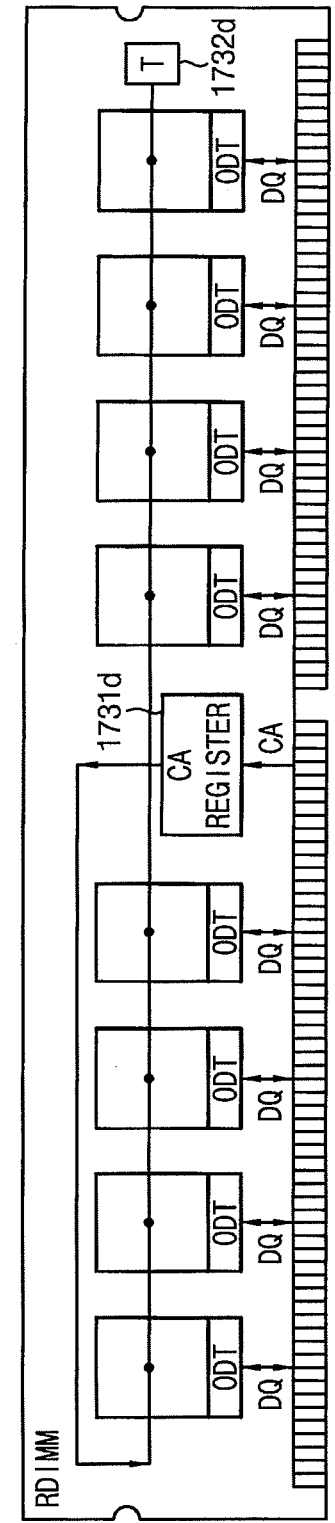

Referring to FIG. 36*d*, a memory module 1700*d* may be implemented as an RDIMM. The memory module 1700*d* may include a plurality of memory devices that provide ODT to data transmission lines DQ, a command/address register 1731*d* that provide a command/address signal to the memory devices through command/address transmission lines CA, and a module resistor unit 1732*d* coupled to one end of the command/address transmission lines CA. The command/address register 1731*d* may be coupled to the memory devices in a fly-by daisy-chain topology. The memory module 1700*d* may perform read/write leveling.

Figure 36E:
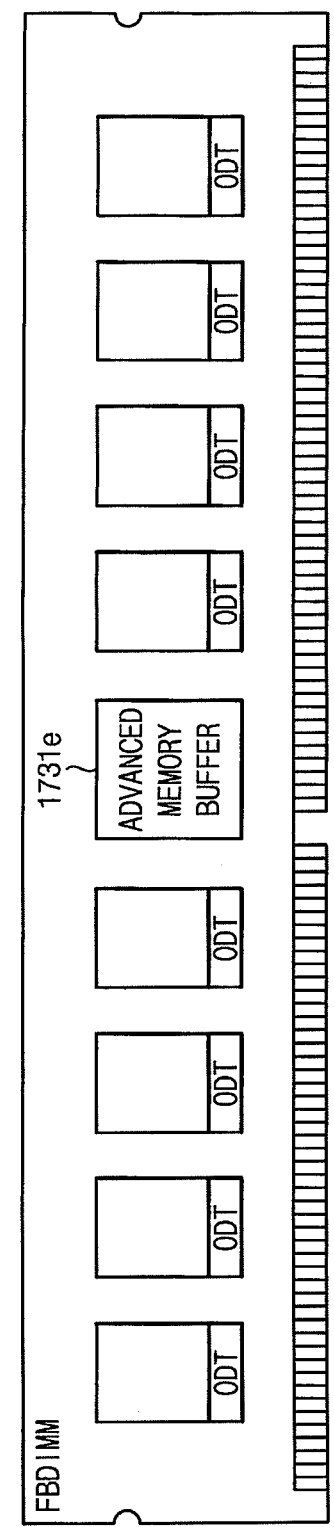

Referring to FIG. 36*e*, a memory module 1700*e* may be implemented as a fully buffered dual in-line memory module (FBDIMM). The memory module 1700*e* may include a plurality of memory devices that provide ODT to data transmission lines, and a hub 1731*e* that provides a command/address signal and data by converting a high-speed packet received from a memory controller. For example, the hub 1731*e* may be an advanced memory buffer AMB.

Figure 36F:
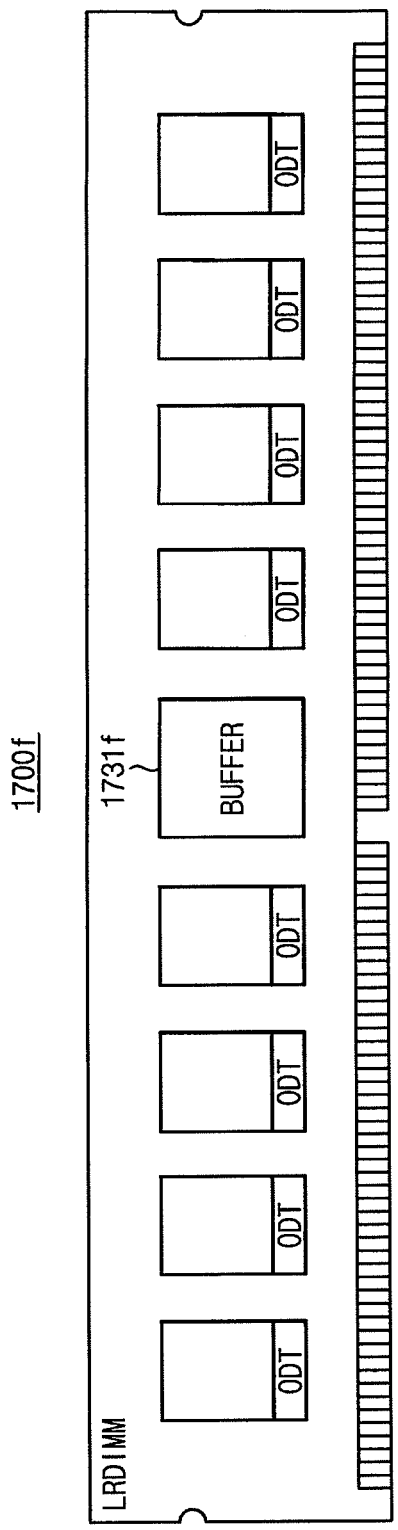

Referring to FIG. 36*f*, a memory module 1700*f* may be implemented as a load reduced dual in-line memory module LRDIMM. The memory module 1700*f* may include a plurality of memory devices that provide ODT to data transmission lines, and a buffer 1731*f* that provides a command/address signal and data by buffering the command/address signal and the data from a memory controller through a plurality of transmission lines. Data transmission lines between the buffer 1731*f* and the memory devices may be coupled in a point-to-point topology. Command/address transmission lines between the buffer 1731*f* and the memory devices may be coupled in a multi-drop topology, a daisy-chain topology, a fly-by daisy-chain topology, or the like. Since the buffer 1731*f* buffers both the command/address signal and the data, the memory controller may interface with the memory module 1700*f* by driving only a load of the buffer 1731*f*. Accordingly, the memory module 1700*f* may include more memory devices and more memory ranks, and a memory system may include more memory modules.

Figures 37, 38A:
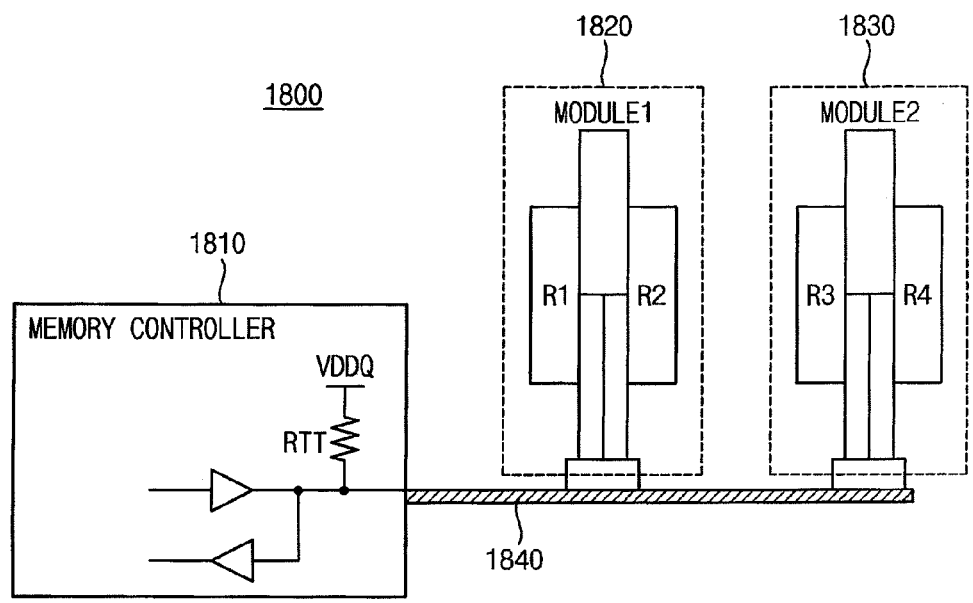

FIG. 37 is a block diagram illustrating a memory system according to some exemplary embodiments.

Referring to FIG. 37, a memory system 1800 includes a memory controller 1810 and at least one memory module 1820 and 1830.

A first memory module 1820 and a second memory module 1830 may be coupled to a memory controller 1810 via a bus 1840. Each of the first memory module 1820 and the second memory module 1830 may be a memory module 1500 of FIG. 32, a memory module 1600 of FIG. 34, a memory module 1700*a* through 1700*f* of FIGS. 36A through 36F.

The first memory module 1820 may include at least one memory rank R1 and R2, and the second memory module 1830 may include at least one memory rank R3 and R4. In some embodiments, the memory ranks R1, R2, R3 and R4 may be coupled in a multi-drop topology, which shares transmission lines. The memory ranks R1, R2, R3 and R4 (or memory devices included in the memory ranks R1, R2, R3 and R4) may provide termination impedance to data transmission lines, thereby improving signal integrity. In some embodiments, the memory controller 1810 may perform ODT. For example, the memory controller 1810 may perform a pull-up termination operation using a pull-up resistor RTT coupled between a power supply voltage VDDQ and a transmission line.

FIGS. 38A through 39B are tables of impedances of memory ranks included in a memory system of FIG. 37 according to operation modes.

In FIGS. 38A and 38B, impedances of memory ranks are illustrated where a memory module 1500 of FIG. 32 is used as the first memory module 1820 and the second memory module 1830. FIG. 38A illustrates an example where the second memory module 1830 includes two memory ranks, and FIG. 38B illustrates an example where the second memory module 1830 includes one memory rank.

Referring to FIGS. 37 and 38A, one memory rank of the first through the fourth memory ranks R1, R2, R3 and R4 performing a read operation may provide driver impedance of about 40Ω, and the other memory ranks may provide normal termination impedance of about 60Ω. If the first memory rank R1 or the second memory rank R2 performs a write operation, the first and the second memory ranks R1 and R2 may provide write termination impedance of about 120Ω, and the third and the fourth memory ranks R3 and R4 may provide the normal termination impedance of about 60Ω. If the third memory rank R3 or the fourth memory rank R4 performs the write operation, the first and the second memory ranks R1 and R2 may provide the normal termination impedance of about 60Ω, and the third and the fourth memory ranks R3 and R4 may provide the write termination impedance of about 120Ω. While the first through the fourth memory ranks R1, R2, R3 and R4 do not perform the read operation and the write operation, the first through the fourth memory ranks R1, R2, R3 and R4 may provide the normal termination impedance of about 60Ω.

Referring to FIGS. 37 and 38B, one memory rank of the first through the third memory ranks R1, R2 and R3 performing a read operation may provide driver impedance of about 40Ω, and the other memory ranks may provide normal termination impedance of about 60Ω. If the first memory rank R1 or the second memory rank R2 performs a write operation, the first and the second memory ranks R1 and R2 may provide write termination impedance of about 120Ω, and the third memory rank R3 may provide the normal termination impedance of about 60Ω. If the third memory rank R3 performs the write operation, the first and the second memory ranks R1 and R2 may provide the normal termination impedance of about 60Ω, and the third memory rank R3 may provide the write termination impedance of about 120Ω. While the first through the third memory ranks R1, R2 and R3 do not perform the read operation and the write operation, the first through the third memory ranks R1, R2 and R3 may provide the normal termination impedance of about 60Ω.

Figures 39B, 40:
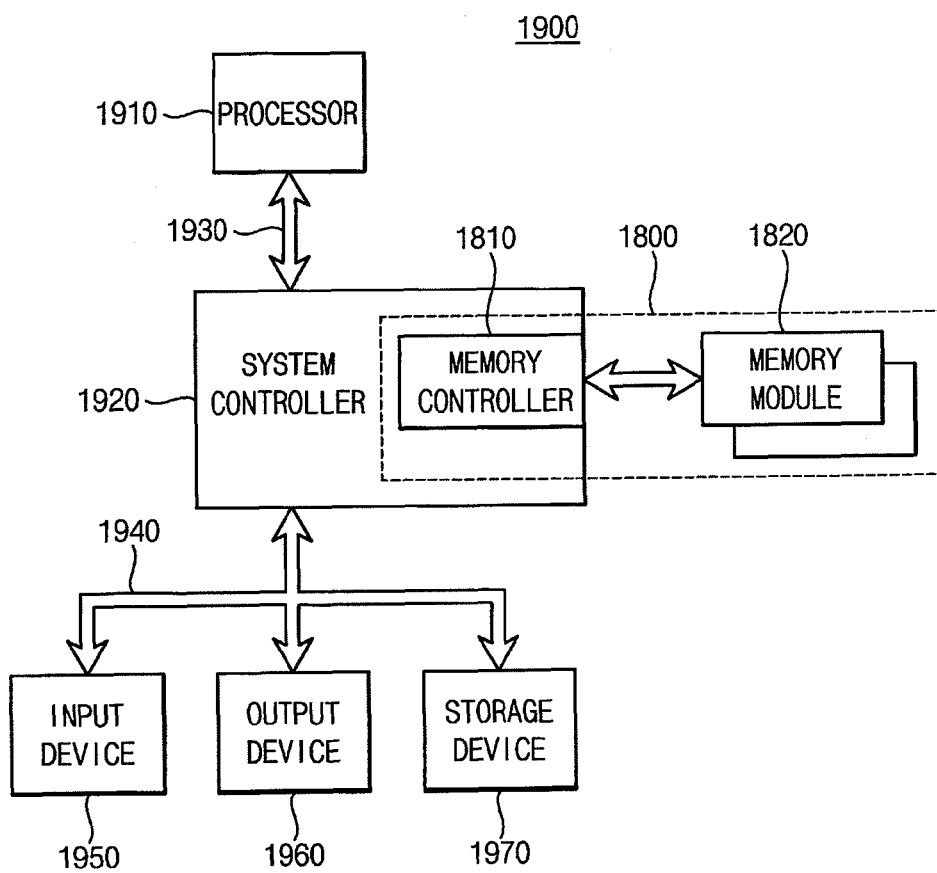

In FIGS. 39A and 39B, impedances of memory ranks are illustrated where a memory module 1600 of FIG. 34 is used as the first memory module 1820 and the second memory module 1830. FIG. 39A illustrates an example where the second memory module 1830 includes two memory ranks, and FIG. 39B illustrates an example where the second memory module 1830 includes one memory rank.

Referring to FIGS. 37 and 39A, one memory rank of the first through the fourth memory ranks R1, R2, R3 and R4 performing a read operation may provide driver impedance of about 40Ω, and the other memory ranks may provide normal termination impedance of about 60Ω. One memory rank of the first through the fourth memory ranks R1, R2, R3 and R4 performing a write operation may provide write termination impedance of about 120Ω, and the other memory ranks may provide the normal termination impedance of about 60Ω.

While the first through the fourth memory ranks R1, R2, R3 and R4 do not perform the read operation and the write operation, the first through the fourth memory ranks R1, R2, R3 and R4 may provide the normal termination impedance of about 60Ω.

Referring to FIGS. 37 and 39B, one memory rank of the first through the third memory ranks R1, R2 and R3 performing a read operation may provide driver impedance of about 40Ω, and the other memory ranks may provide normal termination impedance of about 60Ω. One memory rank of the first through the third memory ranks R1, R2 and R3 performing write termination impedance of about 120Ω, and the other memory ranks may provide the normal termination impedance of about 60Ω. While the first through the third memory ranks R1, R2 and R3 do not perform the read operation and the write operation, the first through the third memory ranks R1, R2 and R3 may provide the normal termination impedance of about 60106 .

FIG. 40 is a block diagram illustrating a computing system according to some exemplary embodiments.

Referring to FIG. 40, a computing system 1900 includes a processor 1910, a system controller 1920 and a memory system 1800. The computing system 1900 may further include a processor bus 1930, an extension bus 1940, an input device 1950, an output device 1960, and a storage device 1970. The memory system 1800 may include at least one memory module 1820, and a memory controller 1810 for controlling the memory module 1820. The memory module 1820 may be included in the system controller 1920.

The processor 1910 may perform various computing functions, such as executing specific software for performing specific calculations or tasks. For example, the processor 1910 may be a microprocessor, a central process unit (CPU), a digital signal processor, or the like. The processor 1910 may be coupled to the system controller 1920 via the processor bus 1930 including an address bus, a control bus and/or a data bus. The system controller 1920 may be coupled to the expansion bus 1940, such as a peripheral-component-interconnect (PCI) bus. The processor 1910 may control the input device 1950, such as a keyboard, a mouse, the output device 1960, such as a printer, a display device, and the storage device 1970, such as a hard disk drive, a compact disk read-only memory (CD-ROM), a solid state drive (SSD).

The memory controller 1810 may control the memory module to perform a command provided from the processor 1910. The memory module 1820 may store data provided from the memory controller 1810, and may provide the stored data to the memory controller 1810. The memory module 1820 may include a plurality of memory devices, such as a dynamic random access memory (DRAM), a static random access memory (SRAM), a non-volatile memory, etc. The plurality of memory devices may include one or more ODT circuit for providing termination impedance according to at least one of the exemplary embodiments described hereinabove.

The computing system 1900 may be applicable to a desktop computer, a notebook, a computer, a work station, a handheld device, or the like.

As described above, an ODT circuit, a data output buffer, a memory device, a memory module, a method of operating an ODT circuit, a method of operating a data output buffer, and a method of training ODT according to some exemplary embodiments may reduce power consumption by turning off a clock synchronization circuit, may be implemented without a latency circuit for ODT, and may reduce the number of transmission lines.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. An on-die termination (ODT) circuit, comprising:
a first termination circuit including a first switch and configured to switchably connect a first termination impedance between an input/output data node and a first power supply voltage;
a second termination circuit including a second switch and configured to switchably connect a second termination impedance between the input/output data node and the first power supply voltage; and
a switch-control circuit configured to perform a logic operation on an output enable signal (DOEN) and an asynchronous control signal (ACS) to output a first switch-control signal and a second switch-control signal to selectively activate the first termination circuit and the second termination circuit, respectively, to selectively connect the first termination impedance, the second termination impedance, or both the first termination impedance and the second termination impedance between the input/output data node and the first power supply voltage;
wherein the first switch-control signal is not configured to control a switch to switchably connect a termination impedance between the input/output data node and a second power supply voltage during a memory READ mode nor during a memory WRITE mode;
wherein the second switch-control signal is not configured to control a switch to switchably connect a termination impedance between the input/output data node and the second power supply voltage during the memory READ mode nor during the memory WRITE mode.

2. An on-die termination (ODT) circuit, comprising:
a first termination circuit including a second switch and configured to switchably connect a first termination impedance between an input/output data node and a first power supply voltage;
a second termination circuit including a second switch and configured to switchably connect a second termination impedance between the input/output data node and the first power supply voltage; and
a switch-control circuit configured to perform a logic operation on an output enable signal (DOEN) and an asynchronous control signal (ACS) to output a first switch-control signal and a second switch-control signal to selectively activate the first termination circuit and the second termination circuit, respectively, to selectively connect the first termination impedance, the second termination impedance, or both the first termination impedance and the second termination impedance between the input/output data node and the first power supply voltage,
wherein the input/output data node receives data read out or written into a memory device, wherein
a first total impedance value is connected between the input/output data node and the first power supply voltage during a memory READ mode and based on a first set of predetermined logic levels of DOEN and ACS;

a second total impedance value, different from the first total impedance value, is connected between the input/output data node and the first power supply voltage during a memory WRITE mode and based on a second set of predetermined logic levels of DOEN and ACS;

a third total impedance value, different from the first and second total impedance values is connected between the input/output data node and the first power supply voltage during a memory normal mode and based on a third set of predetermined logic levels of DOEN and ACS.

3. The ODT circuit of claim 2, wherein: neither of the first termination circuit and the second termination circuit is activated during the memory READ mode;

and the first termination circuit is activated during the memory WRITE mode; and wherein both the first termination circuit and the second termination circuit are activated during the normal mode.

4. The ODT circuit of claim 2, wherein the second total impedance value is about 120 ohms for the memory WRITE mode, the third total impedance value is about 60 ohms during the NORMAL mode, and the first total impedance value is about zero during the memory READ mode.

5. The ODT circuit of claim 2, wherein the ACS signal is received at an external pin of the memory device and the input/output data node is connected to another external pin of the memory device.

6. The ODT circuit of claim 2, wherein the ACS signal is asynchronous with respect to a clock signal of the memory device.

7. The ODT circuit of claim 2, wherein the ACS signal is generated based on a memory WRITE command.

8. The ODT circuit of claim 7, further including a pulse generator configured to generate the ACS signal with a pulse width larger than the write data window.

9. The ODT circuit of claim 7, further including a command decoder configured to receive memory READ and WRITE commands from an external memory controller.

10. The ODT circuit of claim 2, wherein the DOEN signal is used to enable an output buffer of the memory device.

11. The ODT circuit of claim 2, wherein the first termination circuit comprises the first switch that responds to the first switch-control signal and at least one resistor.

12. The ODT circuit of claim 2, wherein the switch-control circuit comprises one of logic gates or at least one multiplexer.

13. The ODT circuit of claim 2, further comprising:
a third termination circuit configured to switchably connect a third termination impedance between the input/output data node the first power supply voltage; and
a third switch-control signal generated by the switch-control circuit to selectively activate the third termination circuit.

14. The ODT circuit of claim 13, wherein the second total impedance value is about 120 ohms, and wherein the third total impedance value is about 60 ohms, and wherein the first total impedance value is about 40 ohms.

15. A method of providing termination impedance at an input/output data line of a memory device, comprising:
performing a logic operation on an output enable (DOEN) signal and an asynchronous control signal (ACS) to output a first switch-control signal configured to selectively activate a first termination circuit having a first termination impedance and to output a second switch-control signal configured to selectively activate a second termination circuit having a second termination impedance, wherein the first termination circuit is configured to switchably connect the first termination impedance between the input/output data line and a first power supply voltage, wherein the second termination circuit is configured to switchably connect the second termination impedance between the input/output data line and the first power supply voltage, wherein the ACS is asynchronous with respect to a clock signal of the memory device and is generated based on the presence of a memory WRITE command, wherein the first switch-control signal activates the first termination circuit only if the memory WRITE command is present, and wherein the DOEN signal is generated based on the presence of a memory READ command.

16. The method of claim 15, wherein a first total impedance value and a second total impedance value corresponding to a memory READ mode and a memory WRITE mode respectively, are alternately connected between the input/output data line and the first power supply voltage based on predetermined logic levels of DOEN and ACS.

17. The method of claim 16, wherein the DOEN signal is generated using an internal clock signal generated from an external clock signal, and the internal clock signal is turned off during memory WRITE and NORMAL modes.

18. The method of claim 15, wherein a first total impedance value is about 120 ohms for a memory WRITE operation, and wherein both the first termination circuit and the second termination circuit are activated during a NORMAL operation so that third total impedance values is about 60 ohms for the NORMAL operation, and wherein no termination circuit is activated for a memory READ operation.

19. The method of claim 15, wherein the ACS is generated by a memory controller and received at an external pin of the memory device and the input/output data line is connected to another external pin of the memory device.

20. The method of claim 15, further comprising decoding at the memory device commands issued from an external memory controller and generating the ACS based on a decode of the memory WRITE command.

21. The method of claim 19, wherein generating the ACS includes generating a pulse width larger than the write data window.

22. The method of claim 15, further comprising generating a third switch-control signal configured to selectively activate a third termination circuit to switchably connect a third impedance between the input/output data line and the first power supply voltage based on predetermined logic levels of DOEN and ACS.

23. The method of claim 22, wherein a total impedance value of about 120 ohms is connected between the input/output data line and the first power supply voltage for a memory WRITE; and a total impedance value of about 60 ohms is connected between the input/output data line and the first power supply voltage for a NORMAL operation; and a total impedance value of about 40 ohms of driver impedance is connected between the input/output data line and the first power supply voltage for a memory READ.

24. The ODT circuit of claim 3, wherein a logic level H at the DOEN indicates the memory READ mode and wherein a logic level L at the DOEN and a logic level H at the ACS indicates the memory WRITE mode, and wherein the presence of a logic level L at the DOEN and a logic level L at the ACS indicates the NORMAL mode.

25. The ODT circuit of claim 1, wherein the on-die termination (ODT) circuit does not include a switch configured to switchably connect a termination impedance between the input/output data node and the second power supply voltage in response to the first switch-control signal.

26. The ODT circuit of claim 25, wherein the on-die termination (ODT) circuit does not include a switch configured to switchably connect a termination impedance between the input/output data node and the second power supply voltage.

27. The ODT circuit of claim 25, further comprising: a third termination circuit including a third switch and configured to switchably connect a third termination impedance between the input/output data node and the first power supply voltage.

28. The ODT circuit of claim 27, further comprising: a fourth termination circuit including a fourth switch and configured to switchably connect a fourth termination impedance between the input/output data node and the second power supply voltage while neither of the first second termination impedance nor the second termination impedance is connected between the input/output data node and the first power supply voltage.

29. The method of claim 15, wherein the second switch-control signal activates the second termination circuit only if the memory READ command is NOT present.

* * * * *